(12) United States Patent
Orsetti et al.

(10) Patent No.: US 12,174,235 B1
(45) Date of Patent: Dec. 24, 2024

(54) SYSTEM AND METHOD FOR TESTING ELECTRICAL CIRCUITS IN RESIDENTIAL AND COMMERCIAL PREMISES

(71) Applicant: SafeCircuit Testing LLC, Deer Park, NY (US)

(72) Inventors: Marco V. Orsetti, Melville, NY (US); Joseph M. Orsetti, Melville, NY (US); Edward P. Gellender, Jericho, NY (US); John F. Felbinger, East Rockaway, NY (US)

(73) Assignee: SafeCircuit Testing LLC, Deer Park, NY (US)

( * ) Notice: Subject to any disclaimer, the term of this patent is extended or adjusted under 35 U.S.C. 154(b) by 358 days.

(21) Appl. No.: 17/752,263

(22) Filed: May 24, 2022

Related U.S. Application Data

(60) Provisional application No. 63/194,454, filed on May 28, 2021.

(51) Int. Cl.
  *G01R 31/08* (2020.01)
  *G01R 31/327* (2006.01)

(52) U.S. Cl.
  CPC ....... *G01R 31/086* (2013.01); *G01R 31/3277* (2013.01)

(58) Field of Classification Search
  CPC .......................... G01R 31/086; G01R 31/3277
  See application file for complete search history.

(56) References Cited

U.S. PATENT DOCUMENTS

| | | | |
|---|---|---|---|
| 7,605,594 B2 * | 10/2009 | Blades | G01R 31/58 324/750.01 |
| 9,354,256 B1 * | 5/2016 | Mahoney | G01R 31/327 |
| 11,474,162 B2 * | 10/2022 | Magno | G01R 19/15 |
| 2014/0266287 A1 * | 9/2014 | Reeder, III | G01R 1/0408 324/538 |
| 2017/0261558 A1 * | 9/2017 | Freer | H01H 83/04 |
| 2021/0156920 A1 * | 5/2021 | Candela | G01R 31/58 |

* cited by examiner

*Primary Examiner* — Daniel R Miller
(74) *Attorney, Agent, or Firm* — Bodner & Bodner, PLLC; Gerald T. Bodner; Christian P. Bodner

(57) ABSTRACT

A system for testing electrical power circuits in a home or office building includes a circuit breaker tester unit having circuitry which is electrically connectable to a circuit breaker panel and which monitors the service voltage provided to the circuit breaker panel and the current and voltage measurable on the outputs of circuit breakers within the circuit breaker panel under no load and load conditions, a portable outlet tester unit used for testing the proper connection of the wiring in the home or office building to which power outlets therein are connected and a load bank having test loads capable of being selectively switched into electrical communication with the output of a respective circuit breaker residing in the circuit breaker panel in order to test the operability of the respective circuit breaker in the panel.

5 Claims, 26 Drawing Sheets

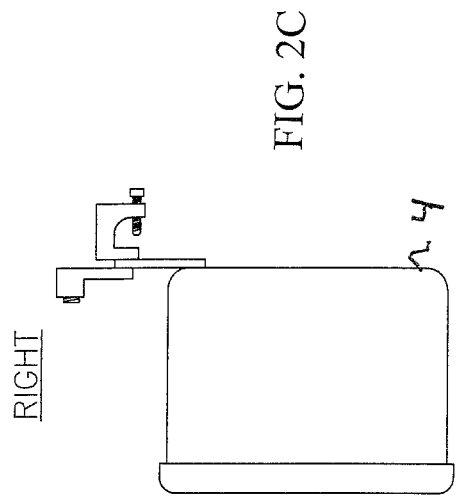
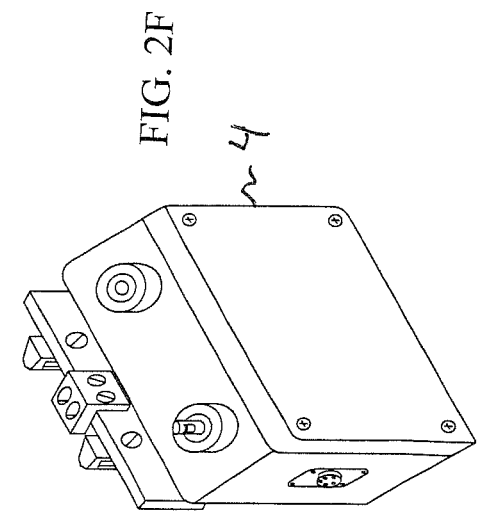
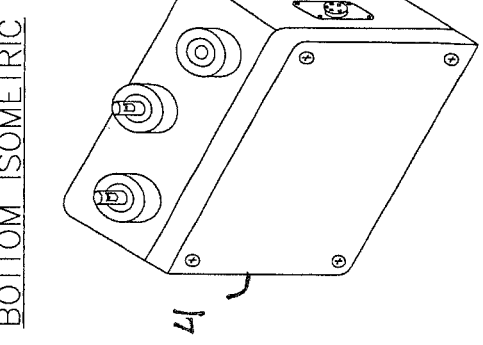
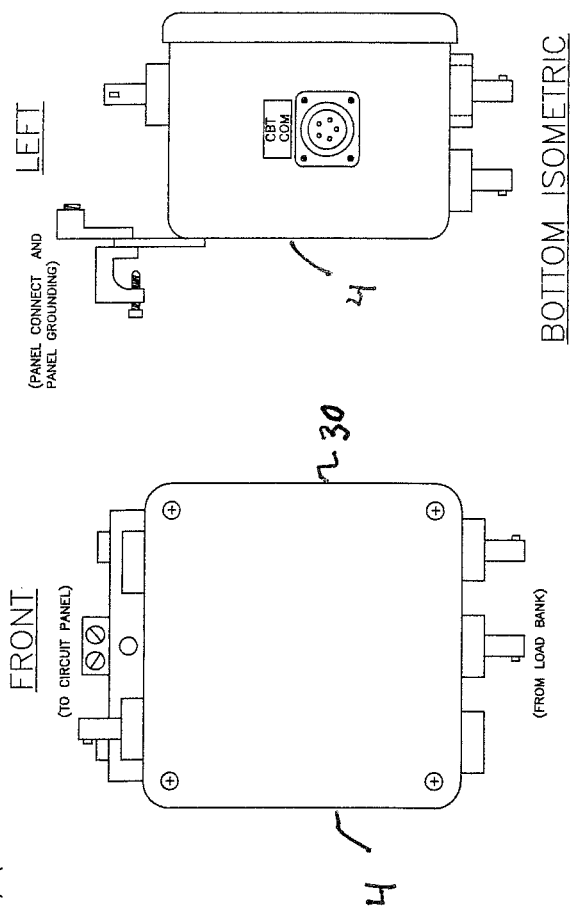
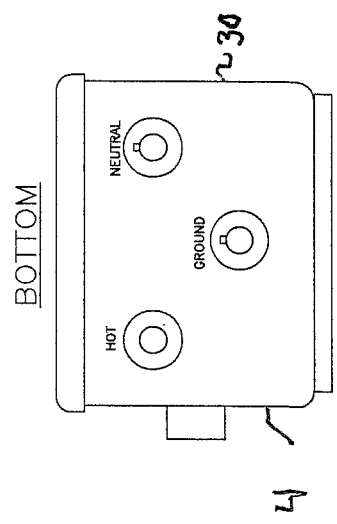

Circuit Breaker Tester (CBT)

FRONT

LEFT

RIGHT

BACK

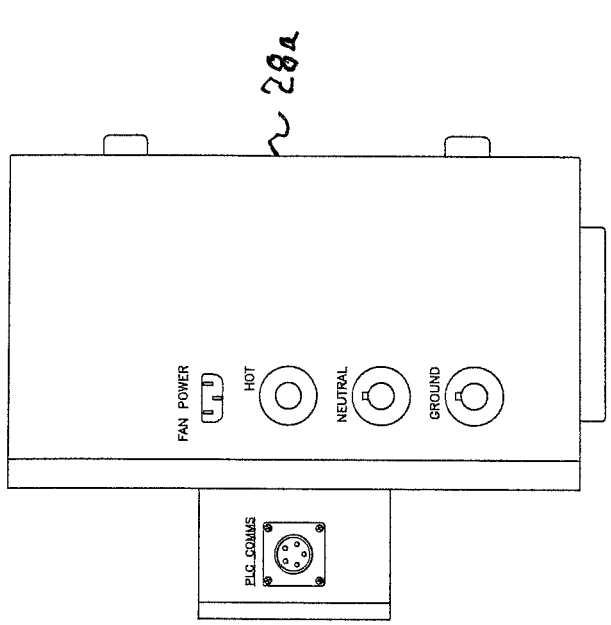
FIG 11B
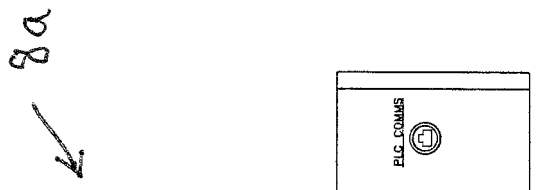
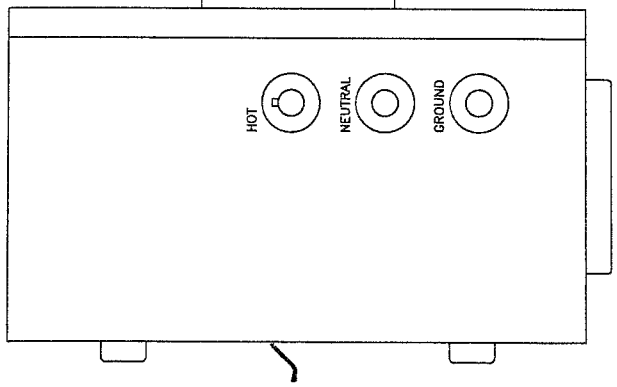
FIG. 11A

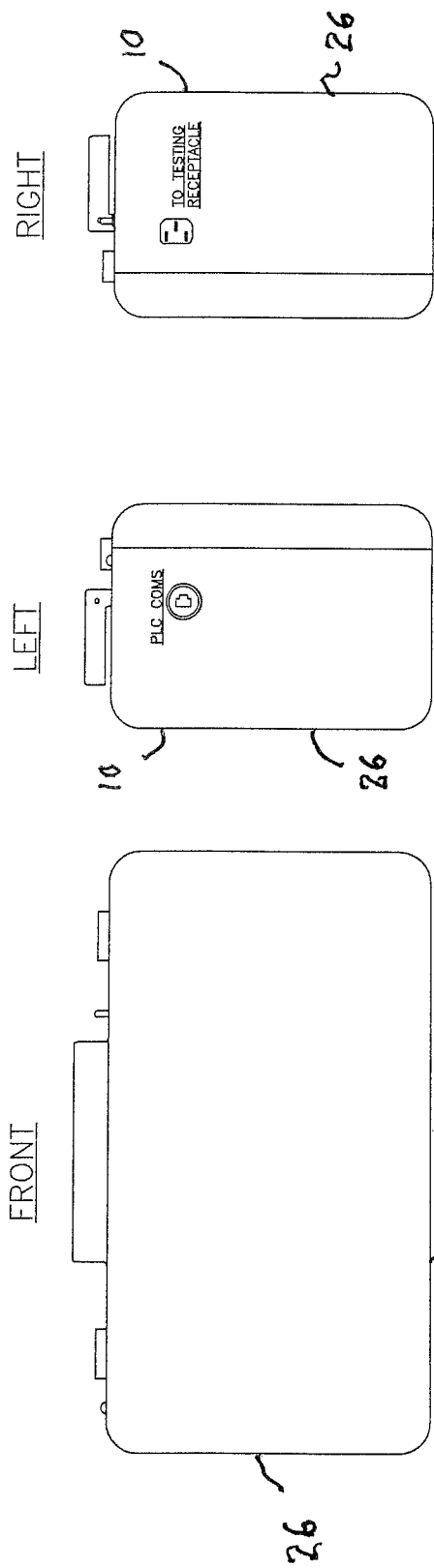
RECEPTACLE TESTER
FRONT
FIG 19A
LEFT
FIG 19B
RIGHT
FIG. 19C
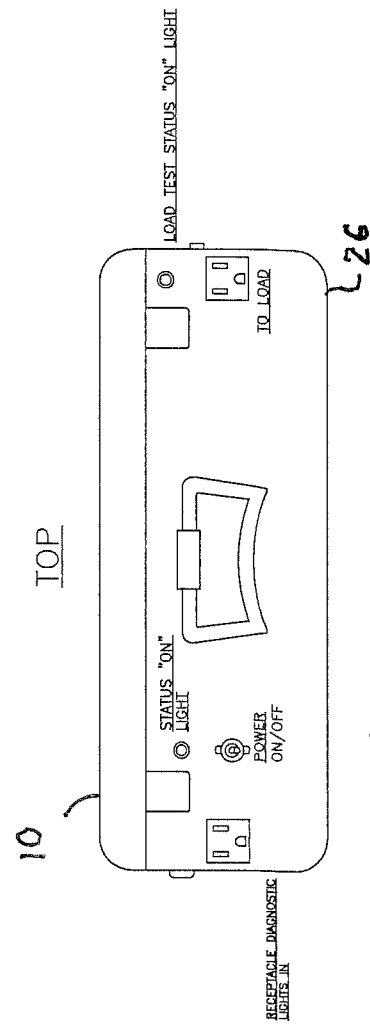
TOP
FIG. 19D

SYSTEM AND METHOD FOR TESTING ELECTRICAL CIRCUITS IN RESIDENTIAL AND COMMERCIAL PREMISES

CROSS-REFERENCE TO RELATED APPLICATIONS

This application is related to U.S. Provisional Application Ser. No. 63/194,454, filed on May 28, 2021, and entitled "System and Method for Testing Electrical Circuits in Residential and Commercial Premises", the disclosure of which is incorporated herein by reference and on which priority is hereby claimed.

BACKGROUND OF THE INVENTION

Field of the Invention

The present invention generally relates to apparatus for testing electrical circuits, and more particularly relates to equipment and devices used for testing electrical power circuits and components in residential and commercial premises.

Description of the Related Art

For safety concerns, it is prudent and often required by state and local municipalities to inspect the wiring, circuit breakers, power distribution panel and other power components in residential and commercial premises to determine if such are in compliance with state and local codes. A proper inspection conducted by a professional engineer, certified professional or licensed electrician entails testing power outlets and receptacles, including ground fault circuit interrupter (GFCI) outlets for the correct connection of neutral, hot and ground wiring and the proper operation of the GFCI outlets, and at least a visual inspection of the circuit breaker panel in a home or commercial building for obvious and latent defects. A typical tester often used during such inspections is the three-wire receptacle tester having illuminating LEDs available for purchase in most electrical supply and retail stores. Such inspections by a professional usually occur prior to properties being transferred to a new owner or when a certificate of occupancy is sought. Thereafter, periodic inspections are usually not performed unless mandated by state or local regulations.

However, electrical wiring, circuit breakers and other power components in a house or commercial building often age with time and can malfunction. Wiring insulation may become brittle and lose its electrical insulative properties, and circuit breakers may not trip at the manufacturer's specified current.

Conventional test equipment used during such inspections are not capable of thoroughly testing all of the electrical power circuits in residential and commercial premises, including but not limited to unexpected voltage drops in wiring, proper circuit breaker tripping at rated current loads and the effectiveness of GFCI-protected receptacles.

OBJECTS AND SUMMARY OF THE INVENTION

It is an object of the present invention to provide a system for testing electrical power circuits and components in residential and commercial premises.

It is another object of the present invention to provide a kit easily carryable by an electrician or inspector for testing circuit breakers, power outlets and other components of an electrical power circuit in residential homes and commercial buildings.

It is still another object of the present invention to provide a test kit and test equipment used for testing the integrity of electrical distribution components and wiring in residential and commercial premises.

In one form of the present invention, a system for testing electrical power circuits in a home or office building includes an interface unit having a housing that is mountable to the circuit breaker panel in a home or office building and which further includes therein a current sensing circuit which is electrically connectable to a line or hot bar (bus) within the circuit breaker panel; a circuit breaker tester unit having a housing and circuitry disposed therein which is electrically connectable to the circuit breaker panel and which monitors the service voltage provided to the breaker panel and the current and voltage of each circuit breaker output under no load and load conditions; an outlet tester having circuitry housed in a suitcase-like container which may be easily carried by an inspector throughout the home or office building to various locations where power outlets and receptacles are located and which is used for testing the proper connection of wiring to the outlet and operation of GFCI-protected outlets; and one or more load banks, each load bank having a housing in which is situated various resistive loads which may be selectively switched into electrical communication with the output of a selected circuit breaker residing in the circuit breaker panel in order to test the operability of each circuit breaker in the panel.

The circuit breaker tester unit communicates preferably wirelessly with the output tester carried by the inspector to various locations within the premises where outlets are located to ensure that the voltage at the outlet being tested is being compared to the proper reference service voltage detected by the circuit breaker tester by both voltages having the same phase. The circuit breaker tester unit also communicates, preferably by an Ethernet cable, to the one or more load banks to automatically switch in various loads for each circuit breaker undergoing testing.

These and other objects, features and advantages of the present invention will be apparent from the following detailed description of illustrative embodiments thereof, which is to be read in connection with the accompanying drawings.

BRIEF DESCRIPTION OF THE DRAWINGS

FIG. 2A is a front view of the interface unit (also referred to herein as the "I-Box") which forms part of the system of the present invention.

FIG. 2B is a left elevational view of the interface unit which forms part of the system of the present invention.

FIG. 2C is a right elevational view of the interface unit which forms part of the system of the present invention.

FIG. 2D is bottom plan view of the interface unit which forms part of the system of the present invention.

FIG. 2E is a bottom isometric view of the interface unit which forms part of the system of the present invention.

FIG. 2F is a top isometric view of the interface unit which forms part of the system of the present invention.

FIG. 11A is a left elevational view of the main Load Bank unit which forms part of the system of the present invention.

FIG. 11B is a right elevational view of the main Load Bank unit which forms part of the system of the present invention.

FIG. 19A is a front view of the outlet tester unit which forms part of the system of the present invention.

FIG. 19B is a left elevational view of the outlet tester unit which forms part of the system of the present invention.

FIG. 19C is a right elevational view of the outlet tester unit which forms part of the system of the present invention.

FIG. 19D is a top plan view of the outlet tester unit which forms part of the system of the present invention.

GENERAL DESCRIPTION OF THE PREFERRED EMBODIMENTS

Figure 1:
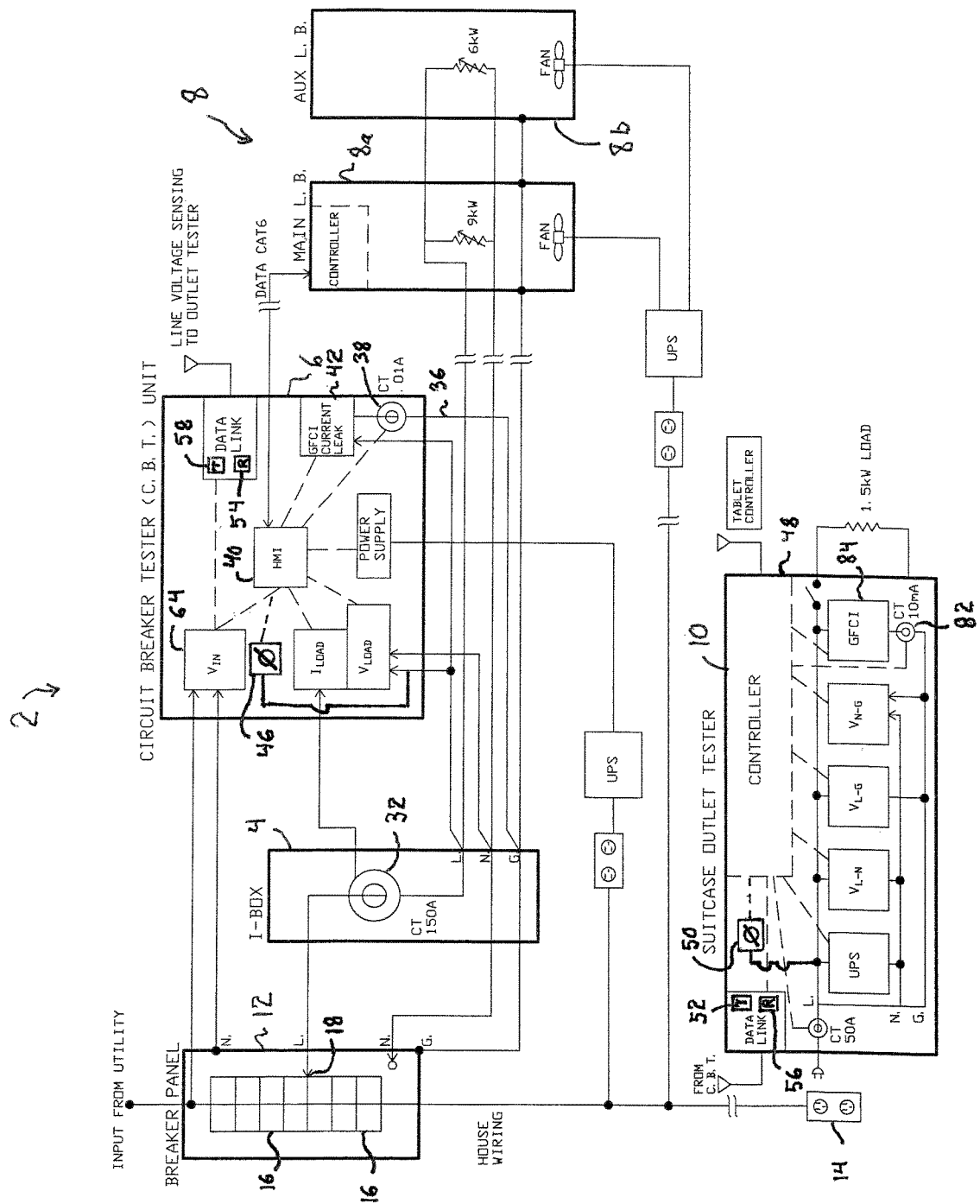
FIG. 1 is a detailed block diagram of the system of the present invention for testing the integrity of electrical power distribution components and wiring in residential and commercial premises.

Reference should be initially had to FIG. 1 of the drawings, which is a block diagram of the system 2 of the present invention for testing the integrity of electrical power distribution components and wiring in residential and commercial premises and which illustrates the preferred primary components of the system. As mentioned previously, the system 2 of the present invention includes an interface unit 4 (also referred to herein as the "I-Box"), a circuit breaker tester (CBT) unit 6, a Load Bank 8, which may be formed from a main Load Bank unit 8a and an auxiliary Load Bank unit 8b, and an outlet tester unit 10 generally in the form of a suitcase which may be carried by the inspector to each outlet in the premises.

The system 2 of the present invention is intended to analyze and document the condition of all electrical wiring within a home or a small office. The system 2 is intended for use with all 60 Hz electrical systems of 110-240 VAC. This includes simple 120 VAC lines sometimes found in apartments, 115/230 VAC lines most commonly found in private homes, and 208-240 VAC three phase (120 VAC for all lines to neutral, with 208 VAC between lines) systems found in small offices or larger homes. The system 2, with some modifications thereto which will be evident from the disclosure herein, may be used to test 480 VAC or higher industrial power systems.

Circuit breakers up to a rated 65 amperes can be fully tested. Even larger breakers can still be partially tested, depending on the exact circumstances.

As mentioned previously, the system 2 is comprised of three major sections—the circuit breaker tester (CBT) unit 6, the Load Bank 8, and the outlet tester 10. In a preferred form, the system 2 of the present invention may include a fourth section, that is, the Interface Unit (or "I-Box") 4.

The CBT (circuit breaker tester) unit chassis and its associated equipment are placed near the circuit breaker panel 12. The Interface Unit (I-Box) 4 preferably mounts directly to the panel 12.

The CBT unit 6 requires 120 VAC power for its own use, and since sooner or later all electrical lines will be interrupted for breaker testing, an uninterruptible power supply (UPS) is used to provide continuous power to the CBT unit 6. The UPS can be plugged into a convenient outlet. Alternatively, that is, instead of using a UPS to power the CBT unit 6, one of the panel service input lines can be tapped with the proper adapter; since the service inputs are never opened or disconnected, the CBT unit 6 can be powered directly therefrom without the UPS.

The Load Bank 8 is preferably mounted on two carts that usually stay tied down in a work van. If necessary, they can be untied and wheeled to a convenient location. The Load Bank 8 can be as much as 200 feet from the CBT unit 6; appropriate cables connect the Load Bank 8 either directly to the circuit breaker or indirectly through the I-Box 4.

Like the CBT unit 6, the Load Bank 8 requires a continuous source of 120 VAC to power its internal processor and also cooling fans therein. Thus, a second UPS is provided for that purpose.

The outlet tester 10 is preferably a suitcase-sized unit that is physically carried around the premises. The outlet tester unit 10 tests each outlet, along with its house wiring back to the breaker panel. All outlets are fully tested with no-load and load tests. Since the outlet tester unit 10 sits on the floor near the outlet under test, in order to allow operator convenience, a control panel forming part of the CBT unit 6 or a tablet computer, such as an I-Pad™, may be used to communicate over a dedicated local-area WiFi network with the outlet tester unit 10.

The breaker panel 12 has one of three possible power sources that the preferred form of the system 2 of the present invention can accommodate:

Small apartments may have a single service input of 120 VAC 60 Hz power.

Most homes usually have two service inputs-both are 120 VAC to neutral, and 240 VAC between them (i.e., 180 degrees apart).

Businesses often have three service inputs, known as three phase power (120 degrees apart). All three input lines measure 120 VAC to neutral, and measure 208 VAC against each other.

The system 2 of the present invention is fully compatible with all three types of service inputs. The CBT unit 6 has three color-coded clip leads to monitor the input voltage(s) in the breaker panel 12. The black lead is the default and must always be connected. The red leads are interchangeable, and can be connected (or left out when appropriate).

The breaker panel cover must be removed for testing, to gain access to the circuit breakers and wiring. Once the cover is removed, the system interface unit (I-Box) 4 is clamped to the bottom of the panel 12 with the supplied clamps and optional bracket. While the clamps provide both mechanical rigidity and an electrical ground, some breaker panels 12 do not allow such mounting. In such cases, an alternative form of support for the heavy cabling between the breaker panel 12 and the interface unit 4 may be "jury-rigged," with a (mandatory) electrical clip lead attached between the I-Box 4 and the panel ground. (There is no power drawn, so most any clip lead will do.)

Figure 24:
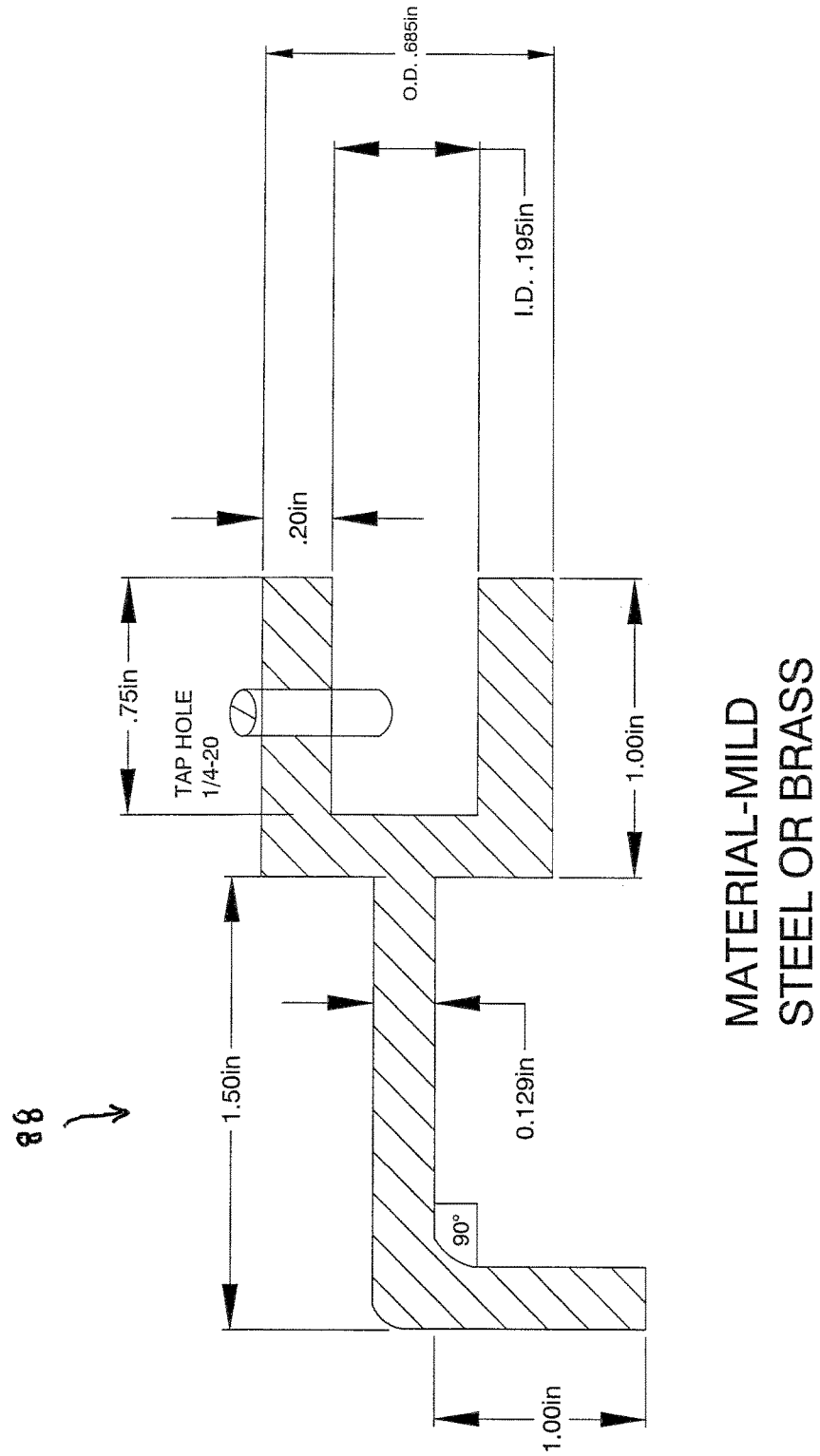
FIG. 24 is a top plan view of a pin specially designed for use in the system of the present invention to connect a heavy gauge test lead from the interface unit of the system to a circuit breaker panel.

The I-Box 4 has two heavy gauge stranded (AWG 8) wires, several feet long, each with a specially designed pin 88 (FIG. 24) that accepts the stranded AWG 8 wire and clamps it in place with a screw on one end, and has a rigid solid pin on the other. The pin is angled so as to easily fit in the circuit breaker panel locations designed to accept smaller gauge, solid wires. More specifically, the pin at the end of the neutral (white) wire should be passed through one of the holes in the panel neutral busbar and screwed down. The heavy gauge black wire is the probe used to test each breaker individually. Typically, the existing wire in the panel 12 connected to the output of the circuit breaker and going to the load is removed from the screw terminal for the test, and the pin at the end of the black probe wire is inserted in the terminal and tightened during testing.

A cable with three additional heavy gauge wires (black/white/green), carries the test current out to the Load Bank 8, where the power is dissipated as heat. Sufficient cable to reach preferably up to 200 feet from the interface unit 4 to the Load Bank 8 is supplied. The Load Bank 8 consists of several units 8a,8b preferably mounted on two hand carts for mobility, and securely tied down in a work van. The Load Bank units 8a, 8b can be used in-place, or if appropriate, removed from the work van and wheeled to a more convenient location.

Inside the I-Box 4, the 'hot" wire passes through a 150 ampere current sensor. The output signal of the current sensor and the line, neutral and ground voltages are brought to the CBT chassis through a thin, light gauge, multi-conductor cable for further processing and display.

The system 2 of the present invention tests circuit breakers at three levels by drawing three different currents through them. All currents are controlled in 2.5 ampere steps by the Load Bank switching in different loads:

First, no load is applied to the circuit breaker under test;

Second, a full rated load (nameplate value current draw) is applied to the circuit breaker under test; and Third and finally, an overload is applied to the circuit breaker under test to confirm that the breaker trips at twice (200%) of the rated nameplate current.

A practical way to apply the aforementioned current loads is to dissipate the power as heat. Under the worst-case test conditions, as much as 16 kilowatts of power must be dissipated to the surrounding air. Doing so takes an impressive amount of hardware, which is the Load Bank 8.

The Load Bank unit 8 consists primarily of two large steel chassis associated with a primary section 8a and an auxiliary section 8b of the Load Bank 8, each mounted on a two-wheel hand cart, securely tied down in the work van. The Load Bank 8 can be used in place in the van, or where more appropriate, the carts can be removed from the van and wheeled to a more convenient location. Cabling to carry the load current between the interface unit 4 to the Load Bank 8 is provided to allow the Load Bank 8 to be mounted preferably up to 200 feet from the breaker panel 12.

If a panel 12 with no breakers marked above 45 amperes is tested, only the primary section 8a of the Load Bank 8 need be connected. Breakers from 50 to 65 ampere ratings are tested with both the primary section 8a and the auxiliary section 8b of the Load Bank unit 8 working in tandem.

The primary section 8a of the Load Bank 8 includes sufficient heat dissipation to absorb preferably up to 90 amperes, suitable for a 200% load on a 45 amp breaker. The primary section 8a also includes a common controller for operation and control of both the primary section 8a and the auxiliary section 8b of the Load Bank 8, and cooling fans to dissipate the heat to the surrounding air. The auxiliary or secondary section 8b of the Load Bank 8 contains additional heat dissipation and cooling fans to dissipate an additional 40 amperes (for a total 130 amperes when both sections 8a, 8b are operational) to allow testing of 65 amp breakers at both full load and 200% overload.

Despite having huge amounts of power dissipation available at the Load Bank 8, the application of a current load is intermittent, and both the controller and cooling fans need to remain energized after a breaker trips open, cutting off power. To that end, an uninterruptible power supply (UPS) is provided to power the controller in the primary section 8a and the cooling fans in both the primary section 8a and the auxiliary section 8b. Normally, both Load Bank chassis (i.e., the primary section 8a and the auxiliary section 8b) are electrically connected to and powered by a common UPS, and the UPS in turn plugs into a nearby AC outlet. The UPS keep the cooling fans and the controller powered and running in the sooner-or-later inevitable event that the power outlet is on the line being tested and loses power. Since the UPS power draw is actually rather low, even several simple lengths of interconnected extension cords strung in series connecting the UPS power outlet with the primary and auxiliary sections 8a, 8b of the Load Bank 8 work just fine. Other options to provide operational power to the Load Bank 8 may be employed, such as a gasoline generator or a 12 VDC-120 VAC inverter in the work van.

An Ethernet bus or cable connects the primary section 8a of the Load Bank 8 to the CBT unit 6, from where it is controlled. Commands from the CBT unit 6 provided over the Ethernet bus to the controller in the primary section 8a of the Load Bank 8 causes the controller to switch on the required loads, while the fans are controlled to provide cooling during testing and after, until the loads cool. Two temperature sensors are in each of the primary section 8a and the auxiliary section 8b of the Load Bank 8, and the sensed temperature data is sent back to the CBT unit 6 over the same Ethernet bus for display thereon.

The two Load Bank chassis (i.e., the primary section 8a and the auxiliary section 8b) are connected to each other with three additional, short heavy gauge jumper wires (black/white/green) to carry the load power, and a much thinner, lighter gauge "umbilical cord" for carrying commands and status data. Both chassis of the Load Bank primary and auxiliary sections 8a,8b also have power cords to nominally plug into a common UPS.

The CBT unit 6 ties together all of the previously described subassemblies of the system 2 of the present invention and controls the operation of the system 2. The CBT unit 6 accepts all operator commands, controls the Load Bank 8, and calculates, stores and displays all test data to the system's operator.

The CBT unit 6 contains a user touch-panel for control and display, and a controller therein is used for all calculations and data storage for eventual downloading into a final report.

The CBT unit 6 is powered by 120 VAC, and a low power UPS is provided. The CBT unit 6 requires much less power than the Load Bank 8. Like the Load Bank 8, the CBT unit 6 preferably does not simply run off an AC outlet, as sooner or later that outlet will be disconnected for testing of the circuit breaker providing power thereto. Alternatively, the service input line(s) providing power to the breaker panel 12 are never disconnected so a simple adapter electrically connecting the power inputs of the CBT unit 6 to the service lines may be provided.

The CBT unit 6 monitors the service input voltage provided on the services lines to the breaker panel 12. This input voltage is the reference voltage from which the point-of-test voltages are subtracted to determine the exact voltage drop for each test performed by the system 2. For example, the output voltage of a circuit breaker should be identical to the reference voltage at zero load, slightly less at the breaker rated load, and somewhat less than the voltage drop at the rated load during the 200% overload test. Controller calculations and user knowledge are used to interpret the meaning and significance of the readings and measurements performed by the CBT unit 6.

Breaker panels 12 typically have one, two or three service inputs. Circuit breakers and house wiring use them interchangeably. There is no guarantee that both (or all three) service inputs have the exact same voltage, so the CBT unit 6 includes a small "phase detector" module that ensures the circuit breaker probe and the input service voltage sensor ("V1" or "$V_{IN}$") are connected to the same voltage source.

The heavy gauge black probe wire has a small electrical lead going from the I-Box 4 to an input on the phase detector module. The phase detector module in the CBT unit 6 accepts the voltages from the three clipleads placed on the service inputs and the heavy-gauge probe. The service input with the black cliplead is the default, and that voltage is routed to the service input sensor ("V1") unless one of the red clipleads is found to have a better voltage phase match.

With a true three-phase input service, there is a 120 degree phase spacing between inputs. The more common 120/240 VAC input can be considered to be a two-phase system, with 180 degree phase separation. The phase detector module does a phase comparison between the probe voltage waveform and that of each of the two red clipleads. Should one of the red clipleads be a close phase match to the voltage on the probe, that line is connected to the V1 sensor. In this manner, the V1 sensor measures the correct voltage of the input service phase that the probe on the circuit breaker output connected to.

It should be noted that the two red voltage sensing clipleads are interchangeable, and one can be left off for a two phase 120/240 VAC distribution panel, and both voltage sensing clipleads can be left off for a single phase service input breaker panel.

While the outlet tester unit 10 is described in greater detail later herein, at this point it should be mentioned that the outlet tester unit 10 also requires the V1 reference voltage to determine the line voltage drop of the house wiring from the circuit breaker all the way to the AC receptacle or outlet being tested. Since the outlet tester unit 10 is portable, and not connected to the CBT unit 6, a second phase detector circuit having an optoisolator in the outlet tester unit 10 creates a logic-level 60 Hz square wave in phase with the voltage on the outlet being monitored. An RF data transceiver in the remote outlet tester unit 10 sends this waveform signal via an RF link to the CBT unit 6 in which a second phase detector and monitoring circuit similar to the first V1 phase detector circuit, in response to the transmitted waveform signal, compares the phase of the reference service voltage with the phase of the transmitted waveform from the outlet tester unit 10, routes the proper, comparably phased, AC service input voltage to a V1*a* analog-to-digital converter in the CBT unit 6, which then sends via a transceiver in the CBT unit 6 a digitized input phase magnitude signal back to the outlet tester unit 10 in a serial data stream over a separate RF link thereto.

The probe voltage, mentioned earlier, is brought to another, identical voltage sensor (V2) in the CBT unit 6 that monitors the voltage probe (heavy black cable) to allow the controller in the CBT unit 6 to calculate and display the output voltage of the breaker under test and the associated voltage drop thereacross under different load conditions.

As previously described herein, where the heavy black wire used to carry the breaker output voltage to the Load Bank 8 through the I-Box 4, it passes through a 0-150 ampere current sensor forming part of the I-Box 4. The output signal of this sensor is brought over the small gauge cable to the CBT unit 6, so that the actual load current can be measured and displayed and used in any calculations performed by the CBT unit 6. Again, currents of 0 to 130 amperes are expected depending on the breaker rating and selected test.

When the controller of the CBT unit 6 commands the Load Bank 8 to begin drawing significant current through a circuit breaker (either the rated load current or the 200% overload current), the controller of the CBT unit 6 also commands the appropriate Load Bank cooling fans in the primary section 8*a* or in both the primary section 8*a* and the auxiliary section 8*b* to start. Due to significant thermal inertia, the CBT unit 6 keeps the fans operating long enough after the end of the test to allow the load circuits in the Load Bank 8 to cool down (typically two minutes). The thermal sensors in the primary section 8*a* and auxiliary section 8*b* of the Load Bank 8 are monitored, and if the temperatures are excessive, high current testing is disabled until the Load Bank 8 return to a normal operating temperature.

During the 200% overload test, it is expected that a properly operating circuit breaker will take in the range of about 20 seconds to about 120 seconds to trip (open). While the test is running, a time indication is displayed on a display of the CBT unit 6, and the elapsed time from the start of the test until the breaker opens is latched on the display and in the memory of the controller until it is reset by the user so that the elapsed breaker trip time can be observed and noted. The time-to-trip time is included in the test report prepared by the system user for all circuit breakers, and is an important pass-fail criteria for breaker replacement.

Ground fault circuit interrupter (GFCI) circuit breakers not only are tested by the system 2 of the present invention for voltage drop and the elapsed time to trip at a 200% overload, but also the exact sensitivity of the GFCI breakers to ground faults is determined.

It should be noted that all ground fault devices include a test button, which is certainly a good way to locate a defective GFCI breaker, but the actual conditions put in play by pressing the test button are undefined. The system 2 of the present invention, in particular, the CBT unit 6 thereof, measures and reports the exact leakage current at which the GFCI-protected breaker will trip (which is nominally about four milliamperes to about six milliamperes AC from the hot line to ground, bypassing the neutral).

When the leakage test is initiated, a GFCI test module in the CBT unit 6 begins to create a small AC leakage current directly from the hot line to ground, bypassing the neutral. The test current is monitored by a current sensor in the CBT unit 6 and which has a smaller incremental current measuring range than that of the I-1 sensor in the interface unit (i.e., the I-Box) 4, designated herein as the I-2 sensor, that is rated for zero milliamperes to about ten milliamperes AC. The controller of the CBT unit 6 causes the test current to slowly ramp up to ten milliamperes (mA) in about one half minute. The GFCI breaker should trip at a nominal current of between about four mA and about six mA, which takes about 15 seconds. Once the breaker trips open, the last current reading is latched in the memory associated with the controller of the CBT unit 6 until it is reset, and trip current is displayed on a display of the CBT unit 6 so that the trip current can be observed and recorded.

The outlet tester unit 10 is preferably housed in a small suitcase and serves as a standalone unit that is carried by an inspector around the house from outlet to outlet. The outlet tester 10 is electrically connected (i.e., plugged into) each outlet and measures voltages and currents at the outlets, and performs other tests at each outlet, and stores these measurements and test results in a memory associated with a controller which forms part of the circuitry of the outlet tester unit 10 taking data, both at no-load and at approximately rated load.

A power switch is used to turn on the controller in the outlet tester unit 10, and the controller should remain energized during an outlet test procedure. The outlet tester unit 10 is preferably battery powered, and every time the unit is plugged into a live outlet, the battery recharges. (The outlet tester unit 10 will recharge whether on or off).

The outlet tester unit 10 includes a quick-look display module having viewable different colored LED (light emitting diode) indicators to quickly show obvious outlet defects, such as misconnected hot, neutral and ground wires. Whenever the outlet tester unit 10 is plugged into an outlet for test, the quick-look module with its LED indicators should be checked first.

The outlet tester unit 10 includes a controller similar to the controllers forming parts of the CBT unit 6 and the Load Bank 8. The controller of the outlet tester unit 10 monitors and stores all outlet test data and causes the test measurements to be displayed on a display of the outlet test unit 10 or on a laptop computer or handheld device (e.g., an I-Pad™) connected thereto.

More specifically, the outlet tester unit 10 preferably has a display or, more preferably, includes a WiFi-enabled tablet computer, such as an I-Pad™, as the "front panel" to display all data and accept all user commands. A WiFi transceiver forming part of the circuit of the outlet test unit 10 is electrically coupled to the controller and transmits such test data to the WiFi-linked tablet computer and receives command signals therefrom.

As described previously, the CBT unit 6 routes the input service voltage to a voltage sensor V1*a* and then to the transceiver in the CBT unit 6 which communicates with the remotely located outlet tester unit 10 via an RF data link. The matching transceiver in the outlet tester unit 10 provides this received data to the controller in the outlet tester unit 10 for processing and display, similar to the functions performed by the controller in the circuit breaker tester unit 6. It should be noted that all RF links and the transmission of data and control signals to and from the CBT unit 6, the outlet tester unit 10 and the Load Bank 8 work independently of one another.

As in the CBT unit 6, the service input voltage is used as a reference voltage in the outlet tester unit 10 to compare the outlet voltage measurements against. In this case, however, the voltage drop measured at the outlet includes all the wiring in the walls between the service inlet and the outlet under test. It should be realized that another outlet on the same line that is being heavily loaded can increase the voltage drop measurement. For that reason, it is suggested all heavy current appliances and the like not be used and be disconnected or turned off during the outlet testing.

The outlet under test is evaluated both with and without a load. The no-load condition is tested first. There are three voltage sensors forming part of the circuit of the outlet tester unit 10:

- a Line-to-Neutral voltage sensor (V3), which tests the voltage between the line (hot) and neutral lines at the outlet;
- a Line-to-Ground voltage sensor (V4), which tests the voltage from the line (hot) to the ground terminal on the outlet; and
- a Neutral-to-Ground voltage senor (V5), which tests the voltage between the neutral wire and the ground terminal at the outlet.

The Neutral-to-Ground voltage measurement is worthy of note. It is easy to forget that the current that causes a voltage drop on the line (hot) will also cause an equal and opposite voltage increase on the neutral wire. Therefore, the system 2 not only monitors the voltage drop from the service input to the line (hot) terminal at the outlet under test, but also monitors any rise in the voltage of the neutral above ground.

A momentary-action toggle switch provided on the outlet tester unit 10 and forming part of the circuitry thereof allows the user of the system 2 to quickly exchange the neutral and ground connections to provide a quick check of the ground lead resistance under load.

The outlet tester unit 10 tests the outlet under no-load conditions and under load. There is a relay forming part of the circuitry of the outlet tester unit 10 that preferably connects the outlet under test to a commercial heater that preferably draws 12.5 amperes as a load. There is also a current sensor forming part of the circuitry of the outlet tester unit 10, much like the 150 ampere current sensor in the I-Box 4, except that the current sensor in the outlet tester unit 10 measures zero to about fifty amperes. When the load test is commanded by the user using the tablet computer, the relay turns on and the current sensor sends a current measurement signal to the controller which, in turn, directs the WiFi transceiver to send a corresponding digitized signal to the tablet computer to be displayed on the tablet computer screen. The controller of the outlet tester unit 10 also calculates and causes data to be transmitted by the transceiver to the tablet computer for display thereon simulated voltage drops that would be expected preferably at 15 amperes and 20 amperes, based on extrapolating the 12.5 ampere data.

The outlet tester unit 10 also tests GFCI-protected outlets in much the same way as the CBT unit 6 tests GFCI-protected circuit breakers. More specifically, Ground fault circuit interrupter (GFCI) outlets not only are tested by the outlet tester unit 10 for voltage drop, but the outlet's also exact sensitivity to ground faults is determined.

It should be noted that all ground fault outlets include a test button, which is certainly a good way to locate a defective GFCI outlet, but the actual conditions put in play by pressing the button are undefined. The outlet tester unit 10 measures the exact leakage current at which the outlet will trip (nominally, about four milliamperes (mA) to about six mA AC from the line (hot) to ground, bypassing the neutral).

When the leakage current test is initiated, a leakage current test module forming part of the circuitry of the outlet tester unit 10 begins to create a small AC leakage current directly from the line (hot) to ground, bypassing the neutral.

The test current is monitored by a current sensor forming part of the circuitry of the outlet tester unit 10 that is rated for zero to about ten mA AC. The test current slowly ramps up to about ten mA in about one half minute. The GFCI circuit internal to the outlet should trip at a nominal current of between about four mA and about six mA, which takes about 15 seconds. Once the outlet trips open, the last current reading is latched into a memory forming part of the controller of the outlet tester unit 10 until the stored current measurement is reset. In one form of the outlet tester unit 10, the controller therein sends this current data or corresponding data to the transceiver of the outlet tester unit 10 for wireless transmission of the data to the tablet computer so that it may be displayed on the tablet computer screen and so that the current measurement may be observed and displayed, or the data may be displayed on a touch screen display forming part of the outlet tester unit 10.

DETAILED DESCRIPTION OF THE PREFERRED EMBODIMENTS

As may be seen in FIGS. 1, 2A-2F and 3 of the drawings, the test system 2 of the present invention includes an interface unit or "I-Box" 4. The purpose of the interface unit 4 is not only to provide support and strain relief and act as a junction box for the heavy gauge electrical wires connected to the circuit breaker panel 12 and to the Load Bank 8 of the system 2, but also to measure the current passing through individual circuit breakers in the distribution panel 12 under various test loads.

More specifically, the interface unit 4 has a housing in a preferred form of a rectangular parallelepiped defining an internal cavity in which is located a current sensor, as will be described in more detail. The housing is preferably made of an electrically conductive material (aluminum, steel or other ferrous material) and includes a top wall, a bottom wall situated opposite the top wall, a front wall and a rear wall situated opposite the front wall, and opposite lateral side walls on at least some of which various electrical connectors are mounted.

For example, and as shown in FIG. 2F, the top wall has mounted on it two heavy gauge input connectors, that is, a keyed male plug input connector for connection to the line (hot, black) test cable or lead, the opposite end of which is connectable to the output of a circuit breaker within the power distribution panel 12 under test, and a keyed female receptacle input connector for connection to the neutral (white) test cable or lead, the opposite end of which is connectable to the neutral common bus bar within the power distribution panel 12.

Three heavy gauge output connectors are also preferably mounted on the bottom wall of the interface unit 4, as shown in FIGS. 2D and 2E. These connectors include a keyed female receptacle output connector for connection to the line (hot, black), heavy gauge extension cable or wire, the opposite end of which is connectable to the remotely located Load Bank 8, a keyed male plug output connector for connection to the neutral (white) heavy gauge extension cable or wire, the opposite end of which is also connectable to the Load Bank 8, and a second keyed male plug output connector for connection to the ground (green) heavy gauge extension cable or wire, the opposite end of which is connectable to the Load Bank 8. The ground output wire, the neutral output wire and line output wire extending between the interface unit 4 and the Load Bank 8 are preferably eight gauge wires. More specifically, each of the line (hot) test wire and the neutral test wire is preferably eight gauge to carry the current required for the full rated load (100%) and twice rated load (200%) tests performed by the circuit breaker tester unit 6 on each circuit breaker within the power distribution panel 12.

Furthermore, a female multi-pin output connector is preferably mounted on one lateral side wall of the housing of the interface unit 4. A cable having a plurality of light gauge wires is connectable to this multi-pin connector, the other end of which is connectable to the circuit breaker tester (CBT) unit 6, or CBT Box, as will be explained in greater detail. The wires in the multiwire cable between the interface unit 4 and the circuit breaker tester unit 6 are preferably twenty gauge wires since they carry relatively little current.

As mentioned previously, one of the functions of the interface unit 4 is to provide support and act as a junction box for the heavy gauge cables connected to the power distribution panel 12 and to the Load Bank 8. In this regard, the interface unit 4 has a mounting bracket affixed to the rear wall of the housing of the interface unit 4. This mounting bracket is preferably formed from a relatively thick section of sheet metal (aluminum, steel or other ferrous material) and includes on this sheet metal section a pair of conduit clamps for securely but removably mounting the interface unit 4 directly onto the open frame of the power distribution panel 12 after the front panel cover is removed. The clamps are also made from a ferrous material (aluminum or steel, for example) such that, when the interface unit 4 is mounted to the distribution panel 12, a good ground connection should be provided from the distribution panel 12 to the housing of the interface unit 4.

Nevertheless, because the power distribution panels 12 are often painted, a chassis ground terminal is provided and secured to the electrically conductive mounting bracket. A grounding wire may be connected from a ground terminal in the distribution panel 12 to the chassis ground terminal on the mounting bracket to ensure that the housing of the interface unit 4 is properly grounded.

Figure 3:
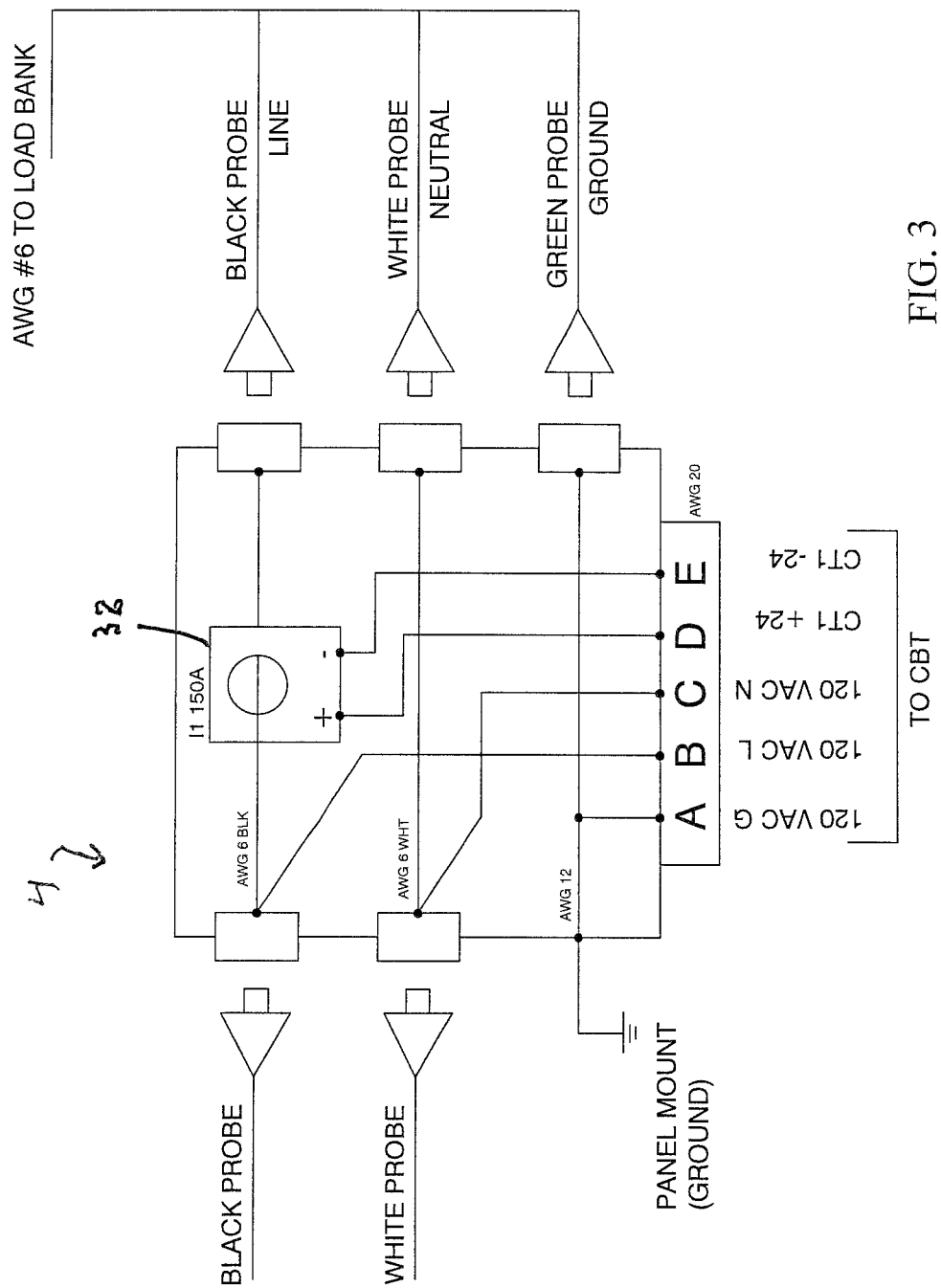
FIG. 3 is a block diagram of the electrical components and internal wiring of the interface unit which forms part of the system of the present invention.
Figure 4A:
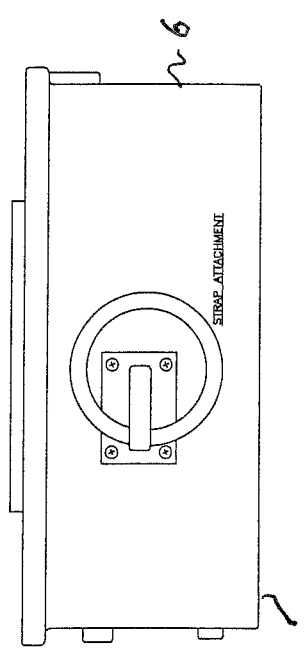
FIG. 4A is a front view of the circuit breaker tester unit which forms part of the system of the present invention.
Figure 4B:
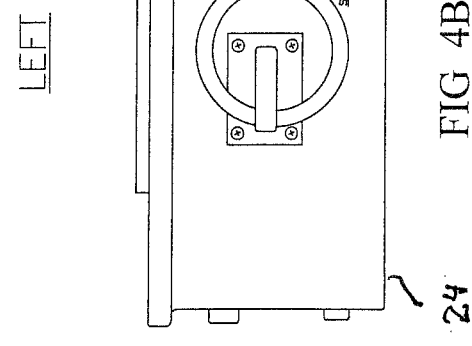
FIG. 4B is left elevational view of the circuit breaker tester unit which forms part of the system of the present invention.
Figure 4C:
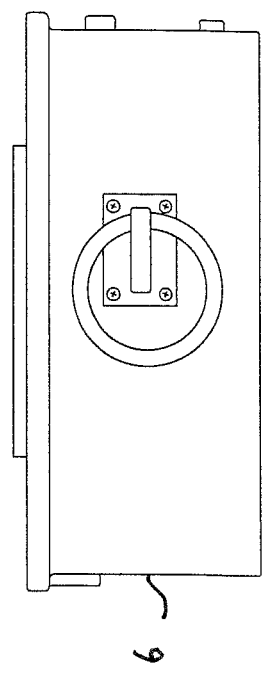
FIG. 4C is a right elevational view of the circuit breaker tester unit which forms part of the system of the present invention.
Figure 4D:
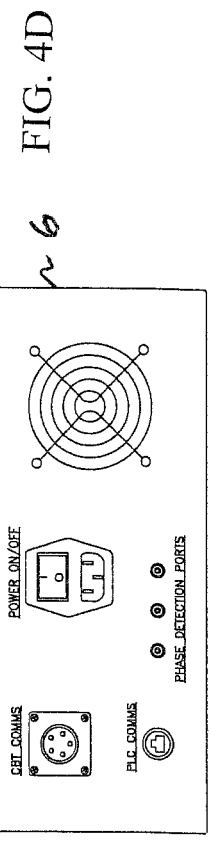
FIG. 4D is a rear view of the circuit breaker tester unit which forms part of the system of the present invention.
Figure 5B:
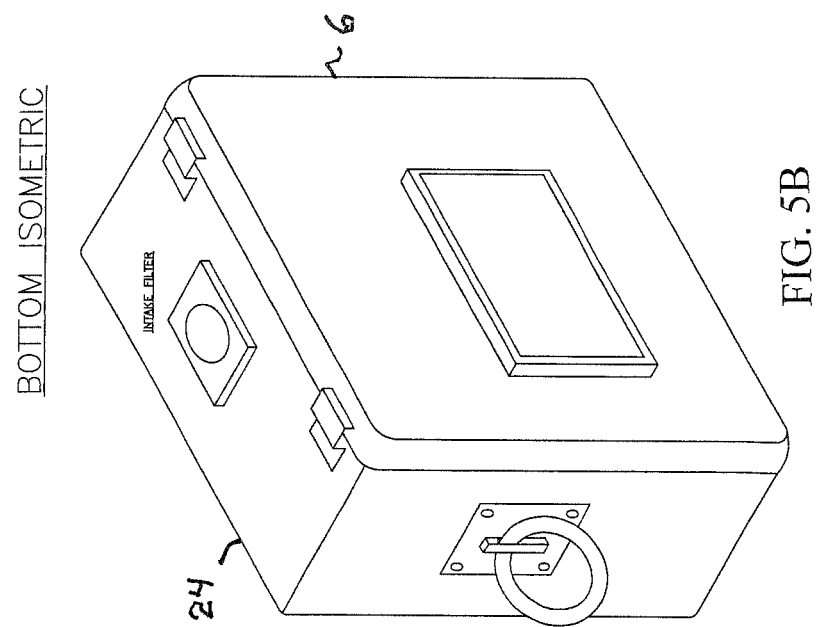
FIG. 5B is a bottom isometric view of the circuit breaker tester unit which forms part of the system of the present invention.
Figure 5A:
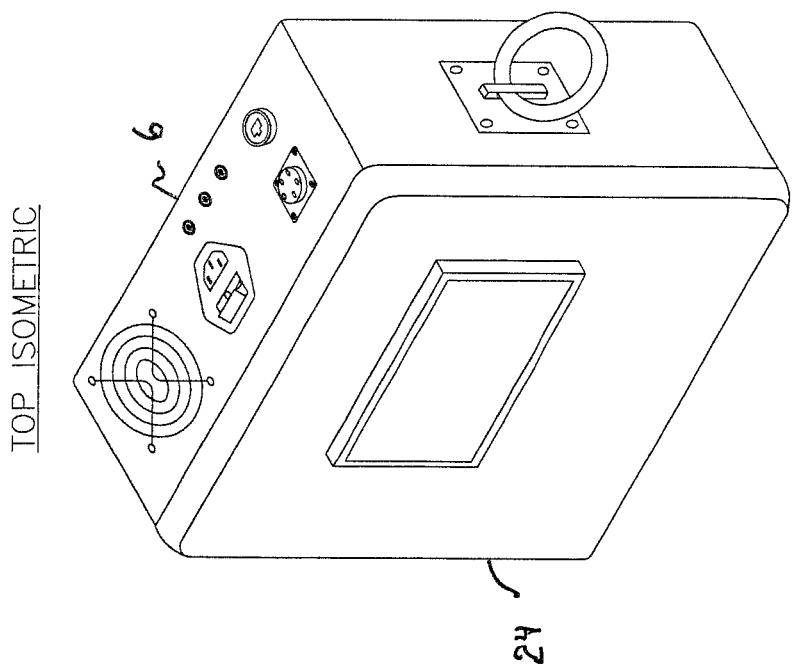
FIG. 5A is a top isometric view of the circuit breaker tester unit which forms part of the system of the present invention.
Figure 6:
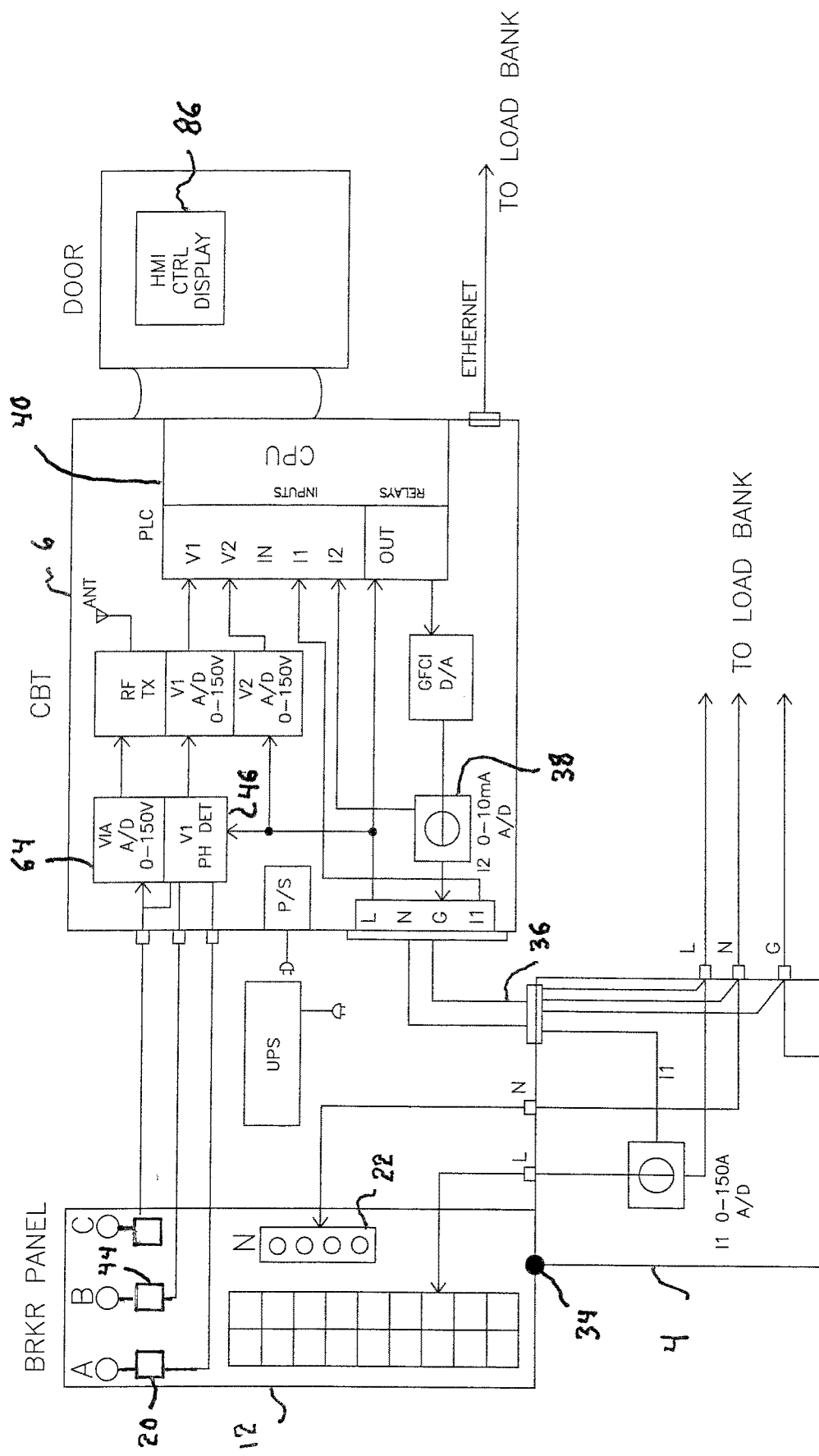
FIG. 6 is a detailed block diagram of the interface unit and the circuit breaker tester unit of the system of the present invention.

The inside of the housing of the interface unit 4, that is, within the internal cavity defined by the housing, is shown in FIG. 3. It can be seen from FIG. 3 that a first, light gauge jumper wire is connected between the line (hot, black) input connector and a pin on the multi-pin output connector. A second, light gauge jumper wire is connected between the neutral (white) input connector and another pin on the multi-pin output connector. A third, light gauge jumper wire is connected between the chassis ground terminal and the output ground connector. A fourth, light gauge jumper wire is connected between either the chassis ground terminal or the output ground connector and a pin on the multi-pin connector.

Furthermore, there is a fifth, heavy gauge jumper wire connected between the line (hot) input connector and the line (hot) output connector, and another sixth, heavy gauge wire connected between the neutral input connector and the neutral output connector.

The housing of the interface unit 4 is preferably about four inches by about four inches by about four inches in dimensions and, rather than being formed from metal, may be made from a plastic or thermoplastic material. If the housing is made from a plastic material, the metal mounting bracket extends into the internal cavity of the housing and is electrically connected to the ground jumper wire.

As mentioned previously, within the internal cavity of the interface unit 4 is located a current sensor. In one form, the current sensor may be a toroidal (donut-shaped), high current sensor having a central hole formed through its thickness. The heavy gauge line (hot) jumper wire passes through the central hole of the current sensor, and the current sensor senses the current flowing therethrough and, concomitantly, the current flowing through the heavy gauge line (hot) test lead or probe, which is connectable to the output of a circuit breaker under test.

The current sensor has at least two sense wires, which are electrically coupled to the toroidal windings of the current sensor and, in response to the current flowing through the line (hot) jumper wire, carry a current sense signal (also referred to herein as an "$I_{LOAD}$ signal"), which is proportional to the current in the line (hot) jumper wire. The current sense wires from the current sensor are connected to pins on the multi-pin connector. The current sensor in the interface unit 4 is preferably capable of measuring 0 amperes to about 150 amperes of current passing through the line (hot) jumper wire within the internal cavity of the housing of the interface unit 4 and thus the current passing through the line (hot) test lead or probe connected to the output of a circuit breaker under test.

The first, second and fourth light gauge jumper wires connected to the multi-pin connector essentially tap or sample the voltages on the line (hot) and neutral test cables or probes connected between the power distribution panel 12 and the interface unit 4, as well as on the ground through the clamp connection of the interface unit 4 to the panel housing or through the chassis ground terminal. Also, the jumper wires from the current sensor connected to the multi-pin connector carry the current sense signal that is proportional to and indicative of the current flowing through the line (hot) test probe that is connected to the output terminal of a circuit breaker being tested under no load and various load conditions. These voltage and current signals are provided to the circuit breaker tester unit 6, or CBT Box, which uses those signals to evaluate the condition and proper operation of a circuit breaker.

Alternatively, instead of using a metal plate and clamps to attach the interface unit 4 to the breaker panel, perforated elongated metal straps may be used. The straps are secured with machine screws to the metal housing of the interface unit 4 and provide an electrically conductive path thereto for a ground connection. Selected holes in the straps may be aligned with openings formed in the distribution panel 12 that are used to hold the panel cover in place, and the same sheet metal screws may be received through the aligned strap holes and panel openings to mount the interface unit 4 to the power distribution panel 12 and to provide a good ground through the mounting straps. A ground jumper wire within the internal cavity defined by the housing of the interface unit 4 may be connected at one end thereof to one of the machine screws securing the straps to the housing of the interface unit 4 and at the other end to the ground output connector.

The test leads or probes connected to the power distribution panel 12 include at the interface unit end a male plug connector for neutral, which may be mated to the corresponding neutral female input connector on the top wall of the interface unit 4, and a female connector at the interface unit end for the line (hot, black), which may be mated to the male plug connector on the top wall of the interface unit 4. The opposite end of the neutral test cable may be screwed down and secured to the uninsulated neutral bus bar within the power distribution panel 12. The circuit breakers are individually and sequentially disconnected from their respective circuit load wire or wires by unscrewing these circuit wires from the terminals to which the outputs of the circuit breakers are connected and screwing down and securing the line (hot, black) test probe or wire to the terminal to which the output of the circuit breaker under test is electrically connected.

The structure of the circuit breaker tester unit 6 of the system 2 of the present invention will now be described in greater detail, and reference should be had to FIGS. 4A-4D, 5A, 5B and 6-8 of the drawings. The circuit breaker tester unit 6, or CBT Box, is the "brains" of the system and controls and monitors the system's testing of the circuit breakers, including the operation of the Load Bank 8 to switch in various loads to the circuit breakers under test. The circuit breaker tester unit 6 connects to the interface unit 4 via a multi-wire cable to receive voltage and current sense signals therefrom, communicates with the remotely located Load Bank 8 via a CAT 6 Ethernet cable to send controls signals over the cable to the Load Bank 8 and to receive thermal data signals therefrom, and communicates wirelessly via an RF link with the outlet tester unit 10 carried throughout the home or office building where power receptacles and outlets are located for testing.

The circuit breaker tester unit 6 includes a housing also preferably in the shape of the rectangular parallelepiped like the housing of the interface unit 4 but relatively larger than the interface unit housing, as it defines an internal cavity in which is situated various modules for measuring voltages and currents, a controller or central processing unit, such as a programmable logic controller, or PLC, a phase detector circuit used to ensure that the voltages measured at the circuit breakers and AC outlets are compared to the correct service voltage used as a reference, a transceiver for communicating wirelessly with the outlet tester unit 10, an antenna coupled to the transceiver and other electronic circuitry.

An LCD (liquid crystal display) or other forms of displays or meters are mounted on the front cover of the circuit breaker tester unit 6 and are electrically coupled to the PLC. The display displays the results of tests performed on the circuit breakers and may display tests performed on outlets by the outlet tester unit 10 and communicated wirelessly to the circuit breaker tester unit 6, and acts as a touch sensitive keypad or HMI (human machine interface) for the user of the system to enter operational commands to the PLC. The PLC in the circuit breaker tester unit is preferably Part No. P1000 distributed by Automation Direct Inc. of Cummings, Georgia.

On a side wall of the housing of the circuit breaker tester unit 6 is a multi-pin connector, which is connectable to a multiwire cable leading from a connected to the interface unit 4 and to receive voltage and current signals from the interface unit 4. The load voltage signal from the interface unit 4 is provided to a $V_{LOAD}$ module situated within the internal cavity of the housing of the circuit breaker tester unit 6. The $V_{LOAD}$ module measures the voltage at the output of a circuit breaker under no load, rated (100%) load and twice rated (200%) load, and provides corresponding signals to the PLC for further processing, computation, analysis and display on the HMI touch screen display.

There is also an $I_{LOAD}$ module situated within the internal cavity of the housing of the circuit breaker tester unit 6. The $I_{LOAD}$ module receives the $I_{LOAD}$ current sense signal from the 0 to 150 ampere current sensor in the interface unit 4 and carried on the multiwire cable connected between the interface unit 4 and the circuit breaker tester unit 6. The $I_{LOAD}$ module measures the $I_{LOAD}$ current sense signal when the tested circuit breaker is placed under no load, rated load and twice rated load, and provides corresponding signals to the PLC for further processing, computation, analysis and display on the HMI touch screen display.

There are also three female jacks mounted on a side wall of the circuit breaker tester unit 6. Each jack receives a banana plug connected to a light gauge test lead that extends to the power distribution panel 12 (the circuit breaker tester unit 6 is positioned to be close to the interface unit 4 and the power distribution panel 12).

With two phase, 240 VAC power lines provided to a home or office, there are usually two service line (hot) wires provided to the power distribution panel 12 and one neutral service wire provided to the power distribution panel 12. The two service line voltages are 120 VAC to neutral but 240 VAC to each other and 180° out of phase. The end of a first test lead from the circuit breaker tester unit 6 is securely connected to or removably clipped onto a terminal in the power distribution panel 12 that is connected to one of the incoming service line (hot) wires; the end of a second test lead is connected to or removably clipped onto a terminal in the power distribution panel 12 that is connected to the other service line (hot) wire; and the end of the third test lead is connected to or removably clipped onto the neutral bus bar within the power distribution panel 12, which bus bar is connected to the incoming service neutral wire.

The banana jacks are wired within the internal cavity of the housing of the circuit breaker tester unit 6 to not only a $V_{IN}$ module to determine the voltages on the service line (hot) wires (neutral is also provided to the $V_{IN}$ module) coming into the power distribution panel 12 to use as a reference voltage for comparison to voltages measured at the outputs of the circuit breakers and the AC outlets and receptacles in the home or commercial building, but also to a phase detector circuit so that the proper service voltage is chosen as a reference voltage that is providing power to the circuit breakers and AC outlets and is thus in phase with the measured voltages of these tested components. The $V_{IN}$ module measures the service line voltages, and provides corresponding signals to the PLC for further processing, computation, analysis and display of the service reference voltage on the HMI touch screen display.

The $V_{IN}$ module tests the resistance internal to the circuit breaker by comparing the service voltage feeding the breaker with the voltage on the output of the breaker. It is important to measure the internal resistance of the circuit breaker because it could overheat under load and cause a fire. For example, if the service voltage sensed by the $V_{IN}$ module is measured at 120 VAC, and the output voltage of the circuit breaker sensed by the $V_{LOAD}$ module under its rated load is measured to be 119.5 VAC, this 0.5 volt difference across the circuit breaker may be an acceptable voltage drop under rated load. However, a ten volt drop across the circuit breaker under rated load may be indicative of a malfunctioning circuit breaker which needs to be replaced.

An on/off power switch is also mounted on a side wall of the housing of the circuit breaker tester unit 6 to control power to the electronic circuitry of the unit. There is also a 120 VAC power cord receptacle mounted on a side wall of the housing, which is connectable to a power cord.

The power cord is connected to the output of a UPS (uninterruptable power supply) which provides power to the circuit breaker tester unit 6. The reason for preferably using a UPS to power the circuit breaker tester unit 6 is because, without the UPS, the circuit breaker tester unit 6 would be plugged into an AC outlet on which power will eventually be disconnected when the circuit breaker to which the outlet is wired is tested, causing a loss of power to the circuit breaker tester unit 6. The UPS will ensure that the circuit breaker tester unit 6 will always remain powered, without any loss of measured data or functionality.

The circuit breaker tester unit 6 also includes an AC-to-DC power converter within the internal cavity of the housing. The AC-to-DC power converter receives AC power provided to the circuit breaker tester unit 6 and generates one or more DC voltages to power the PLC and other electronic circuitry and testing modules of the circuit breaker tester unit 6.

Some circuit breakers may have ground fault circuit interrupter (GFCI) protection, and such GFCI-protected circuit breakers may be tested by the circuit breaker tester unit 6. For this purpose, the circuit breaker tester unit 6 includes a GFCI current leak module. The GFCI current leak module is provided with the line (hot) voltage signal from the interface unit 4 on the multiwire cable connected between the interface unit 4 and the circuit breaker tester unit 6, and is also provided with a voltage signal provided on a jumper wire from the multi-pin connector that is connected to the ground wire from the interface unit 4 on the same multiwire cable. The ground jumper wire is inductively coupled to a toroidal current sensor, which is preferably capable of sensing small currents in the range of 0 amperes to about 0.01 amperes (10 milliamperes). More specifically, the ground jumper wire within the internal cavity of the housing of the circuit breaker tester unit 6 that passes through the center hole of the toroidal current sensor therein is preferably 30 gauge wire wrapped ten times about the toroid's ring core since it carries a maximum ground current of about 10 milliamperes. The current sensor is electrically coupled to the PLC and provides a ground current sense signal, which is proportional to the current flowing on the ground jumper wire, to the PLC which is used when testing a GFCI-protected circuit breaker. The GFCI current module is also electrically connected to the PLC, and provides signals representative of the voltages on the line (hot) test probe connected to the output of the GFCI-protected circuit breaker, as well as the voltage on the ground jumper wire.

The GFCI current leakage module includes six reed relays that switch the voltage on the line jumper connected to the module sequentially or in combination through a plurality of binary-weighted resistors, from about 25K ohms to about 800K ohms, essentially defining a six bit digital-to-analog converter controlled by the PLC that provides 0 milliamperes to ten milliamperes AC from line to ground within the module. This current range is selected because the trip current for a GFCI-protected circuit breaker should be at mid-range, that is, about five milliamperes of current from line to ground. The GFCI current leakage module can preferably provide one half second steps of increasing load current by 64 steps. The circuit breaker usually trips after about 10-20 seconds, such that a full 10 milliampere test takes about 30 seconds.

The HMI touch screen display displays a graphical display of current versus time and also numerical readouts of time and current relating to a GFCI breaker test. When the GFCI-protected circuit breaker under test trips, the graphical display of the ramp current over time goes to zero, and the numerical displays freeze with the last displayed current (i.e., the trip current) and the elapsed time to trip until the displayed values are reset by the user.

Figure 7:
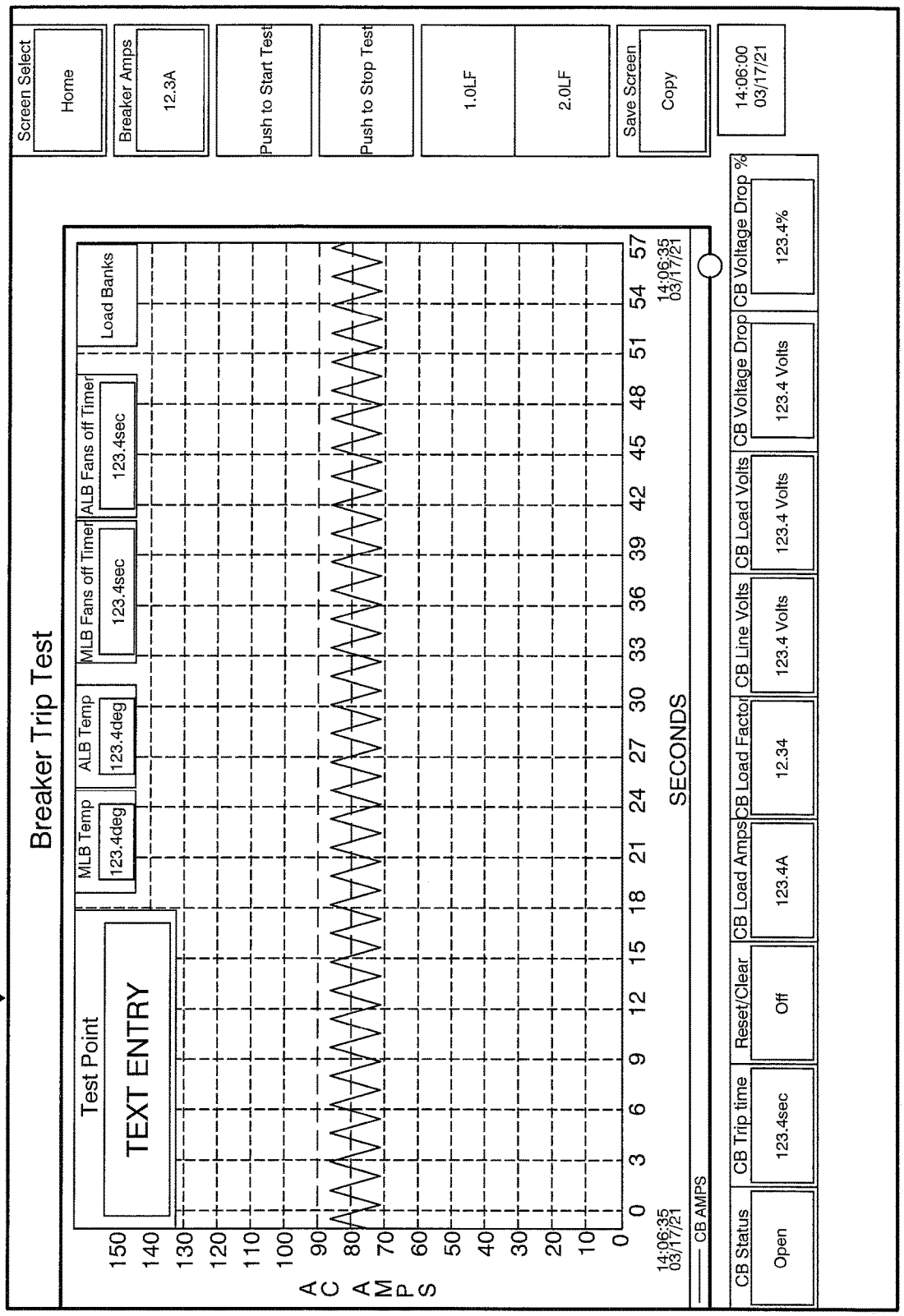
FIG. 7 is a diagrammatic illustration of a display forming part of the circuit breaker tester unit of the system of the present invention, and illustrating examples of various test measurements performed by the system of the present invention and displayed by the circuit breaker tester unit on the display thereof.
Figure 8:
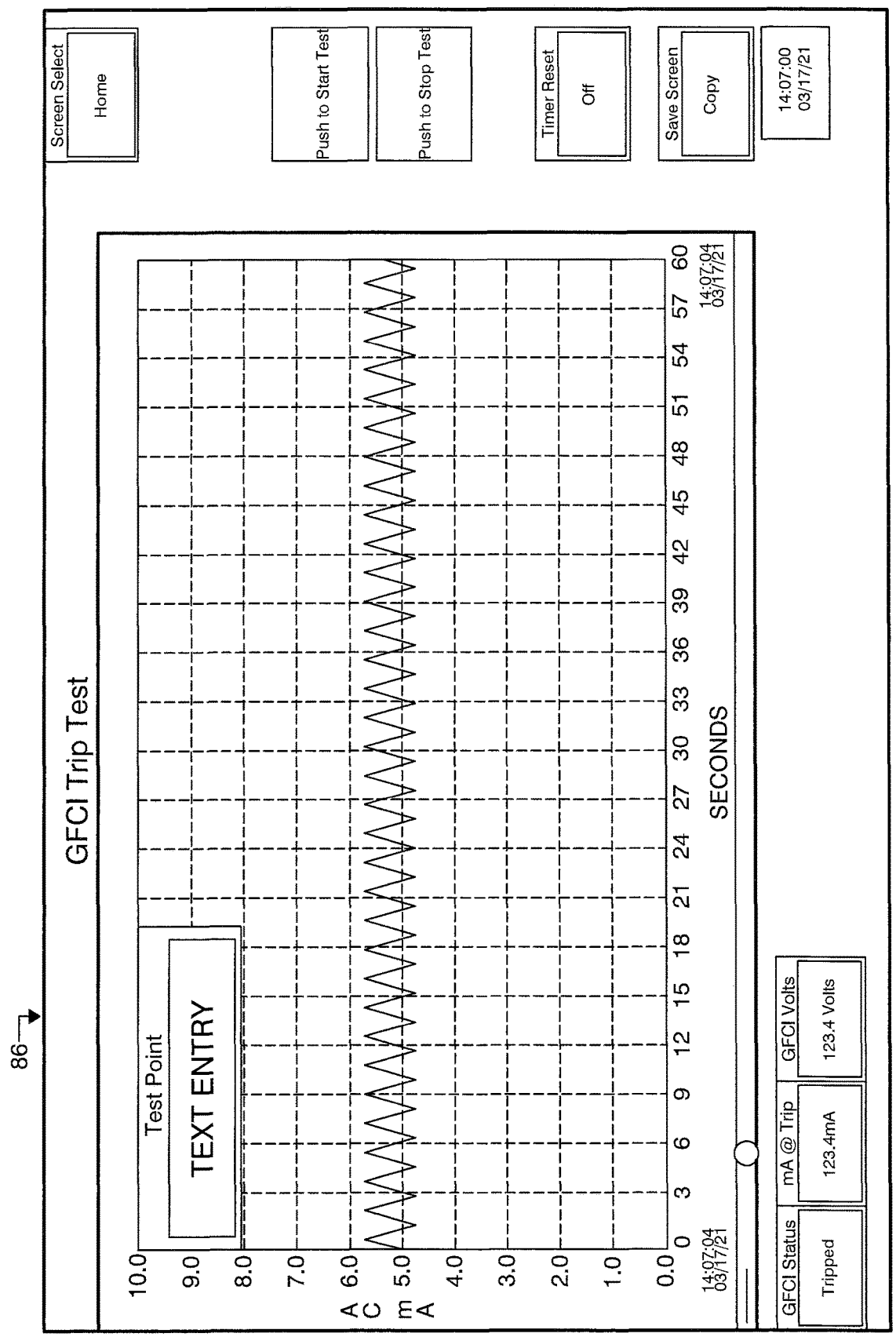
FIG. 8 is another diagrammatic illustration of a display forming part of the circuit breaker tester unit of the system of the present invention, and illustrating examples of various test measurements performed by the system of the present invention and displayed by the circuit breaker tester unit on the display thereof when testing GFCI-protected circuit breakers.

The HMI touch screen display displays analog and/or digital readouts of the voltage and current measurements. Preferably, the service voltage sensed by the $V_{IN}$ module and used as a reference voltage, the voltage on the output of the circuit breaker sensed by the $V_{LOAD}$ module under no load, rated load and twice rated load conditions, and the current flowing through the circuit breaker, sensed by the current sensor in the interface unit 4 and measured by the $I_{LOAD}$ module in the circuit breaker tester unit 6, are simultaneously displayed by the PLC on the HMI touch screen display of the circuit breaker tester unit 6. The ground fault test current detected by the GFCI current leak module is also displayed by the PLC on the HMI touch screen display 6. Furthermore, there are four thermal sensors in the Load Bank 8 that are displayed on the HMI touch screen display as analog needle displays (the analog temperature displays are preferably about 2 inch square boxes or graphs displayed on the HMI touch screen display). Examples of the measurements that are shown on the display are illustrated by FIGS. 7 and 8 of the drawings.

There is a data link shown in the FIG. 1 block diagram of the circuit breaker tester unit 6. This refers to a unidirectional RF data link, or transmitter, which is connected to the antenna located in the internal cavity of the housing of the circuit breaker tester unit 6. This data link includes an analog-to-digital converter which receives an output signal from the $V_{IN}$ module corresponding to the service reference voltage, digitizes the signal and transmits an RF signal corresponding to the digitized service reference voltage signal to the outlet tester unit 10. As will be explained in greater detail, the outlet tester unit 10 also includes a data link basically having an RF receiver which receives the RF signal transmitted by the circuit breaker tester unit 6, and decodes the RF signal and provides the decoded signal to a controller in the outlet tester unit 10 which displays on an LCD or other form of display the service reference voltage. As will be further explained in greater detail, the outlet tester unit 10, now having the service reference voltage, can compare the measured outlet voltage at an AC outlet with the service reference voltage to determine the voltage drop through the house or building wiring to the tested outlet and thereby determine whether the wiring and outlet voltage drop is within an expected and acceptable voltage range.

In a two phase, 240 VAC residence or building, it should be noted that some circuit breakers in the power distribution panel 12 may be connected to one 120 VAC service line (hot) wire, hereinafter referred to as "Service A", and accordingly the AC outlets on the same circuit as the circuit breaker receiving the Service A voltage, whereas other circuit breakers in the power distribution panel 12 may be connected to the other 120 VAC service line (hot) wire coming into the panel 12, hereinafter referred to as "Service B", and accordingly the AC outlets on the same circuit as these latter circuit breakers will receive the Service B voltage. The Service A voltage is 180° out of phase with the Service B voltage. Therefore, when the outlet tester unit 10 performs tests on the AC outlets located throughout the entire premises, it is important to compare the voltage measured at the outlets with the proper service voltage (Service A or Service B) to which the outlet is connected. Accordingly, in one form of the system of the present invention, the data link in the circuit breaker tester unit 6 may be a two-way data link, i.e., a transceiver, for transmitting data over an RF link to the outlet tester unit 10 and for receiving data over the same or different RF link from the outlet tester unit 10. Similarly, the data link in the outlet tester unit 10 may be a two-way data link, i.e., a transceiver, for receiving data over an RF link transmitted by the circuit breaker tester unit 6 and for transmitting data from the outlet tester unit 10 to the circuit breaker tester unit 6 over the same or a different RF link to the circuit breaker tester unit 6.

More specifically, the outlet tester unit 10 may include a phase detector circuit which determines the phase of the voltage measured on the AC outlet under test. The phase detector circuit provides a phase signal to the controller in the outlet tester unit 10, which digitizes the phase signal and provides a digitized phase signal to the data link of the outlet tester unit 10. An RF signal, representative of the digitized phase signal, is transmitted by the data link and an associated antenna in the outlet tester unit 10 connected thereto to the circuit breaker tester unit 6 located remotely from the outlet tester unit 10. The RF phase signal transmitted by the outlet tester unit 10 and received by the circuit breaker tester unit 6 is decoded, and the outlet voltage phase information is provided to the PLC of the circuit breaker tester unit 6.

The PLC of the circuit breaker tester unit 6 also receives the phase information of the Service A voltage and the Service B voltage from the phase detector circuit in the circuit breaker tester unit 6, and compares the phase information of the AC voltage at the outlet under test with the phases of the Service A voltage and the Service B voltage to determine which service line (hot) the outlet under test is connected to by having matching phases (not 180° out of phase). By determining the service line (Service A or Service B) that has the same phase as the phase of the AC voltage measured at the outlet under test, the PLC in the circuit breaker tester unit 6 will cause the data link therein to transmit the proper service reference voltage (either Service A or Service B) to the outlet tester unit 10 so that the outlet tester unit 10 may compare the correct service reference voltage with the measured outlet voltage to determine the voltage drop through the wiring connected to the AC outlet.

A side wall of the housing of the circuit breaker tester unit 6 also has mounted thereon a CAT 6 data Ethernet connector, which is connected to the PLC. An Ethernet cable is attached to this connector and extends to the Load Bank 8. Relay control signals sent from the PLC of the circuit breaker tester unit 6 over the Ethernet cable to the Load Bank 8 are used to control the operation of a plurality of relays in the Load Bank 8 to selectively switch in various resistive or inductive loads to the circuit breaker under test by the Load Bank 8, as will be described in greater detail. Furthermore, thermal data signals from the Load Bank 8 are sent over this Ethernet cable to the PLC in the circuit breaker tester unit 6 for display on the HMI touch screen display so that either the user monitoring the display or the PLC automatically in the circuit breaker tester unit 6 can determine the thermal conditions within the Load Bank 8 and abort a load test if the Load Bank 8 overheats.

The circuit breaker tester unit 6 also includes a fan mounted on a side wall of the housing to draw cooling air into or out of the internal cavity of the housing. The cooling fan is powered by the UPS to which the circuit breaker tester unit 6 is connected so that the fan will remain energized even if power is interrupted to the AC outlet to which the UPS and, indirectly, the circuit breaker tester unit 6 are connected during a circuit breaker test.

One form of a phase detector circuit used in the circuit breaker tester unit 6 will now be described, and reference in this regard should be had to the schematic diagram of this circuit shown in FIGS. 9A and 9B of the drawings.

As mentioned previously, it is important that the outlet tester unit 10 receives signals over the data link corresponding to the correct service reference voltage from the circuit breaker tester unit 6, as an AC outlet being tested may be connected to the Service A voltage coming into the power distribution panel 12, or the Service B voltage, for a two phase, 240 VAC service provided to the premises, or even a Service C voltage, for a three phase, 240 VAC service. In one form of the system 2 of the present invention, the Service A voltage is detected by the circuit breaker tester unit 6 and used as the reference voltage as a comparison for tests performed on the circuit breakers in the power distribution panel 12 by the circuit breaker tester unit 6 but also used for comparison by the remotely located outlet tester unit 10 when the unit 10 is performing tests on the AC outlets within the premises. However, and as mentioned previously, the AC outlets under test may not always be connected to the Service A wire provided to the distribution panel 12 from the power company and, in fact, may be powered by the Service B voltage or even the Service C voltage provided to the premises. There may be differences in the voltages on the incoming Service A cable, the Service B cable and the Service C cable, and these differences in voltages may affect the voltage measurements taken at each AC outlet in the premises by the outlet tester unit 10. Also, the circuit breaker tester unit 6 tests each circuit breaker in the panel 12, and some circuit breakers may be connected to different incoming service cables in the power distribution panel 12, that is, Service A or Service B in a two phase service, or Service A, Service B or Service C in a three phase service. Accordingly, it is preferred that the circuit breaker tester unit 6 include a phase detector circuit, as mentioned previously, so that the correct reference voltage is selected by the circuit breaker tester unit 6 for use in measurements conducted on the circuit breakers and to transmit to the outlet tester unit 10 for measurements conducted on AC outlets distributed throughout the premises.

Figure 9A:
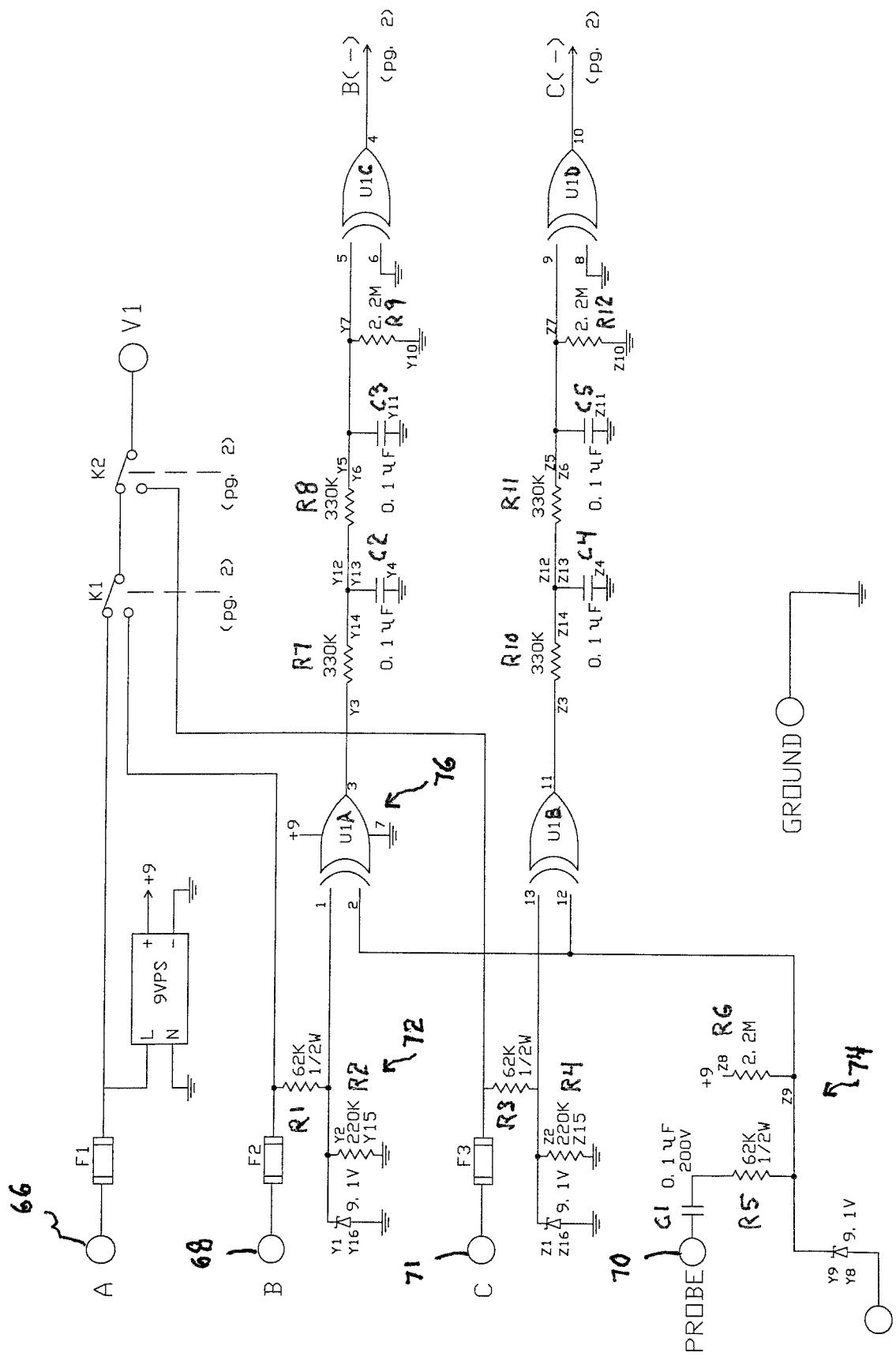
FIG. 9A is a first portion of a schematic diagram of a phase detector circuit used in the circuit breaker tester unit which forms part of the system of the present invention.
Figure 9B:
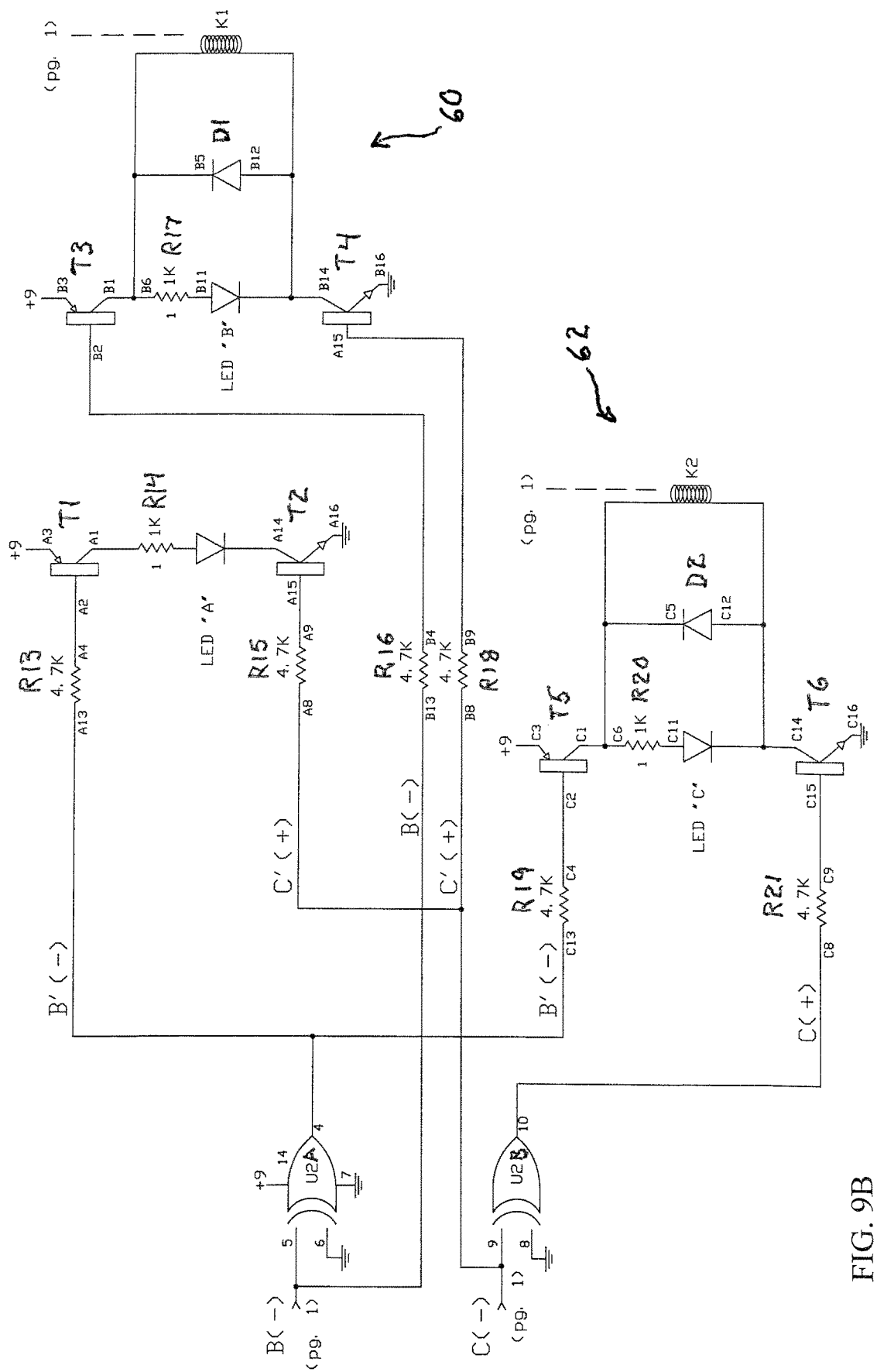
FIG. 9B is a second portion of a schematic diagram of a phase detector circuit used in the circuit breaker tester unit which forms part of the system of the present invention.

As can be seen from the schematic circuit diagram of FIGS. 9A and 9B, the voltages on the Service A and Service B wires provided to the power distribution panel 12 for a two phase, 240 VAC service, or the Service A, Service B and Service C wires coming into the power distribution panel 12 for a three phase, 240 VAC service, are provided to inputs A, B and C of the phase detector circuit. The Service A, Service B and Service C voltages may be provided to inputs A, B and C, respectively, by probes or leads that clip on or are secured to the line (hot) bus bars or terminals to which the service wires are connected. Also, the probe or lead which is selectively electrically connected to the outlet of each circuit breaker within the distribution panel 12 is connected to the "PROBE" input of the phase detector circuit. Furthermore, a wire connected to the neutral bus bar within the power distribution panel 12 is connected to the "NEUTRAL" input of the phase detector circuit. The Service A, Service B, Service C, probe and neutral wires are light gauge, as they carry relatively low current to the phase detector circuit.

The phase detector circuit includes fuses F1, F2 and F3 coupled to the Service A, Service B and Service C inputs, respectively. The Service A voltage through fuse F1 is provided to a power converter which provides 9 VDC for powering the digital and analog circuits of the phase detector circuit. The neutral input provided on the phase detector circuit is used as a ground for the various electrical components in the circuit.

The voltage on the Service B input, after the fuse F2, is provided to a clipping circuit which includes a voltage divider formed by the series interconnection of resistor R1 and resistor R2, the other end of which is connected to ground, and a 9.1 volt Zener diode connected in parallel across resistor R2, thereby generating a 9 volt square wave substantially in phase with the Service B voltage.

Similarly, for a three phase, 240 VAC service provided to the power distribution panel, the voltage on the Service C input of the phase detector circuit, after passing through fuse F3, is provided to a clipping circuit consisting of resistors R3 and R4 connected in series, with the other end of resistor R4 connected to ground, and a 9.1 volt Zener diode connected in parallel across resistor R4. This second clipping circuit generates a 9 volt square wave which is in phase with the Service C voltage.

The square wave generated for the Service C voltage is provided to one input of an exclusive OR gate U1A, forming part of a quad, two input exclusive OR gate CMOS integrated circuit preferably having Part No. CD 4070 manufactured by Texas Instruments Incorporated of Dallas, Texas or other secondary manufacturers. Similarly, the square wave generated by the clipping circuit for the Service C voltage is provided to one input of a second exclusive OR gate U1B.

The voltage on the probe input, which is connected to the output of a circuit breaker under test, is also provided to a clipping circuit through a capacitor C1 and to a voltage divider circuit consisting of resistor R5 and resistor R6 connected in series, the interconnection point being coupled to the cathode of a 9.1 volt Zener diode, whose anode is connected to the neutral input (which is acting as ground), to provide a 9 volt square wave having the same phase as the output voltage on the circuit breaker under test. Resistor R2 in the first clipping circuit for the Service B voltage and resister R4 in the second clipping circuit for the Service C voltage are connected to ground. However, resister R6 in the third clipping circuit for the probe voltage is connected to 9 volts DC to provide a DC bias to the 9 volt square wave generated by the third clipping circuit. This DC biased square wave is provided to the other inputs of exclusive OR gates U1A and U1B.

Exclusive OR gates U1A and U1B act as a phase detector. That is, if the voltage on the Service B input is in phase with the voltage on the probe input, then the output of the exclusive OR gate U1A will be a logic high ("1"). Similarly, if the voltage on the Service C input is in phase with the voltage on the probe input, then the output of the exclusive OR gate U1B will be a logic high ("1").

The output of the exclusive OR gate U1A is provided to a two tier low pass filter consisting of the series connection of resistor R7 and capacitor C2 to ground, connected in series (the first low pass filter stage) and to the series connection of resistor R8 and capacitor C3 to ground (the second stage of the low pass filter), and then to one input of a third exclusive OR gate U1C, which input is connected to one end of a resistor R9 to ground. Similarly, the output of exclusive OR gate U1B is provided to a two tier low pass filter consisting of the series connection of resistor R10 and capacitor C4 to ground (acting as the first stage of the low pass filter) and resistor R11 connected in series with capacitor C5 to ground (the second stage of the low pass filter), the series connection of resistor R11 and capacitor C5 being connected to one input of a fourth exclusive OR gate U1D, the first input also being connected to resistor R12 to ground. The second input of each of exclusive OR gate U1C and exclusive OR gate U1D is connected to ground. Exclusive OR gates U1C and U1D act as threshold comparators for the low pass filtered logic signals on the outputs of exclusive OR gates U1A and U1B, respectively. The outputs of the exclusive OR gates U1C and U1D are respectively provided to the first input of exclusive OR gate U2A and the first input of exclusive OR gate U2B, respectively. The second inputs of exclusive OR gates U2A and U2B are connected to ground. The two-input exclusive OR gates U2A and U2B of a quad gate integrated circuit, such as Part No. CD 4070, act as inverters to control analog circuits which selectively illuminate LEDs that indicate which service voltage is selected by the phase detector circuit as the reference voltage, as will be described in greater detail. Similarly, the outputs of the exclusive OR gates U1C and U1D drive relay switching circuits which selectively control the energization of relays K1 and K2 so that the proper voltage on Service A, Service B or Service C is selected as the reference voltage and provided to the $V_{IN}$ module in the circuit breaker tester unit 6, as will also be described in greater detail.

More specifically, the output of exclusive OR gate U2A is connected to one end of a base resistor R13, whose other end is connected to the base of PNP transistor T1. The emitter of transistor T1 is connected to the 9 volt DC supply from the power supply, and its collector is connected to one end of collector resistor R14, whose other end is connected to the anode of light emitting diode LED A, whose cathode is connected to the collector of an NPN transistor T2. The emitter of transistor T2 is connected to ground. The output of exclusive OR gate U1D is connected to one end of base resistor R15, whose other end is connected to the base of transistor T2.

The output of exclusive OR gate U1C is connected to one end of base resistor R16, whose other end is connected to the base of PNP transistor T3. The emitter of transistor T3 is connected to the 9 volt DC power from the power supply. The collector of transistor T3 is connected to one end of resistor R17, the cathode of flyback diode D1 and one end of the coil of relay K1. The other end of resistor R17 is connected to the anode of a light emitting diode LED B, whose cathode is connected to the collector of NPN transistor T4. The anode of flyback diode D1 and also the other end of the coil of the relay K1 is connected to the collector of transistor T4. The emitter of transistor T4 is connected to ground. The output of exclusive OR gate U1D is connected to one end of base resistor R18, whose other end is connected to the base of transistor T4.

The output of exclusive OR gate U2A is connected to one end of base resistor R19, whose other end is connected to the base of PNP transistor T5. The emitter of transistor T5 is connected to 9 volts DC from the power supply. The collector of transistor T5 is connected to one end of resistor R20, the cathode of flyback diode D2 and one end of the coil of relay K2. The other end of resistor R20 is connected to the anode of a light emitting diode LED C, whose cathode is connected to the collector of NPN transistor T6. The anode of flyback diode D2 as well as the other end of the coil of relay K2 are connected to the collector of transistor T6. The emitter of transistor T6 is connected to ground. The output of exclusive OR gate U2B is connected to one end of base resistor R21, whose other end is connected to the base of transistor T6.

The phase detector circuit of the circuit breaker tester unit 6 operates in the following manner. If the voltage on the Service B input of the phase detector circuit is in phase with the voltage on the probe input, the output of exclusive OR gate U1A will go to a logic high level. The output signal of exclusive OR gate U1A is filtered and provided to the exclusive OR gate U1C which acts as a threshold comparator and whose output will go to a logic low level. If the Service B voltage is in phase with the probe voltage, then the Service C voltage will be out of phase with the probe voltage, and the output of exclusive OR gate U1B will go to a logic low, which means that the output of exclusive OR gate U1D, which acts as a threshold comparator, will go to a logic high.

The logic low on the output of exclusive OR gate U1C will bias transistor T3 on. The low logic level on the output of exclusive OR gate U1C is inverted by exclusive OR gate U2A, whose output will be at a logic high which, in turn, will cause transistor T1 to cut off (i.e., be non-conductive). The high logic level on the output of exclusive OR gate U2A will also cause transistor T5 to be in a cut off state.

The high logic level on the output of exclusive OR gate U1D will cause transistor T2 to conduct and will also cause transistor T4 to conduct. The high logic level on exclusive OR gate U1D is inverted by exclusive OR gate U2B, whose output goes to a low logic level. This low logic level will cause transistor T6 to be in a cut off or non-conducting state.

Thus, when the voltage on Service B is in phase with the probe voltage on the output of the circuit breaker under test, the phase detector circuit will cause transistor T1 to be cut off even though transistor T2 is conductive, thus preventing the indicator LED A from illuminating, as no current passes therethrough. At the same time, the logic high on the base of transistor T5 causes transistor T5 to be in a cut off state even though transistor T6 is forward biased and conductive. Transistor T5, in the cut off state, prevents any current from flowing through not only indicator LED C, thereby preventing the indicator from illuminating, but also any current flowing through the coil of relay K2. Thus, relay K2 remains de-energized.

However, under the same conditions, transistor T3 is biased on and transistor T4 is also biased on so that the indicator LED B is forward biased to illuminate and current can pass through the coil of relay K1, energizing the relay. The flyback diode D1 connected in reverse polarity and in parallel with the coil of relay K1 will dissipate any back EMF in the coil when relay K1 is de-energized.

As can be seen from FIGS. 9A and 9B of the drawings, each of relays K1 and K2 are configured as single pole, double throw relays. The normally open (NO) contact of relay K1 is connected to the Service B input of the phase detector circuit through fuse F2. The normally closed (NC) contact of relay K1 is connected to the Service A input through fuse F1. The common contact of relay K1 is provided to the normally closed (NC) contact of relay K2, and the normally open (NO) contact of relay K2 is connected to the Service C input through fuse F3. The common contact of relay K2 is connected to the voltage input of the voltage sensing module $V_{IN}$.

Thus, when the Service B voltage is in phase with the probe voltage on the output of the circuit breaker under test, relay K1 will be energized and relay K2 will be de-energized, which will allow the Service B voltage to pass through the NO contact and common contact of relay K1 and the NC contact and common contact of relay K2 and to be provided to the voltage sensing module $V_{IN}$. Furthermore, the indicator LED B will illuminate to indicate to the user that the Service B voltage is being used as the reference voltage.

If the Service C voltage is in phase with the probe voltage on the output of the circuit breaker under test, and the Service B voltage is out of phase with the probe voltage, then the output of exclusive OR gate U1A will be at a logic low and the output of exclusive OR gate U1B will be at a logic high. The output of exclusive OR gate U1C, acting as a threshold comparator, will go to a high logic level, and the output of exclusive OR gate U1D, also acting as a threshold comparator, will go to a low logic level. Accordingly, the output of exclusive OR gate U2A, which acts an inverter, will go to a low logic level, whereas the output of exclusive OR gate U2B, which also acts as an inverter, will go to a high logic level. As explained previously, these logic levels presented to the analog circuits which control the illumination of the light emitting diodes and the energization of the relays K1 and K2 will cause transistor T1 to be biased on (conductive) and transistor T2 to be biased off (non-conductive) so that indicator LED A will not illuminate. Furthermore, these particular logic levels will cause transistor T3 to be biased off (non-conductive) and transistor T4 to also be biased off (non-conductive), thus preventing indicator LED B from illuminating and preventing current from flowing through the coil of relay K1 so that relay K1 is de-energized. Furthermore, these particular logic levels on the outputs of the exclusive OR gates U1C, U1D, U2A and U2B will cause transistor T5 to be biased on (conductive) and transistor T6 to be biased on (conductive). With transistors T5 and T6 in a conductive state, the indicator LED C will be forward biased and will illuminate to indicate that the Service C voltage is being used as the reference voltage, and current will flow through the coil of relay K2, energizing the relay.

Thus, when the voltage on the Service C input of the phase detector circuit is in phase with the voltage on the probe input connected to the output of a circuit breaker under test, relay K1 will be de-energized, but relay K2 will be energized so that the NO contact on the relay K2 will be connected to the Service C voltage through fuse F3 and will be provided to the voltage sensing module $V_{IN}$ and used as the reference voltage for test measurements conducted by the circuit breaker tester unit 6 and, preferably, by the outlet tester unit 10.

If, however, neither the Service B voltage nor the Service C voltage is in phase with the probe voltage on the output of the circuit breaker under test, then the outputs of the exclusive OR gates U1A and U1B will be at a low logic level, and the outputs of exclusive OR gates U1C and U1D, which act as threshold comparators, will be at a high logic level. Accordingly, the outputs of exclusive OR gates U2A and U2B, which act as inverters, will be at a low logic level. The aforementioned logic levels on the outputs of exclusive OR gates U1C, U1D, U2A and U2B will cause transistor T1 to be biased on (conductive) and transistor T2 to be biased on (conductive). Also, transistor T3 will be biased off (non-conductive) and transistor T4 will be biased on (conductive). Furthermore, transistor T5 will be biased on (conductive), but transistor T6 will be biased off (non-conductive). Thus, no current is permitted to flow through indicator LED B, so that it does not illuminate, and through the coil of relay K1 so that relay K1 is de-energized. Also, no current is permitted to flow through indicator LED C, so that indicator LED C will not illuminate, nor will current flow through the coil of relay K2 such that relay K2 is de-energized. However, transistor T1 will be biased on (conductive) and transistor T2 will be biased on (conductive), so that LED A will be forward biased and will illuminate, which indicates to the user that the Service A voltage will be used as the reference voltage.

Since relay K1 and relay K2 are both de-energized, the Service A voltage will pass through fuse F1, the NC contact and common contact of relay K1 and the NC contact and common contact of relay K2 and will be provided to the input of the voltage sensing module $V_{IN}$ for measurement. Thus, the Service A voltage will be used as the reference voltage for the test measurements performed by the circuit breaker tester unit 6 and, preferably, the outlet tester unit 10.

As mentioned previously, in one form of the present invention, the outlet tester unit 10 will always receive as the reference voltage the voltage on the Service A cable coming into the power distribution panel 12, and this information is transmitted over the data link from the circuit breaker tester unit 6 to the outlet tester unit 10. However, in another form of the present invention, the outlet tester unit 10 may include a phase detector module which senses the phase of the voltage on the AC outlet and compares it to the phase of the reference voltage signal transmitted by the circuit breaker tester unit 6 over the RF link. If the phase of the voltage on the AC outlet matches the phase of the reference voltage signal from the circuit breaker tester unit 6, then the outlet tester unit 10 will use the reference voltage in measurements conducted on the AC outlet voltage. If, however, there is a phase mismatch between the reference voltage signal from the circuit breaker tester unit 6 and the voltage on the AC outlet, then such may indicate that the particular AC outlet under test is electrically connected to a different service voltage, such as Service B for a two-phase service or Service C for a three-phase service. The outlet tester unit 10 may in one embodiment transmit phase information concerning the voltage on the AC outlet under test to the circuit breaker tester unit 6 so that the circuit breaker tester unit may do a phase comparison of the AC outlet voltage and the Service A, Service B and Service C voltages, and re-transmit the proper service voltage as a reference voltage to the outlet tester unit 10, or the outlet tester unit 10 may transmit a signal to the circuit breaker tester unit 6 that the phase comparison the outlet tester unit 10 conducted does not match and signal the circuit breaker tester unit 6 to send a different service voltage as a reference voltage to the outlet tester unit 10.

The Load Bank section 8 of the test system 2 of the present invention will now be described. The Load Bank 8 is shown in FIGS. 10A-18 of the drawings. As can be seen from FIGS. 10A-18 of the drawings, the Load Bank 8 of the system 2 of the present invention preferably includes two separate units, that is, a main Load Bank unit 8a and an auxiliary Load Bank unit 8b. The main Load Bank unit 8a is connected to the auxiliary Load Bank unit 8b by interconnecting heavy gauge line (hot, black), neutral (white) and ground (green) cables which carry the line and neutral voltages, and a multiwire cable for carrying data and control signals between the main Load Bank unit 8a and the auxiliary Load Bank unit 8b.

Figures 10A, 10B:
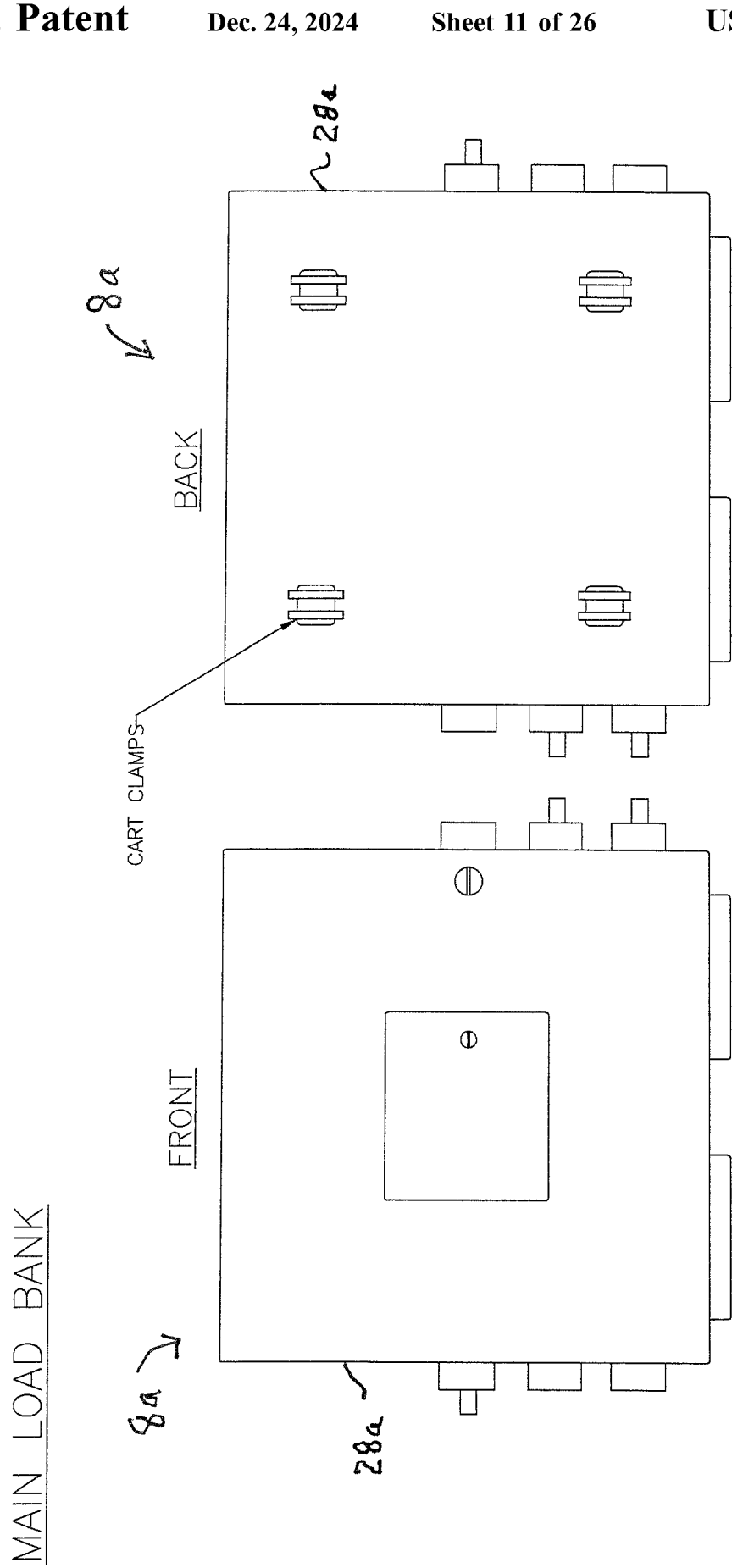
FIG. 10A is a front view of the main Load Bank unit which forms part of the system of the present invention.
FIG. 10B is a rear view of the main Load Bank unit which forms part of the system of the present invention.
Figure 12B:
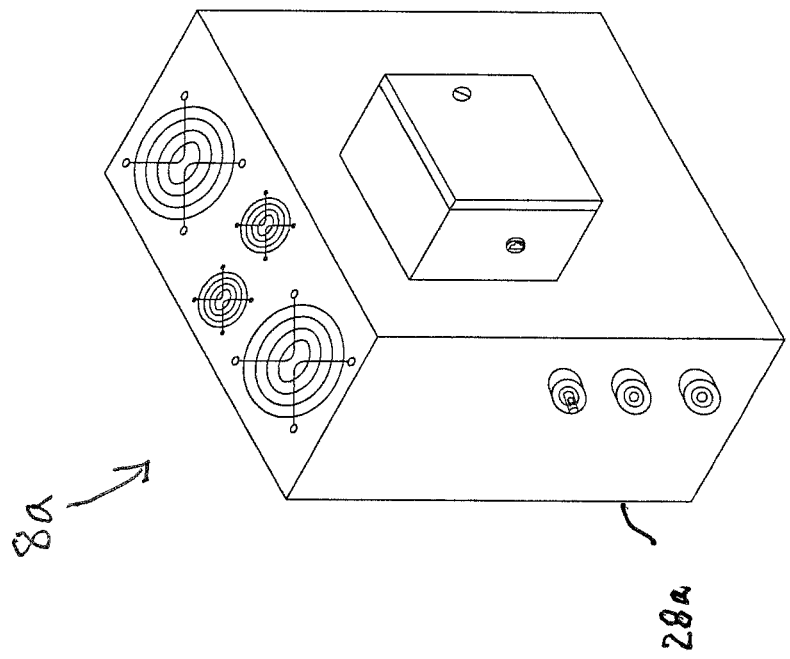
FIG. 12B is a left isometric view of the main Load Bank unit which forms part of the system of the present invention.
Figure 12A:
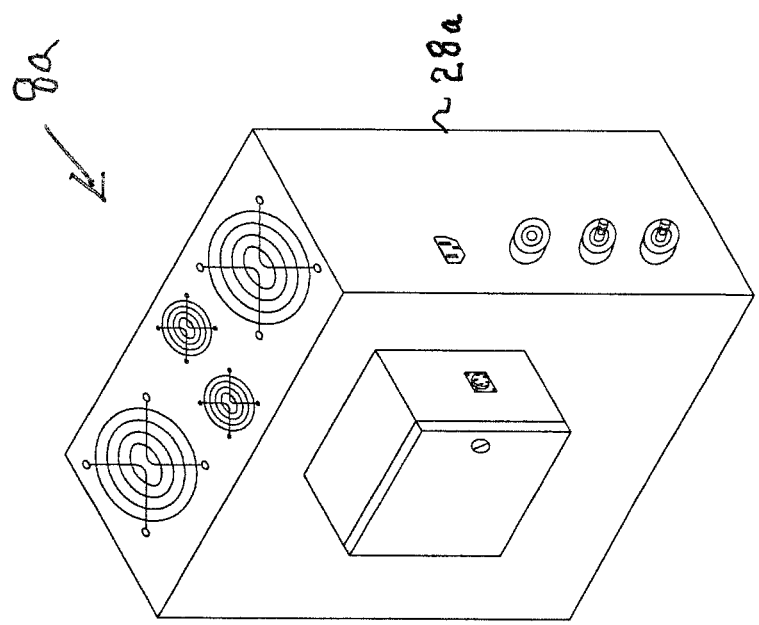
FIG. 12A is a right isometric view of the main Load Bank unit which forms part of the system of the present invention.
Figures 13A, 13B:
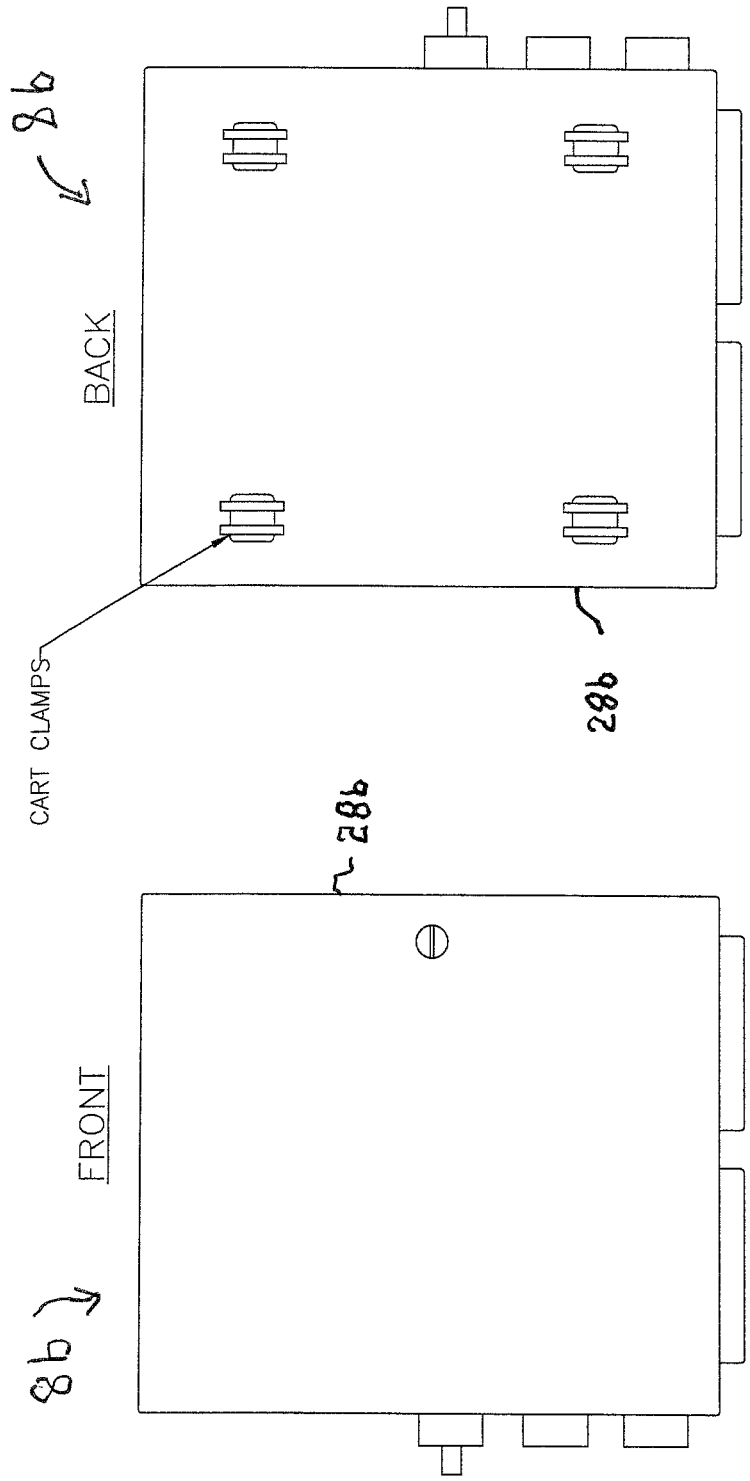
FIG. 13A is a front view of the auxiliary Load Bank unit which forms part of the system of the present invention.
FIG. 13B is a rear view of the auxiliary Load Bank unit which forms part of the system of the present invention.
Figure 13D:
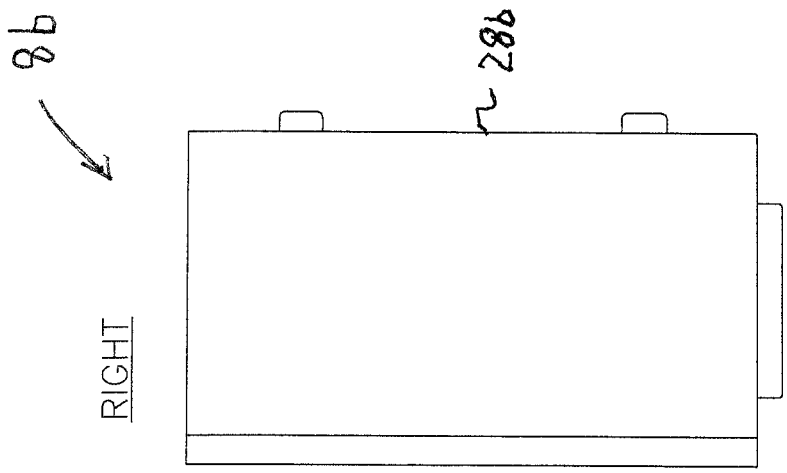
FIG. 13D is a right elevational view of the auxiliary Load Bank unit which forms part of the system of the present invention.
Figure 13C:
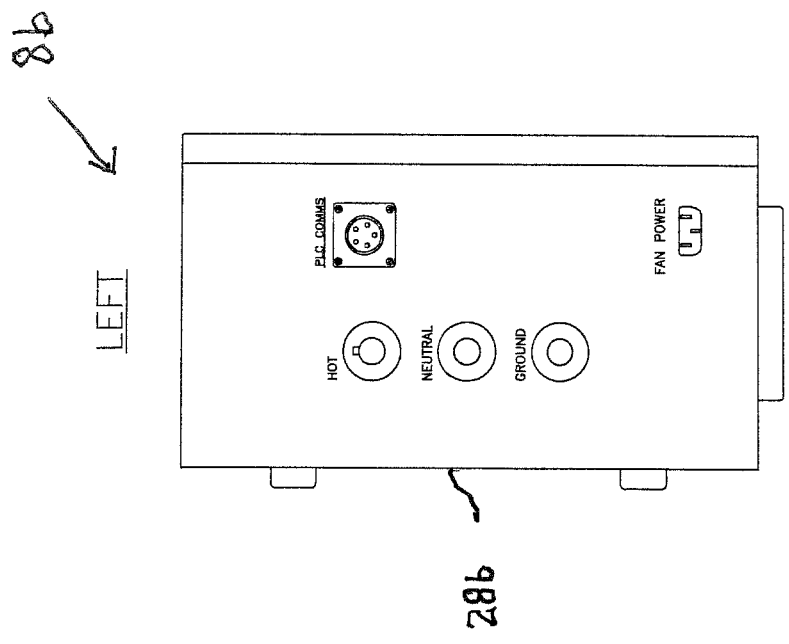
FIG. 13C is a left elevational view of the auxiliary Load Bank unit which forms part of the system of the present invention.
Figure 14B:
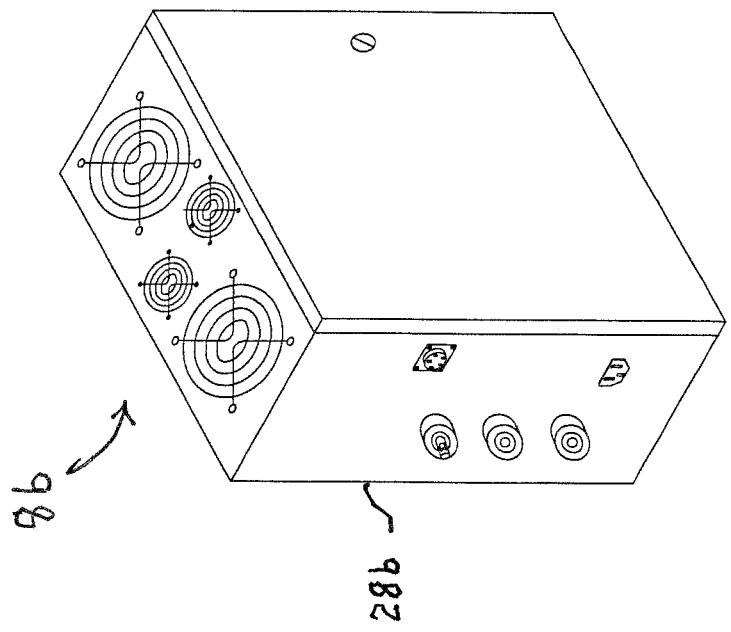
FIG. 14B is a left isometric view of the auxiliary Load Bank unit which forms part of the system of the present invention.
Figure 14A:
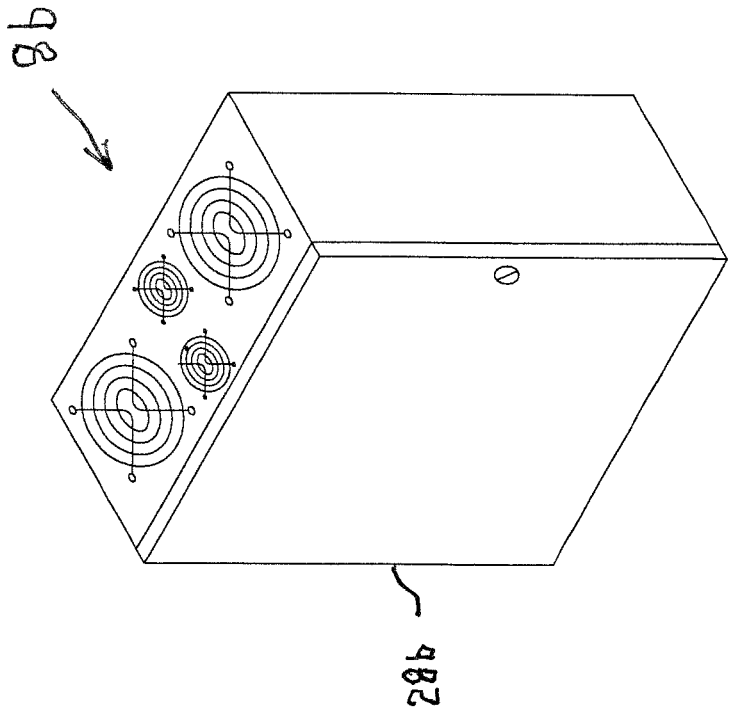
FIG. 14A is a right isometric view of the auxiliary Load Bank unit which forms part of the system of the present invention.

As can be seen from FIGS. 10B and 13B, since each of the main Load Bank unit 8a and the auxiliary Load Bank unit 8b weigh a significant amount with the electrical components they carry, and to facilitate the mobility of each unit, the main Load Bank unit 8a and the auxiliary Load Bank unit 8b are preferably mounted on separate hand trucks or wheeled dollies and include cart clamps on one side of the primary housing of each to help secure the main Load Bank unit 8a and the auxiliary Load Bank unit 8b to their respective hand truck or dolly.

Each of the main Load Bank unit 8a and the auxiliary Load Bank unit 8b includes a primary housing, also preferably in a rectangular parallelepiped form, each housing of which defines an internal cavity for receiving the electronic components required for placing selective loads on a circuit breaker in the power distribution panel 12 under test. More specifically, and with respect to the primary housing of the main Load Bank unit 8a, on one side wall thereof are mounted three connectors for connecting to the heavy gauge line (hot), neutral and ground wires extending from the interface unit. More specifically, the connector for the line (hot) extension wire is formed as a male plug connector which mates with a female connector mounted on the end of the heavy gauge line (hot, black) cable; a female connector for mating with a plug connector mounted on the end of the neutral (white) extension cable; and another female connector for mating with the plug connector mounted on the end of the heavy gauge ground extension cable. As described previously, the other ends of the extension cables are connectable to mating connectors mounted on the housing of the interface unit 4, and as also described previously, these extension cables may be a single cable or multiple cables connected in series to extend, if necessary, up to about 200 feet in length so that the main Load Bank unit 8a and the auxiliary Load Bank unit 8b may be positioned outside the premises where the tests are being performed on the circuit breakers in the power distribution panel 12, or such Load Bank units 8a, 8b may be mounted in a work van outside the premises where tests are being performed.

On another side wall of the primary housing of the main Load Bank unit 8a are mounted additional heavy gauge connectors for connecting the main Load Bank unit 8a to the auxiliary Load Bank unit 8b if the auxiliary Load Bank unit 8b is needed for testing the circuit breakers in the power distribution panel 12. A side wall of the primary housing for the auxiliary Load Bank unit 8b also includes heavy gauge connectors so that shorter, heavy gauge cables may be connected between the main Load Bank unit 8a and the auxiliary Load Bank unit 8b.

Even more specifically, another set of three connectors is mounted on a side wall of the primary housing of the main Load Bank unit 8a and includes a female connector for mating with a plug connector of a heavy gauge line (hot, black) jumper cable that extends to the auxiliary Load Bank unit 8b, a plug connector that mates with a female connector on the end of a heavy gauge neutral (white) jumper cable for connection to the auxiliary Load Bank unit 8b, and a plug connector for mating with a female connector on the end of a heavy gauge ground (green) jumper cable that extends to the auxiliary Load Bank unit 8b.

On a side wall of the primary housing of the auxiliary Load Bank unit 8b there are mounted three heavy gauge connectors for receiving the jumper cables between the main Load Bank unit 8a and the auxiliary Load Bank unit 8b. These include a plug connector for mating with a female connector on the end of the heavy gauge line (hot) jumper cable that extends between the main Load Bank unit 8a and the auxiliary Load Bank unit 8b, a female connector that mates with a plug connector on the end of the heavy gauge neutral (white) jumper cable that extends between the main Load Bank unit 8a and the auxiliary Load Bank unit 8b, and another female connector for mating with a plug connector on the end of the heavy gauge ground jumper cable that extends between the main Load Bank unit 8a and the auxiliary Load Bank unit 8b. The jumper cables between the main Load Bank unit 8a and the auxiliary Load Bank unit 8b effectively interconnect the two Load Bank units 8a, 8b together so that, if necessary, the auxiliary Load Bank unit 8b may be used to add additional loads placed on the circuit breaker in the power distribution panel 12 under test. If the auxiliary Load Bank unit 8b is not needed, then it may be unconnected to the main Load Bank unit 8a and not used.

Because of the heat that is generated within the internal cavities of the primary housings of the main Load Bank unit 8a and the auxiliary Load Bank unit 8b, each unit's primary housing has a fan or multiple fans which blow cooling air into the internal cavities of the primary housings. As shown in FIGS. 12A, 12B, 14A and 14B of the drawings, two fans, protected by grills, are mounted on one side wall of each of the primary housings of the main Load Bank unit 8a and the auxiliary Load Bank unit 8b, and on a side wall that is opposite to the side wall on which the fans are mounted, there are one or more exhaust ports, also protected by grills, to allow air forced into the primary housings to exhaust therethrough, carrying heat away from the internal components of each Load Bank unit 8a,8b.

The main Load Bank unit 8a may also include a smaller, secondary "dog house" housing mounted on a side wall of the primary housing of the main Load Bank unit 8a. This secondary housing also defines an internal cavity in which more sensitive electronics, including a controller or central processing unit, such as a programmable logic controller (PLC), is located. On one side wall of this secondary housing is mounted a multi-pin connector for connecting to the Ethernet cable that extends, also preferably up to about 200 feet, from the circuit breaker tester unit 6 and which carries control signals and other data between the circuit breaker tester unit 6 and the main Load Bank unit 8a. On an opposite side wall of this secondary housing of the main Load Bank unit 8a is mounted another multi-pin connector for connecting to a multi-pin connector mounted on a side wall of the primary housing of the auxiliary Load Bank unit 8b through another multiwire cable to carry data and control signals between the main Load Bank unit 8a and the auxiliary Load Bank unit 8b. There is also a fan protected by a grill that is mounted on one side wall of the secondary housing of the main Load Bank unit 8a, and on the opposite side wall thereof is an exhaust opening, also protected by a grill. The fan provides cooling air through the internal cavity defined by the secondary housing of the main Load Bank unit 8a to cool the electronic circuitry within the internal cavity defined by the secondary housing.

Reference should now be had to FIGS. 15-18 of the drawings, which illustrate the electronic components within the internal cavities defined by the housings of the main Load Bank unit 8a and the auxiliary Load Bank unit 8b. The main Load Bank unit 8a includes a PLC or other form of controller or central processing unit that is mounted in the internal cavity of the secondary housing. Preferably, the PLC used in the main Load Bank unit 8a is Part No. P1000 distributed by Automation Direct Inc. of Cummings, Georgia. The PLC includes outputs which control a plurality of relays K1-K10, and inputs which receive signals from thermal sensors within the internal cavity of the primary housing of the main Load Bank unit 8a and within the internal cavity defined by the primary housing of the auxiliary Load Bank unit 8b. The secondary housing of the main Load Bank unit 8a also includes a power supply, preferably an AC-to-DC converter, which converts 120 VAC coming into the secondary housing to a DC voltage which is used to power up the controller and other electronic circuitry within the main Load Bank unit 8a and the auxiliary Load Bank unit 8b. Each primary housing of the main Load Bank unit 8a and the auxiliary Load Bank unit 8b includes a 120 VAC receptacle for receiving the plug end of a power cord for supplying 120 volts to power the fans and electronic circuitry therewithin. However, it is preferred that the main Load Bank unit 8a and the auxiliary Load Bank unit 8b are powered from an uninterruptible power supply (UPS) to ensure that power to the various relays which control the selective switching in of loads, and the cooling fans and other electronic circuitry is not interrupted when the circuit of the AC outlet to which the Load Bank units 8a, 8b are indirectly connected (through the UPS) is disconnected when the related circuit breaker of the circuit is being tested.

Figure 15:
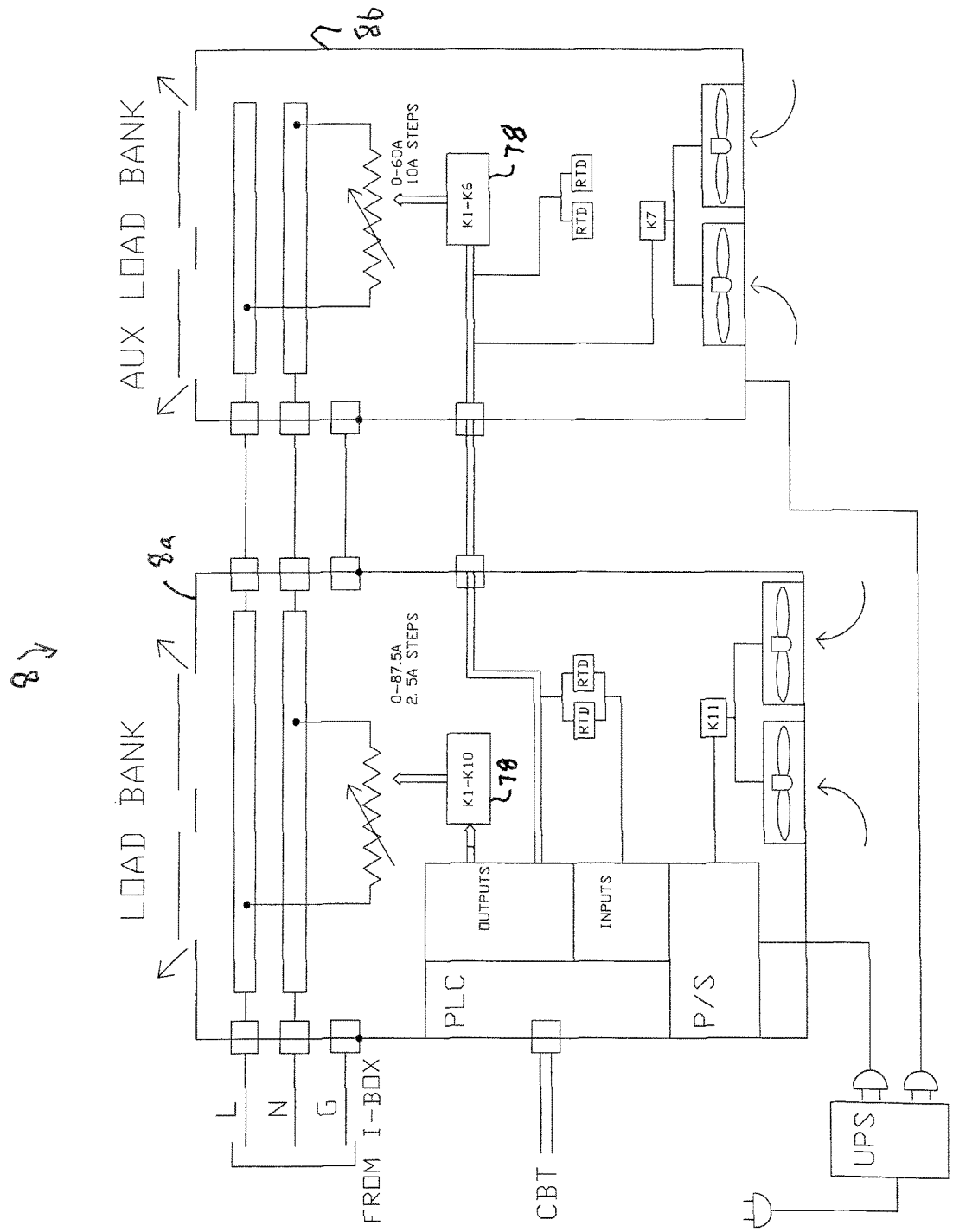
FIG. 15 is a block diagram of the electronic circuits of the main Load Bank unit and the auxiliary Load Bank unit which form part of the system of the present invention.
Figure 16:
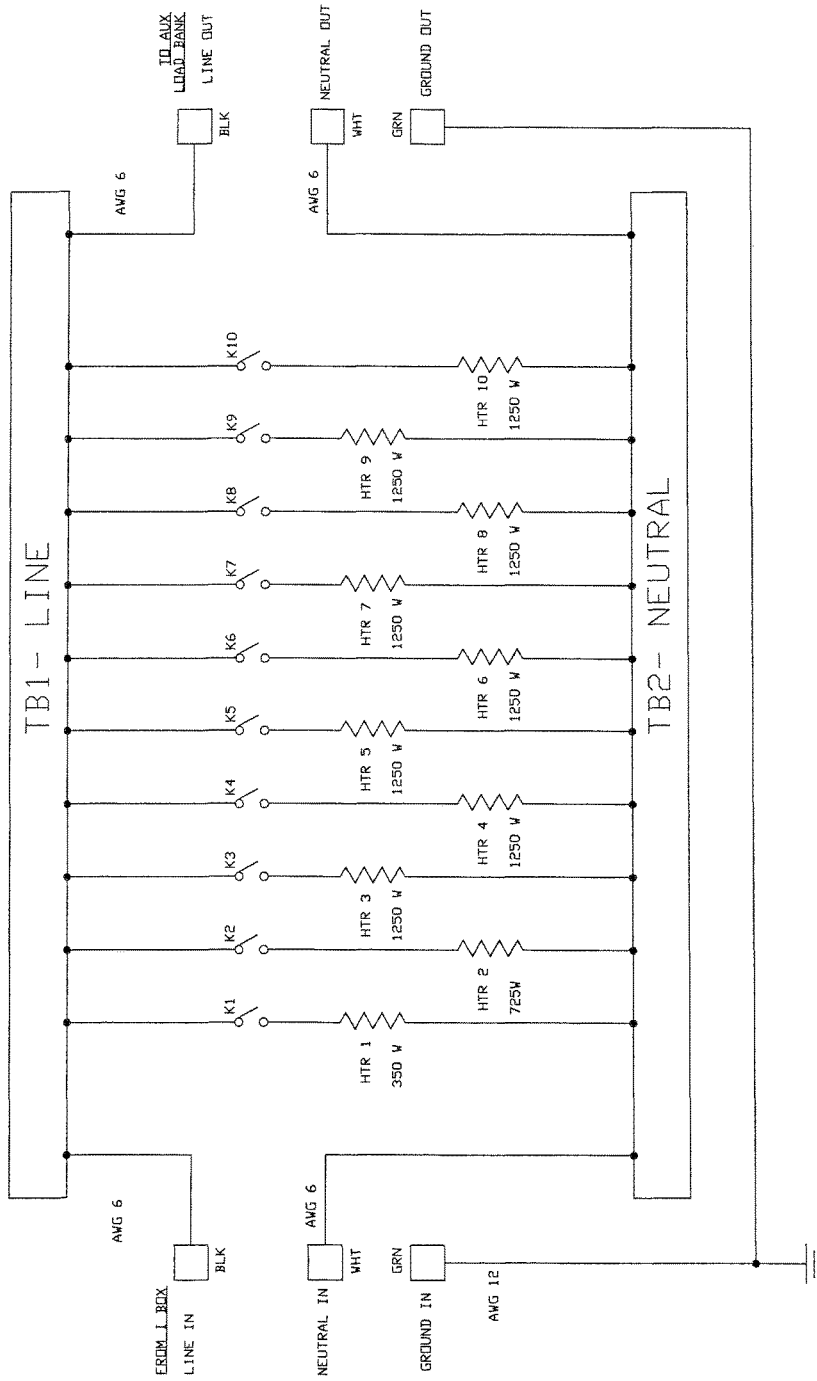
FIG. 16 is a first portion of a schematic diagram of the electronic circuit used in the main Load Bank unit which forms part of the system of the present invention.

As can be seen from FIGS. 15 and 16 of the drawings, the line, neutral and ground heavy gauge cables from the interface unit 4 are connected to the main Load Bank unit 8a and through the heavy gauge jumper cables to the auxiliary Load Bank unit 8b. Also, the control signals and other data signals are carried by the Ethernet cable connecting the circuit breaker tester unit 6 with the main Load Bank unit 8a and are also carried by the jumper Ethernet cable extending between the main Load Bank unit 8a and the auxiliary Load Bank unit 8b.

Figure 17:
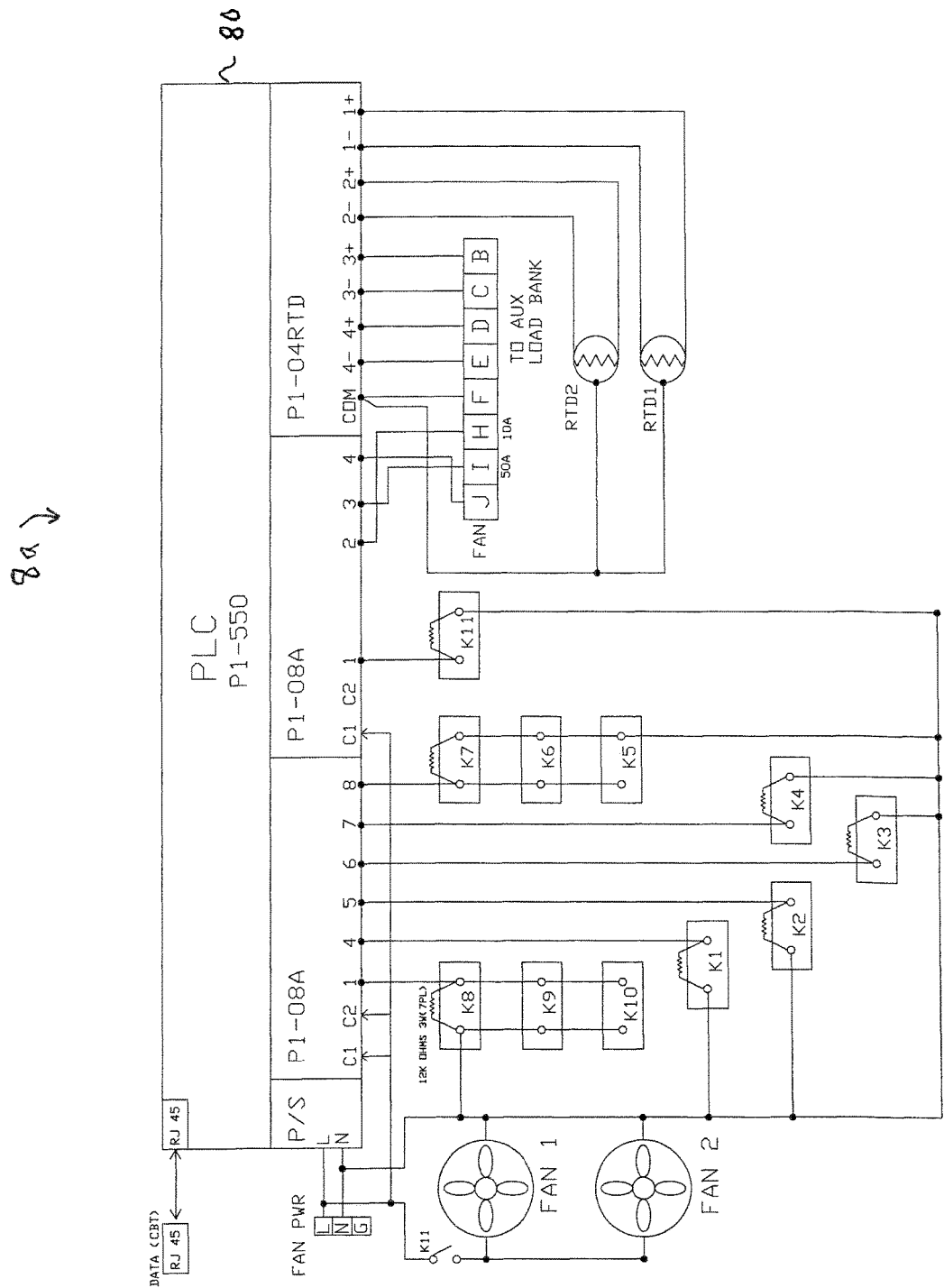
FIG. 17 is a second portion of a schematic diagram of the electronic circuit used in the main Load Bank unit which forms part of the system of the present invention.

As also can be seen from FIGS. 15 and 17 of the drawings, the PLC in the main Load Bank unit 8a controls the state of the relays K1-K10 to selectively switch in various loads which are placed on the circuit breaker under test in response to control signals received from the circuit breaker tester unit 6 on the Ethernet cable. The PLC in the main Load Bank unit 8a, also in response to these control signals from the circuit breaker tester unit 6, controls the energization of the relays K1-K6 in the auxiliary Load Bank unit 8b which selectively switch in additional loads for the circuit breaker under test through the line and neutral jumper cables connected between the main Load Bank unit 8a and the auxiliary Load Bank unit 8b. The PLC of the main Load Bank unit 8a also controls the relay K11 in the main Load Bank unit 8a to selectively operate the cooling fans and, through the jumper Ethernet cable between the main Load Bank unit 8a and the auxiliary Load Bank unit 8b, control the energization of the relay K7 in the auxiliary Load Bank unit 8b to control the operation of the cooling fans therein.

As mentioned previously, there are thermal sensors, preferably two RTD sensors, in each of the primary housing of the main Load Bank unit 8a and the primary housing of the auxiliary Load Bank unit 8b, which sense the temperature within each unit. Thermal sense signals from the sensors in the auxiliary Load Bank unit 8b are provided to the PLC in the main Load Bank unit 8a through the jumper Ethernet cable connecting the main Load Bank unit 8a with the auxiliary Load Bank unit 8b, and the PLC in the main Load Bank unit 8a also receives temperature sense signals from the thermal sensors in the main Load Bank unit 8a. The PLC in the main Load Bank unit 8a provides such temperature sense signals to the PLC in the circuit breaker tester unit 6 over the Ethernet cable interconnecting the circuit breaker tester unit 6 with the main Load Bank unit 8a. The PLC in the circuit breaker tester unit 6 monitors such temperature sense signals and displays on the HMI touch screen display preferably as analog-type meter indications or numerical indications of the temperatures registered by the four thermal sensors collectively in the main Load Bank unit 8a and the auxiliary Load Bank unit 8b. If a temperature sensed by one of the thermal sensors in the main Load Bank unit 8a and the auxiliary Load Bank unit 8b exceeds a predetermined temperature value, the PLC in the circuit breaker tester unit 6 will sound an alarm or provide a visual indication of an over-temperature condition and, preferably, will automatically disconnect any loads on the circuit breaker under test that are switched in by either the main Load Bank unit 8a or the auxiliary Load Bank unit 8b. Furthermore, if no command or control signal from the circuit breaker tester unit 6 and, in particular, the PLC therein, is provided to the PLC of the main Load Bank unit 8a, the cooling fans in the main Load Bank unit 8a and auxiliary Load Bank unit 8b are automatically shut off after an elapsed time of about two minutes. However, any command or control signal sent to the PLC of the main Load Bank unit 8a from the PLC of the circuit breaker tester unit 6 will automatically turn the cooling fans on in the main Load Bank unit 8*a* and, if used, in the auxiliary Load Bank unit 8*b*.

As can be seen from FIGS. 15-17 of the drawings, the main Load Bank unit 8*a* preferably includes ten single pole, single throw relays K1-K10 which, when selectively energized, switch in as loads to the circuit breaker in the panel 12 under test heater wires labeled HTR1-HTR10. Heater wires HTR1-HTR10 are resistive or inductive loads that may be selectively or in combination placed across the output of a circuit breaker in the power distribution panel 12 under test, and each heater wire may present a different load, alone or in combination with other heater wires, to the circuit breaker. For example, heater wire HTR1 preferably presents a 350 watt (W) load at 120 VAC across a circuit breaker when relay K1 is energized. Heater wire HTR2 presents a 725 watt load across the circuit breaker under test when relay K2 is energized.

Heater wire HTR3 presents a 1,250 watt load at 120 VAC across the circuit breaker when relay K3 is energized, and heater wire HTR4 also presents a 1,250 watt load when its controlling relay K4 is energized.

Heater wire HTR1 (350 watts) is connected in series with the single throw, single pole contacts of relay K1; heater wire HTR2 (725 watts) is connected in series with the single pole, single throw contacts of relay K2; heater wire HTR3 (1,250 watts) is connected in series with the single pole, single throw contacts of relay K3; heater wire HTR4 (1,250 watts) is connected in series with the single pole, single throw contacts of relay K4; heater wire HTR5 (1,250 watts) is connected in series with the single pole, single throw contacts of relay K5; heater wire HTR6 (1,250 watts) is connected in series with the single pole, single throw contacts of relay K6; heater wire HTR7 (1,250 watts) is connected in series with the single pole, single throw contacts of relay K7; heater wire HTR8 (1,250 watts) is connected in series with the single pole, single throw contacts of relay K8; heater wire HTR9 (1,250 watts) is connected in series with the single pole, single throw contacts of relay K9; and heater wire HTR10 (1,250 watts) is connected in series with the single pole, single throw contacts of relay K10.

Preferably, relays K5, K6 and K7 are energized together and together place heater wires HTR5, HTR6 and HTR7, respectively, across the circuit breaker under test as a load, for a combined load of 3,750 watts. Similarly, relays K8, K9 and K10 are energized together and together place heater wires HTR8, HTR9 and HTR10, respectively, across the circuit breaker under test as a load, for a combined load of 3,750 watts.

The connector on the primary housing of the main Load Bank unit 8*a* that receives the line (hot, black) cable from the interface unit 4 is connected with a heavy gauge (preferably, AWG 6) jumper wire to a line bus bar in the main Load Bank unit 8*a* and which is labeled TB1 in FIG. 16. Similarly, the connector that connects to the neutral (white) heavy gauge wire from the interface unit 4 is connected to a heavy gauge jumper wire (preferably, AWG 6) that connects to a neutral bus bar within the main Load Bank unit 8*a* and which is labeled TB2 in FIG. 16. One contact of each relay K1-K10 is connected to the line bus bar TB1, the other contact of each of which is connected to its respective heater wire HTR1-HTR10. The other end of each heater wire HTR1-HTR10 is connected to the neutral bus bar TB2. Another heavy gauge jumper wire (preferably AWG 6) is connected from the line bus bar to the "Line Out" connector on the primary housing of the main Load Bank unit 8*a* for connection to the jumper cable that leads to the auxiliary Load Bank unit 8*b*, and another heavy gauge jumper wire (preferably AWG 6) is connected to the neutral bus bar TB2 to the "Neutral Out" connector on the primary housing of the main Load Bank unit 8*a* for connection to the jumper cable that leads to the auxiliary Load Bank unit 8*b*. There is also an internal jumper wire (preferably AWG 16) that is connected between the input ground connector ("Ground In") connected to the interface unit 4 via the extension cable and the output ground connector ("Ground Out") on the primary housing of the main Load Bank unit 8*a*. The Line Out, Neutral Out and Ground Out connectors mounted on the primary housing of the main Load Bank unit 8*a* provide the line, neutral and ground connections to the auxiliary Load Bank unit 8*b* via the respective line, neutral and ground jumper cables that extend between the output connectors of the main Load Bank unit 8*a* and the input connectors of the auxiliary Load Bank unit 8*b*.

As shown in FIG. 17 of the drawings, each of relays K1, K2, K3, K4 and K11 includes a 12K ohms, 3 watt resistor across their control contacts since the relays chosen for use in the main Load Bank unit 8*a* and also in the auxiliary Load Bank unit 8*b* are solid state relays, and the PLC outputs driving the relays that power the heaters require a minimum 10 milliampere load to provide the full rated output voltage. However, the solid state relays selected for that purpose draw less than the required 10 milliamperes to fully energize and enable the heaters. The resistors were added solely to load the PLC outputs with the requisite 10 milliamperes so that the solid state relays get the necessary voltage to operate reliably. Similarly, the parallel combination of the respective control contacts of relays K8, K9 and K10, as well as the parallel combination of the control contacts of relays K5, K6 and K7, include a 12K ohms, 3 watt shunt resistor across each combination.

Relay K11 is energized by the PLC in the main Load Bank unit 8*a* in response to commands received from the PLC in the circuit breaker tester unit 6 and carried to the main Load Bank unit 8*a* over the Ethernet cable between the circuit breaker tester unit 6 and the main Load Bank unit 8*a*. When relay K11 is energized, it turns on the cooling fans, FAN 1 and FAN 2, which are connected between the line and neutral outputs from the power supply of the electronic circuitry within the primary or secondary housings of the main Load Bank unit 8*a*. As shown in FIG. 17, the single pole, single throw contacts of relay K11 are connected in series with a line (hot) jumper wire leading from the power supply and to one input of each fan FAN 1 and FAN 2. The other input of each of fan FAN 1 and FAN 2 is connected to the neutral output of the power supply through another jumper wire. Also, each of the relays K1-K10 has one control input thereof connected to outputs of the PLC within the main Load Bank unit 8*a*, the other control contact of each relay K1-K10 being connected to the neutral output of the power supply through appropriate jumper wires.

The auxiliary Load Bank unit 8*b* is constructed similarly to the main Load Bank unit 8*a*, except that the auxiliary Load Bank unit 8*b* does not require a PLC or other computer processing unit, as it receives commands from and is controlled by the PLC of the main Load Bank unit 8*a*. It may also be physically smaller, and have fewer heater wires presenting loads to the circuit breaker under test, than the main Load Bank unit 8*a*.

Figure 18:
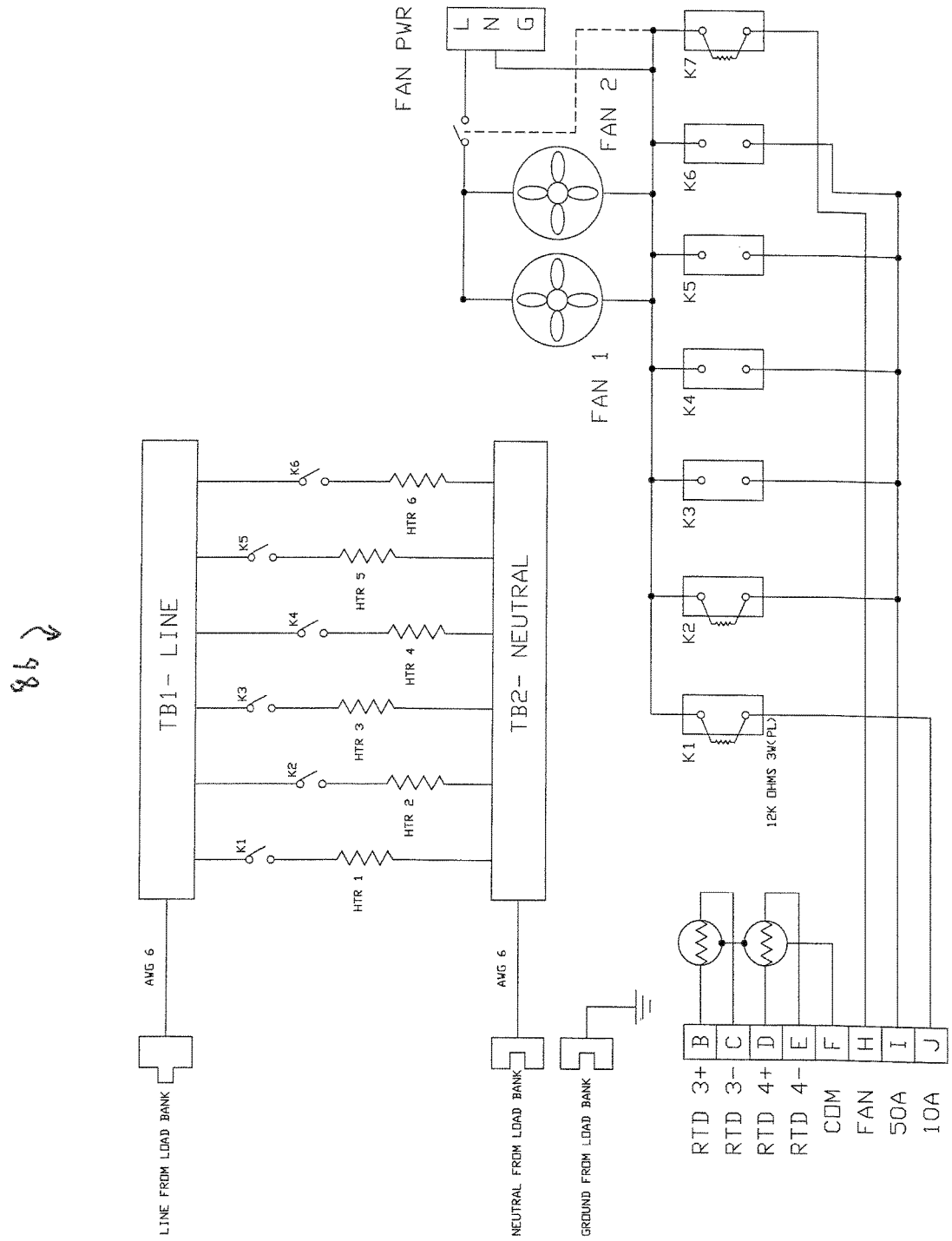
FIG. 18 is a schematic diagram of the electronic circuit of the auxiliary Load Bank unit which forms part of the system of the present invention.
Figure 20B:
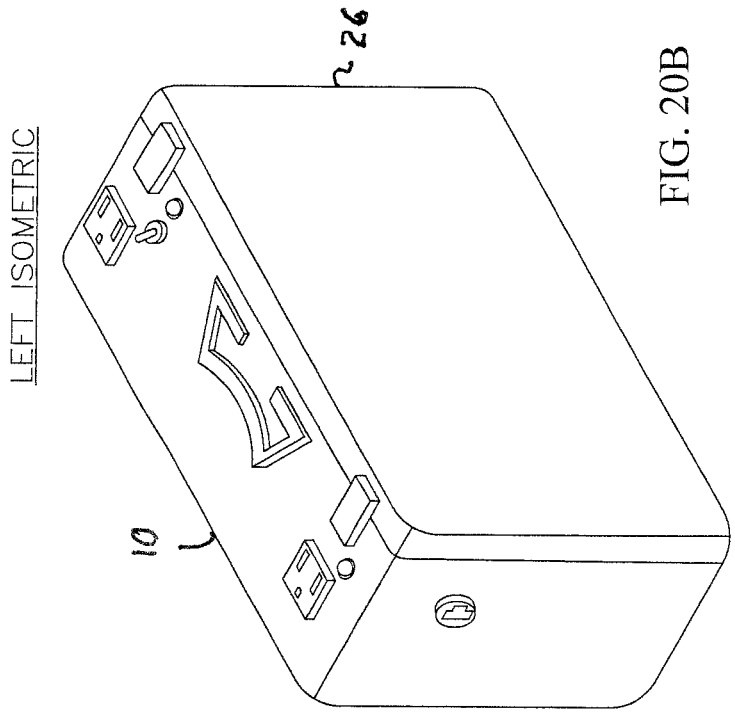
FIG. 20B is a left isometric view of the outlet tester unit which forms part of the system of the present invention.
Figure 20A:
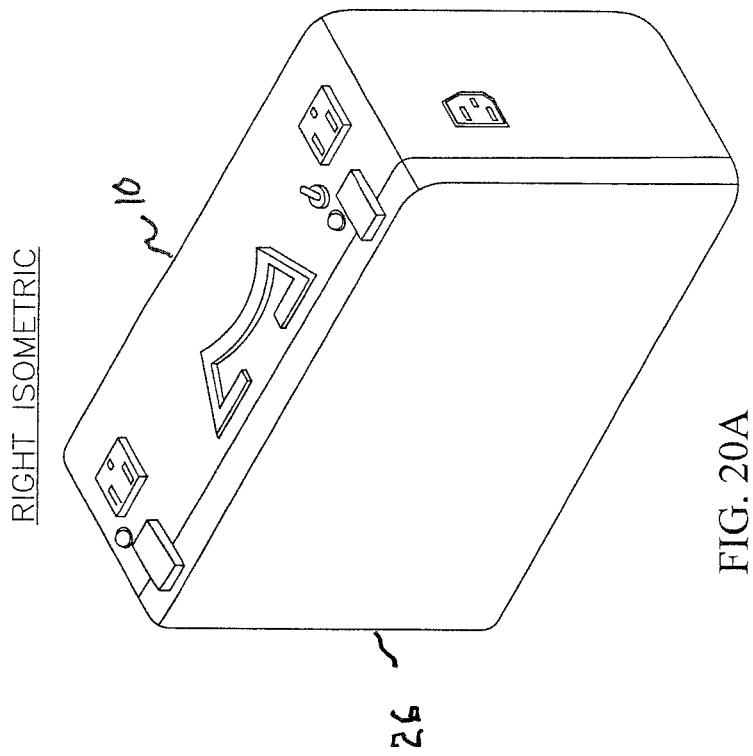
FIG. 20A is a right isometric view of the outlet tester unit which forms part of the system of the present invention.

As can be seen from FIG. 18 of the drawings, the auxiliary Load Bank unit 8*b*, when required, has neutral, line and ground input connectors mounted on a side wall of the primary housing of the unit 8*b* which are connectable to the neutral, line and ground output connectors mounted on a side wall of the primary housing of the main Load Bank unit 8*a* and connectable thereto through heavy gauge jumper wires. The line (hot) input connector is connected via a heavy gauge (preferably, AWG 6) jumper wire to a line bus bar, labeled TB1 in FIG. 18, within the internal cavity defined by the primary housing of the auxiliary Load Bank unit 8*b*. Similarly, the neutral (white) input connector is connected via a heavy gauge (preferably, AWG 6) jumper wire to a neutral bus bar, labeled TB2 in FIG. 18, also situated within the internal cavity of the primary housing of the auxiliary Load Bank unit 8*b*. A plurality of relays K1-K6 selectively switch in resistive or inductive loads between the line bus bar and the neutral bus bar which, in turn, presents these loads to a circuit breaker in the power distribution panel 12 under test. The ground (green) input connector of the auxiliary Load Bank unit 8*b* is connected to the chassis or primary housing of the auxiliary Load Bank unit 8*b*.

Heater wire HTR1 of the auxiliary Load Bank unit 8*b*, which is preferably 1,250 watts, presents an auxiliary load to the circuit breaker under test when relay K1 is energized; heater wire HTR2 (preferably, 1,250 watts) presents an auxiliary load to the circuit breaker under test when relay K2 is energized; heater wire HTR3 (preferably, 1,250 watts) presents an auxiliary load to the circuit breaker under test when relay K3 is energized; heater wire HTR4 (preferably, 1,250 watts) presents an auxiliary load to the circuit breaker under test when relay K4 is energized; heater wire HTR5 (preferably, 1,250 watts) presents an auxiliary load to the circuit breaker under test when relay K5 is energized; and heater wire HTR6 (preferably, 1,250 watts) presents an auxiliary load to the circuit breaker under test when relay K6 is energized.

More specifically, relays K1-K6 each have single pole, single throw contacts, one contact of each relay being connected to a line bus bar TB1 within the internal cavity defined by the primary housing of the auxiliary Load Bank unit 8*b*, and the other contact of each relay being connected to one end of heater wires HTR1-HTR6, respectively. The other ends of heater wires HTR1-HTR6 are connected to a neutral bus bar TB2 within the internal cavity defined by the primary housing of the auxiliary Load Bank unit 8*b*. Each relay K1-K6 may be selectively energized, or energized in combination, to add single loads or a combination of loads provided by heater wires HTR1-HTR6 to the circuit breaker in the power distribution panel 12 under test. The relays K1-K6 are individually controlled by the PLC in the main Load Bank unit 8*a* through the multiwire cable connecting the main Load Bank unit 8*a* to the auxiliary Load Bank unit 8*b*. One control contact of each of the relays K1-K6 is connected via a jumper wire to neutral, and the other control contact of each of the relays K1-K6 is connected to the multi-pin connector and multiwire jumper cable between the main Load Bank unit 8*a* and the auxiliary Load Bank unit 8*b* to the PLC in the main Load Bank unit 8*a*.

Preferably, in one embodiment of the system of the present invention, the control contacts of relays K2-K6 are connected together to provide a 50 ampere current load to the circuit breaker under test, whereas the control contact for relay K1 is connected on a separate control line to present a ten ampere current load to a circuit breaker under test; however, it should be realized that each of relays K1-K6 may be individually selectively energized, or energized in various combinations, to present any current load from 0 amperes to 60 ampere in ten ampere steps. Similarly, the relays K1-K10 of the main Load Bank unit 8*a*, in one embodiment of the system 2 of the present invention, may be selectively individually energized, or energized in various combinations, to present a current load of 0 amperes to 87.5 amperes in 2.5 ampere steps to a circuit breaker in the power distribution panel 12 under test.

As mentioned previously, the auxiliary Load Bank unit 8*b* includes two cooling fans, that is, FAN 1 and FAN 2. The energization of the cooling fans FAN 1, FAN2 is controlled by a relay K7. The single pole, single throw contacts of relay K7 are connected between line (hot) and one input on each of the fans FAN 1, FAN 2, the other input of each of fans FAN 1, FAN 2 being connected to neutral. The energization of relay K7, controlling the operation of fans FAN 1, FAN 2, is controlled by a signal received from the PLC in the main Load Bank unit 8*a* through the jumper multiwire cable connecting the main Load Bank unit 8*a* with the auxiliary Load Bank unit 8*b*. Furthermore, certain of the relays K1-K7 may include a bypass resistor, which is preferably 12K ohms, 3 watts, across their control contacts, since the PLC outputs driving the relays that power the heaters in the auxiliary Load Bank unit 8*b* require a minimum 10 milli-ampere load to provide the full rated output voltage required by the solid state relays to energize and enable the heaters, as explained previously with respect to the relays in the main Load Bank unit 8*a*. For example, relay K1 has a bypass resistor across its control contacts, since it is individually energized; the control contacts of relays K2-K6, being connected in parallel, include a single bypass resistor across the combination of the control contacts (such as shown in FIG. 17 across the control contacts of relay K2); and relay K7, which controls the energization of the fans FAN 1, FAN 2, also includes a bypass resistor across its contacts.

Preferably, each of the main Load Bank unit 8*a* and the auxiliary Load Bank unit 8*b* is formed with a steel primary housing having the dimensions of about 20 inches in height by about 20 inches in width by about 10 inches in depth, not including the secondary housing attached to the primary housing of the main Load Bank unit 8*a*. The heater wires, suspended between a lower plate and an upper plate in each of the main Load Bank unit 8*a* and the auxiliary Load Bank unit 8*b*, are about 15 inches in length and have a multiplicity of spaced apart fins perpendicularly disposed thereon to dissipate the heat generated by the heater wires, each fin being about two inches in height and about two inches in width. Two six inch muffin fans are mounted on each of the primary housings of the main Load Bank unit 8*a* and the auxiliary Load Bank unit 8*b* to dissipate the heat generated by the heater wires within the internal cavities of the primary housings of each unit 8*a*,8*b*. The total heat to be dissipated by the main Load Bank unit 8*a* is about 11 kilowatts. The total heat to be dissipated by the auxiliary Load Bank unit 8*b* is about 7.5 kilowatts.

Reference should now be had to FIGS. 19A-23 of the drawings, which illustrate one form of, and the preferred electronic circuitry for, the outlet tester unit 10 of the system 2 of the present invention. The outlet tester unit 10 preferably includes a suitcase-sized housing having a handle and defining an internal cavity in which is situated the electronic circuitry thereof which is used to test AC outlets and receptacles within the premises and so that it may be easily and conveniently carried by the home inspector or technician to areas of the premises remotely located from where the circuit breaker panel 12, and the interface unit 4 and circuit breaker tester unit 6 of the system 2, are located. The portability of the outlet tester unit 10 allows the unit 10 to be carried to wherever an AC outlet or receptacle is found so that the outlet and the internal wiring connected to the outlet may be tested. Preferably, the outlet tester unit 10 communicates wirelessly with the remotely located circuit breaker tester unit 6, without the need for data communications cables or wires extending through the home or office building between and connected to the outlet tester unit 10 and the circuit breaker tester unit 6.

As may be seen from FIGS. 19A-19D, 20A and 20B, the housing of the outlet tester unit 10 includes several connectors used during the operation of the unit 10. On one side wall of the outlet tester unit 10, there is provided a power on/off toggle switch which turns on or shuts off the electronic circuitry situated within the internal cavity defined by the housing. There is also located on a side wall of the housing of the outlet tester unit 10 an AC receptacle, which is connectable to a power cord which is plugged into an AC outlet or receptacle in proximity to where the outlet tester unit 10 is located. Furthermore, there is a status "on" light indicator on a side wall of the housing, connected to the electronic circuitry within the housing of the outlet tester unit 10, which indicates whether the unit 10 is powered on or off.

There is another AC receptacle located on one of the side walls of the housing of the outlet tester unit 10. This receptacle is used for connecting to an external load, such as a commercial heater, and which provides preferably a 1.5 kilowatt load to an AC outlet under test when the electronic circuitry of the outlet tester unit 10 selectively switches in the load across the line and neutral contacts of the AC outlet or receptacle under test. The 1.5 kilowatt load draws about 12 amperes of current.

On another side wall of the housing of the outlet tester unit 10 is situated yet another AC receptacle or plug. This AC receptacle or plug is provided so that an extension cord may be connected thereto and plugged into an AC outlet under test. Also, there may be an Ethernet connector mounted on a side wall of the housing of the outlet tester unit 10. This Ethernet connector is provided for receiving a mating plug of an Ethernet cable, the other end of which may be electrically connected to a laptop computer or tablet computer or, alternatively, to the circuit breaker tester unit 6 that is remotely located from the outlet tester unit 10. This Ethernet connector is electrically connected to a controller, such as a programmable logic controller (PLC) or other central processing unit (CPU), which forms part of the electronic circuitry of the outlet tester unit 10 and is situated in the internal cavity defined by the housing of the outlet tester unit 10. Preferably, the PLC used in the outlet tester unit is Part No. P1000 distributed by Automation Direct Inc. of Cummings, Georgia. This PLC is one of several controllers distributed by Automation Direct Inc. in its "productivity series" of controllers which may be usable in the outlet tester unit 10, the main Load Bank unit 8a and the circuit breaker tester unit 6. A CPU which may be used instead of the PLC in each of the circuit breaker tester unit 6, the main Load Bank unit 8a and the outlet tester unit 10 is Part No. P1-550, also distributed by Automation Direct Inc. Through this Ethernet connection, the PLC of the outlet tester unit 10 may communicate with either the laptop or tablet computer or the remotely located circuit breaker tester unit 6 and receive data therefrom or transmit data thereto.

Figure 21:
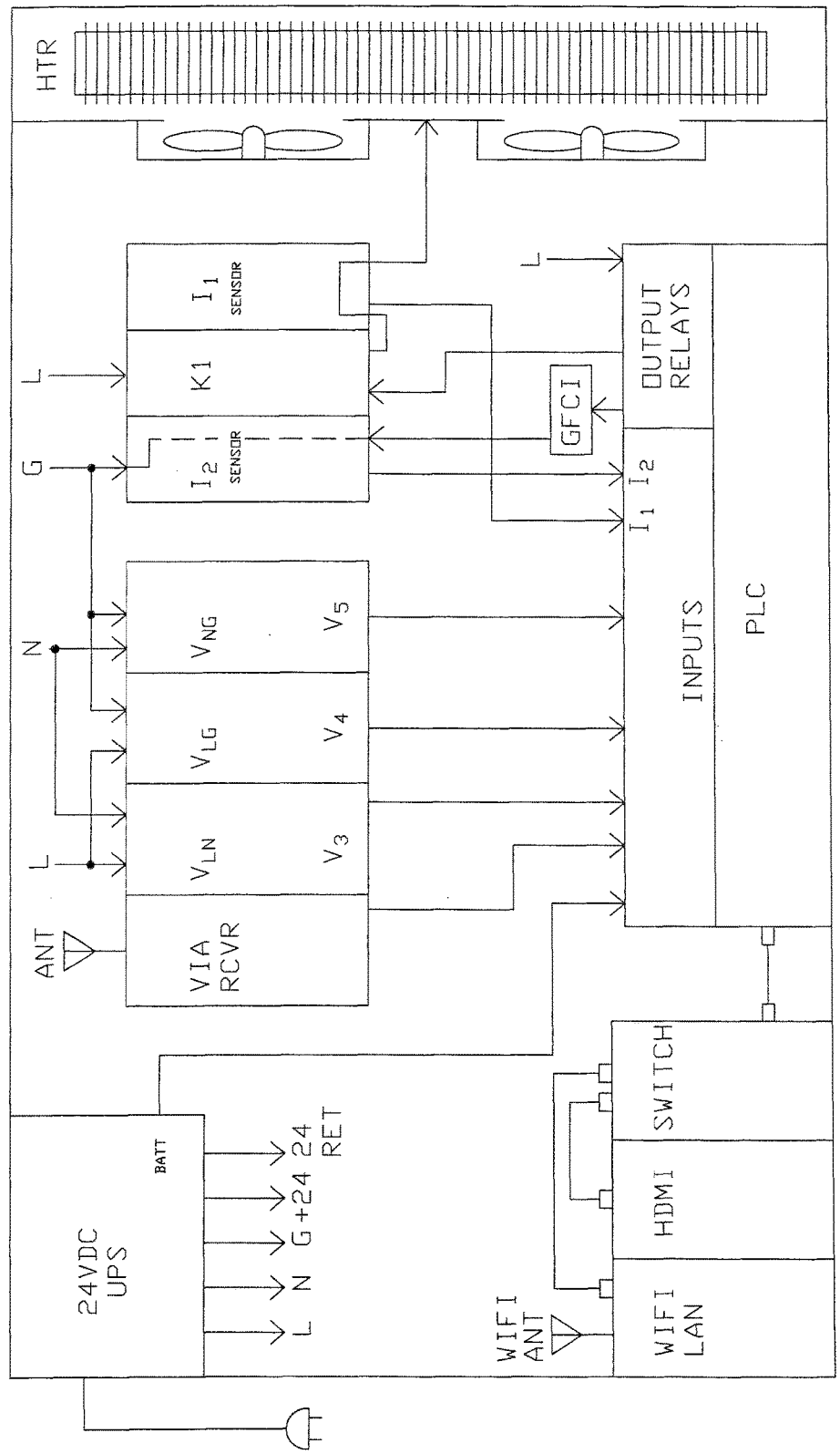
FIG. 21 is a block diagram of the electronic circuit of the outlet tester unit which forms part of the system of the present invention.

The preferred electronic circuitry of the outlet tester unit 10 will now be described, and reference should be had to FIG. 21 of the drawings. From FIG. 21, it may be seen that the circuitry includes a controller, such as a PLC, and several testing modules for testing voltages between the line and neutral contacts of an AC outlet or receptacle under test or between the line and ground contacts. Such modules include, but are not limited to, a first voltage sensing module which senses the voltage between the line and neutral contacts of an AC outlet under test, a second voltage sensing module which senses the voltage between the line and ground of the outlet under test, and a third voltage sensing module which senses the voltage between the neutral and ground of the outlet under test. In the outlet tester unit 10, it is important to look at the voltage differences between neutral and ground at the AC outlet. A relatively large voltage drop could be indicative of a high resistance in the house wiring from the circuit breaker to the AC outlet.

The electronic circuitry of the outlet tester unit 10 also includes a ground fault circuit interrupter current leak module for testing the operation of a GFCI-protected outlet, and a current sensor which senses the current on the ground contact of an AC outlet under test. The GFCI current leak module and the current sensor of the outlet tester unit 10 are very similar in structure and function to that of the GFCI current leak module and associated current sensor of the electronic circuitry within the circuit breaker tester unit 6. The current sensor, like that of the circuit breaker tester unit 6, preferably measures current on the ground contact of the outlet under test from 0 amperes to 0.01 amperes (10 milliamperes).

Each of the three voltage modules, the ground current sensor and the GFCI current leak module includes one or more line, neutral or ground connections which are wired to an AC plug or receptacle mounted on the housing and which is connected, via an extension cord, to the AC outlet under test, through internal wiring of the outlet tester unit 10, and further includes output sensor connectors which are connected via internal wiring to the PLC of the outlet tester unit 10 and provide voltage and current sense signals to the PLC. More specifically, each voltage module and each current sensor provides a signal to the PLC corresponding to the voltage or current which is sensed. Preferably, the signal provided to the PLC from each voltage module and current sensor is between about 4 milliamperes and about 20 milliamperes.

There is also a second current sensor forming part of the electronic circuitry of the outlet tester unit 10. This current sensor is preferably a toroidal-type sensor having a central opening through which passes a wire connected to the test receptacle or plug on the housing of the outlet tester unit 10. This wire carries the line voltage to the first voltage sensing module (which tests the voltage between the line and neutral contacts of an AC outlet under test), the second voltage sensing module (which tests the voltage between the line and ground contacts of an AC outlet under test) and to the GFCI current leak module. The second current sensor preferably is capable of sensing line currents between about 0 amperes and about 50 amperes, and provides an output signal corresponding to the line current that is measured on two sense wires that are connected to the PLC.

The outlet tester unit 10 also preferably includes an uninterruptible power supply (UPS). The UPS may be an external component to the outlet tester unit 10 and may be connected to the power receptacle of the unit 10 to provide an uninterrupted source of power to the outlet tester unit 10, or may be situated within the housing of and form part of the internal electronic circuitry of the outlet tester unit 10. Preferably, the UPS, when formed as part of the electronic circuitry of the outlet tester unit 10 and situated within the internal cavity defined by the housing of the unit 10, not only provides an uninterruptible source of AC power to power the unit, but also includes an AC-to-DC converter circuit to convert 120 VAC to 12 VDC for powering various components of the electronic circuitry of the outlet tester unit 10, including the PLC. It is preferable that the UPS function be internal to the outlet tester unit 10, and not connected to an AC outlet, especially the outlet under test. First, the unit 10 is carried around the house and plugged into one outlet after another. Having to use a second outlet to power the unit 10 through the UPS is possible but not convenient. Also, a UPS connected to the outlet under test may compromise the measurements.

Since the outlet tester heater is much lower in power than the Load Bank heaters, there is no need to keep the fan in the outlet tester unit 10 running after the test. Given that, there is only need for a few watts of uninterruptible 12 and 24 VDC power, so a standard UPS would involve multiple power conversions to no benefit. The preferred design simply uses the input AC to charge a battery whenever it is plugged in, which then powers the unit 10 as it is carried between outlets.

Furthermore, in a preferred form of the outlet tester unit 10, the electronic circuitry thereof includes an RF data link, which is preferably formed as a transceiver for two-way wireless communication with the circuit breaker tester unit 6, as described previously. The RF data link communicates electronically with the PLC of the outlet tester unit 10, and is connected to an internal antenna situated within the internal cavity defined by the housing of the outlet tester unit 10.

As also mentioned previously, the outlet tester unit 10, in a preferred form, includes a phase detector module or circuit, which may be similar in structure and operation to that of the phase detector circuit forming part of the electronic circuitry of the circuit breaker tester unit 6. The phase detector module in the outlet tester unit 10 measures the phase of the line voltage on an AC outlet under test and communicates this information to the PLC, which then in turn causes the RF data link to transmit representative signals of such phase information to the circuit breaker tester unit 6, where it is received by the data link of the circuit breaker tester unit 6 and provided to the PLC therein so that the correct service reference voltage may be determined by the PLC of the circuit breaker tester unit 6, and representative data signals corresponding to the correct reference service voltage may be transmitted wirelessly to the outlet tester unit 10 and received by the data link thereof. The various modules within the outlet tester unit 10 compare the line-to-neutral voltage and line-to-ground voltage with the correct reference service voltage to determine any voltage drop on the AC outlet under test or in the wiring from the circuit breaker panel 12 to the AC outlet.

The PLC of the outlet tester unit 10 causes the outlet tester unit 10 to test an AC outlet under load and no load conditions by selectively switching in a commercial heater or other form of load plugged into the load receptacle mounted on a side wall of the housing of the outlet tester unit 10. The currents and voltages measured on the line, neutral and ground of the contacts of the AC outlet under test, under load and no load conditions, are provided by the modules and current sensors to the PLC of the outlet tester unit 10. The PLC can transmit representative signals through the RF data link to the circuit breaker tester unit 6 so that certain measured signals may be displayed on the HMI touch screen display of the circuit breaker tester unit 6. Alternatively, the outlet tester unit 10 may include its own display, such as an HMI touch screen display, which is connected to the PLC. The HMI touch screen display of the outlet tester unit 10 is provided for the user to enter instructions to the PLC, and for displaying test measurements for viewing by the user of the system. The touch screen display may be mounted on a side wall of the housing of the outlet tester unit 10, or may be situated within the internal cavity defined by the housing of the outlet tester unit 10. In such an embodiment, the housing of the outlet tester unit 10 may be formed in two mating first and second sections which may be joined together by hinges so that the housing may be opened for the user to have access for viewing and entering instructions on the internally situated HMI touch screen display and for accessing other electronic circuitry within internal cavity defined by the housing of the unit 10.

Alternatively, the PLC of the outlet tester unit may communicate directly with a laptop or tablet computer connected thereto via an Ethernet cable plugged into the Ethernet receptacle mounted on the side wall of the housing of the outlet tester unit 10 so that the laptop or tablet computer may display outlet test results, and the user may enter instructions to the PLC on the keyboard or touch screen display of the laptop or tablet computer.

For testing AC outlets which are two phase, 240 VAC, an adapter may be used to test the voltages between each line to neutral, or to ground, using the outlet tester unit 10 of the system 2 of the present invention. The adapter is designed to plug into a two phase, 240 VAC outlet, and includes essentially two 120 VAC outlets each having a line to neutral voltage of 120 VAC. The test cable of the outlet tester unit 10 may be sequentially plugged into each of the 120 VAC outlets of the adapter for individually testing each phase of the 240 VAC outlet.

Figure 22:
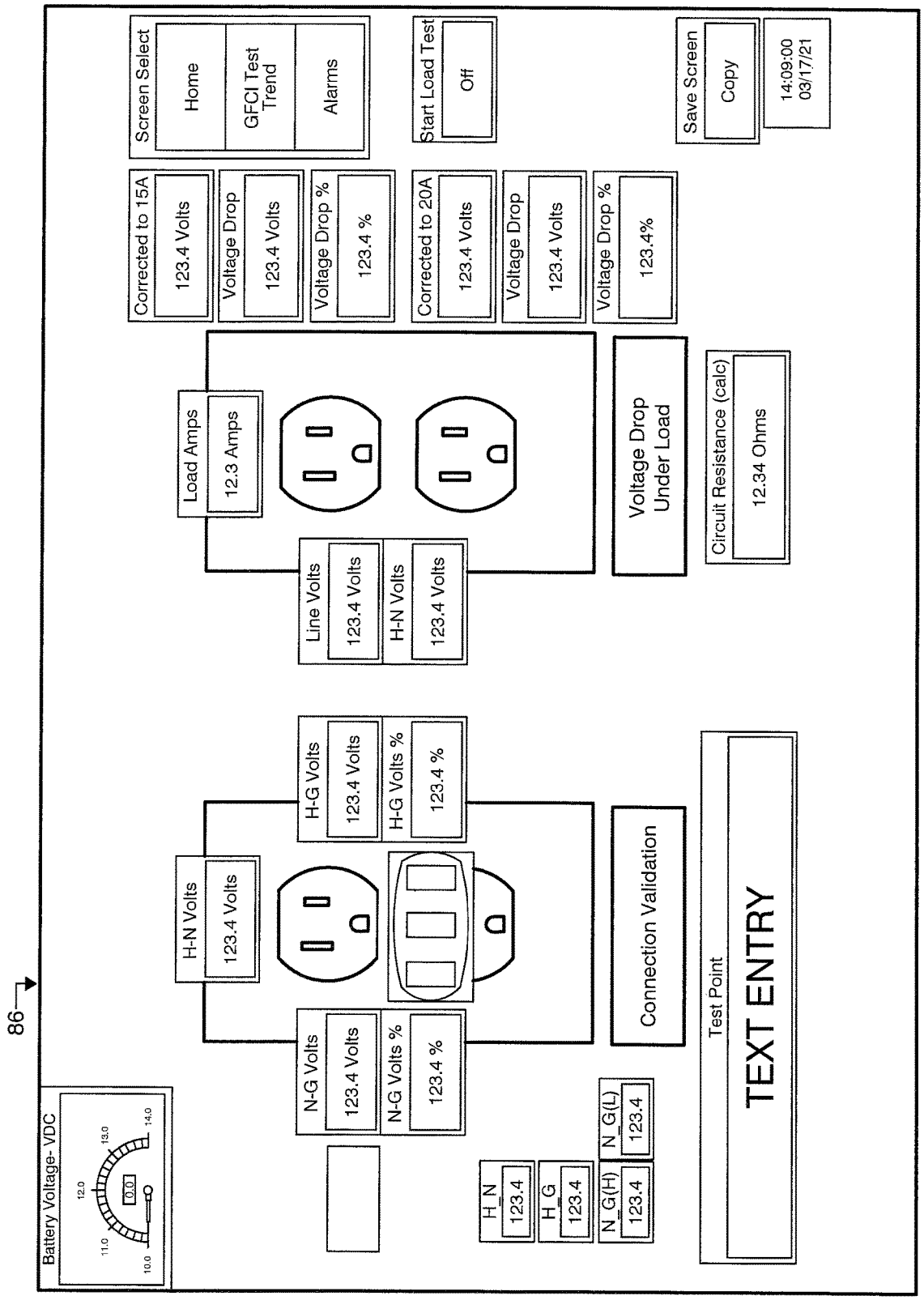
FIG. 22 is a diagrammatic illustration of a display forming part of the outlet tester unit of the system of the present invention, and illustrating examples of various test measurements performed by the system of the present invention and displayed by the outlet tester unit on the display thereof.
Figure 23:
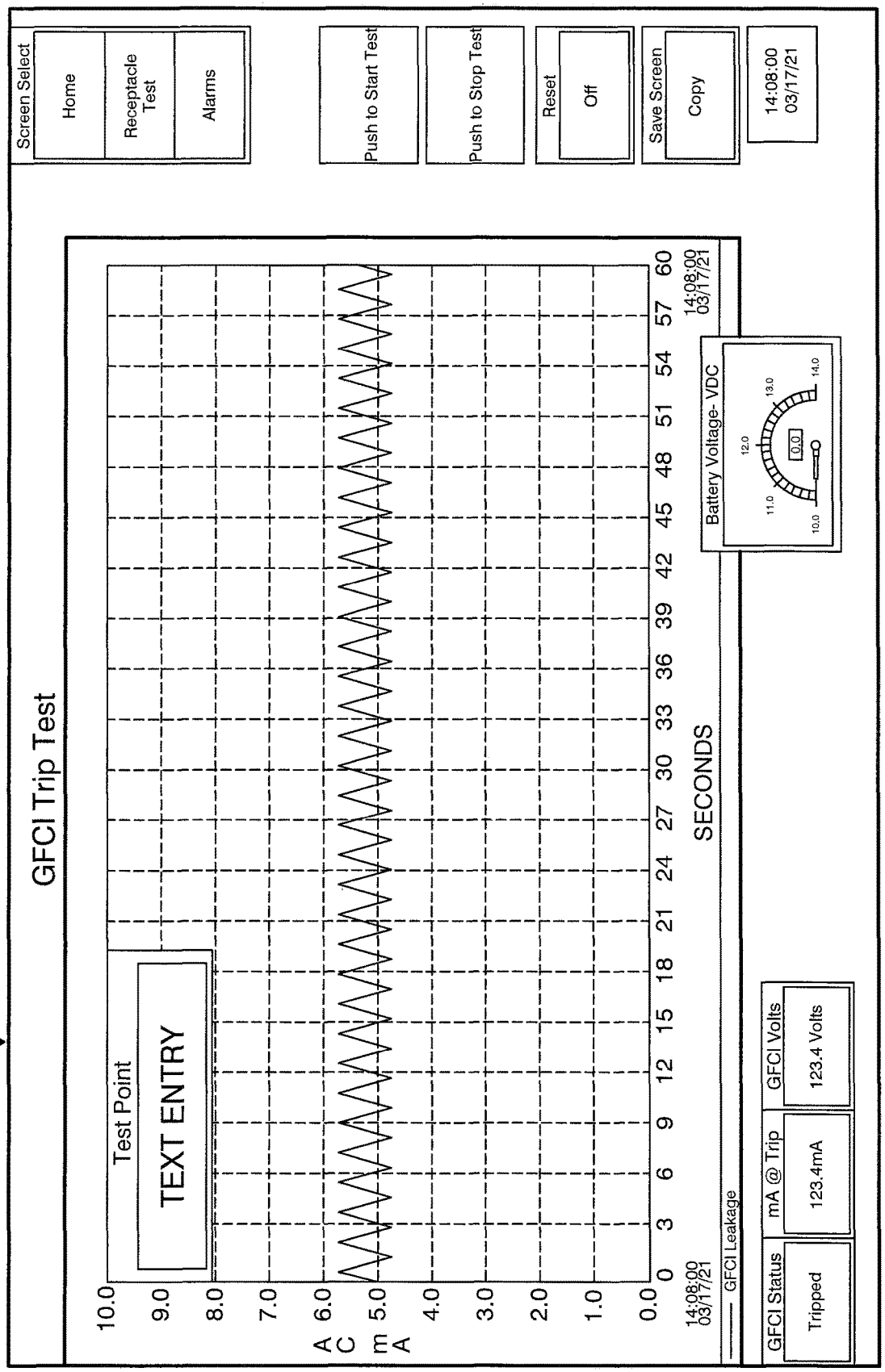
FIG. 23 is another diagrammatic illustration of a display forming part of the outlet tester unit of the system of the present invention, and illustrating examples of various test measurements performed by the system of the present invention and displayed by the outlet tester unit on the display thereof when testing GFCI-protected AC outlets.

The first test performed by the outlet tester unit 10 on an AC outlet is a "no load" test. This test will determine if the AC outlet is miswired, for example, an open ground on the outlet, or the line and neutral wires being reversed on the outlet, or if there is an unexpectedly low line voltage on the outlet. These voltages are measured by the modules, and analog meter-like displays, or numeric digital displays, of the line-to-neutral voltage, line-to-ground voltage and neutral-to-ground voltage are shown on the HMI touch screen display or laptop or tablet computer by the PLC of the outlet tester unit 10. The reference service voltage is also displayed on the HMI touch screen display of the outlet tester unit 10 or on the display of the connected laptop or tablet computer, which reference voltage is transmitted by the circuit breaker tester unit 6 to the outlet tester unit 10. Examples of the test measurements which are displayed on the HMI touch screen display of the outlet tester unit 10 or on the display of the laptop or tablet computer are illustrated in FIGS. 22 and 23 of the drawings.

Thus, the user of the outlet tester unit 10 may view the displays to determine if there is an anomaly or deviation in the voltages or currents displayed from what is expected on the AC outlet under test. Alternatively, the PLC or CPU of the outlet tester unit 10 may be programmed to compare the measured voltages and currents with a lookup table of ranges of voltages and currents under normal operating conditions which is stored in a memory of the controller or forming part of the electronic circuitry of the outlet tester unit 10, and the PLC may provide an "out of range" indication on the touch screen display to alert the user of the system 2 of the present invention of such an anomaly.

Measurements are also taken when the outlet tester unit 10 applies the load to the AC outlet under test. The PLC of the outlet tester unit 10 controls a relay within the electronic circuitry of the unit 10 to selectively switch in the external load connected to the load receptacle on a side wall of the housing of the outlet tester unit 10, which load is then applied across the line and neutral of the AC outlet under test. The voltage and current measurements performed by the voltage modules and current sensors of the outlet tester unit 10 are provided to the PLC of the unit 10 and are then displayed on the HMI touch screen display of the outlet tester unit 10 or on the display of a laptop or tablet computer connected to the unit 10 for viewing by the user of the system 2 of the present invention.

As mentioned previously, the outlet tester unit 10 of the system 2 of the present invention may communicate with a laptop computer, or even a hand held tablet, so that the user may enter instructions on the computer or tablet which are provided to the PLC of the outlet tester unit 10, or may view analog or digital displays of current and voltage measurements taken by the outlet tester unit 10 on the laptop computer or hand held tablet. As also mentioned previously, the laptop computer, or the hand held tablet, may be connected to the outlet tester unit 10 via an Ethernet cable. Alternatively, the outlet tester unit 10 may include a WiFi (wireless fidelity) transmitter and receiver, which may have a router and a modem, to communicate anywhere in the premises through a WiFi connection, or remotely through the internet, or may wirelessly communicate with the laptop computer or hand held tablet without the need for the Ethernet cable being connected thereto.

The following describes in general terms the steps in the procedure for testing circuit breakers and AC outlets performed using the system 2 of the present invention:

Circuit Breaker Troubleshooting Sequence
1. Turn off and confirm switch operation.
2. Remove from panel 12, conduct Mechanical Inspection, and replace circuit breaker in panel 12.
3. Conduct No-Load Test
   Verify conductivity (voltage output matches service input voltage).
4. Rated Load Test
   Verify low series resistance (output voltage within 2V of service input).
5. Overload Trip Test
   Measure with a 200% load, breaker trips within 120 seconds.
6. Ground Fault Protection Breaker Operation (only for GFCI breakers)
   Apply an increasing AC leakage current from line to ground that ramps up from zero to ten milliamperes rms. Observe GFCI breaker trips between 3 and 7 milliamperes rms.

Outlet Troubleshooting Sequence
1. No-Load Test
   Verify Line-to-Neutral Voltage and Line-to-Ground voltage are no more than 4V below associated service input at breaker panel.
   Verify that the Neutral-to-Ground Voltage shows the neutral is no more than 4V above ground.
   Verify all voltages are not indicative of incorrect wiring or open ground.
2. Load Test
   Apply a 12 ampere current load and observe voltages.
   Observe Line-to-Neutral and Line-to-Ground Voltages do not drop below 6 volts below associated service input at the breaker panel 12.
   Observe Neutral-to-Ground Voltage does not exceed 6 volts.
   Verify ground line quality by repeating Neutral-to-Ground Test with neutral and ground wires swapped (cannot be done with GFCI outlets or lines).
3. Ground Fault Outlet Test (only for GFCI outlets)
   Apply an increasing AC leakage current from line to ground that ramps up from zero to ten milliamperes rms. Observe outlet GFCI breaker trips between 3 and 7 milliamperes rms.

The following is a more detailed description of the tests performed by using the system 2 of the present invention:

Circuit Breaker Tests
1. Breaker mechanical Pre-Test
   1.1 Turn off and confirm switch operation.
   1.2 Remove load wire from breaker, remove breaker from panel 12, conduct mechanical Inspection, and if satisfactory, replace breaker in panel 12.
2. Conduct No-Load Test
   2.1 Setup
      2.1.1 The I-Box 4 is mounted to the breaker panel 12 using the supplied clamps and brackets, making sure the metallic frame on the back of the I-Box 4 is electrically connected to the breaker panel 12.
      2.1.2 The short, heavy white NEUTRAL probe from the I-Box 4 is fastened into the breaker panel neutral bus.
      2.1.3 The short, heavy black LINE probe from the I-Box 4 is fastened into the output of the breaker under test.
      2.1.4 The clip leads from the CBT unit 6 are now connected to the service input lugs at the top of the breaker panel 12. The black cliplead should connect to whichever service input lug is the most important (the one on the left will do). Connect the red clipleads to any other (2 or 3) service input lugs—in any order (unplug any unused ones from the CBT unit 6).
      2.1.5 The clip leads from the CBT unit 6 are now connected to the service input lugs at the top of the breaker panel 12. The black cliplead should connect to whichever service input lug is the most important (the one on the left will do). Connect the red clipleads to any other (2 or 3) service input lugs—in any order (unplug any unused ones from the CBT unit 6).
      2.1.6 Plug in the UPS, plug the CBT unit 6 into the UPS, Turn on the CBT unit 6 and set it to the breaker test.
   2.2 Test
      2.2.1 The clipleads and probes are now connected to the phase detector module, which automatically determines which service input the breaker under test is powered by. That service input voltage is connected to a voltage sensor which supplies a digitized voltage reading to the display LINE VOLTAGE INPUT window (000.0-150.0 VAC).
      2.2.2 The probe voltage is connected to a second, identical, voltage sensor, and the voltage is digitized and displayed in an identical format as BREAKER VOLTAGE.
      2.2.3 The two voltage readings are compared and recorded, and any voltage drop through the breaker should be negligible under no-load; no more than one volt.
3. Conduct Rated-Load Test
   3.1 Setup
      3.1.1 If not already done so, connect the three heavy cables from the I-Box 4 and the Ethernet CAT 6 cable from the CBT unit 6 to the Load Bank 8. Be sure to observe polarity of the power cables:

- 3.1.2 Black LINE cable has a socket that attaches to the black pin on the Load Bank 8.
- 3.1.3 White NEUTRAL cable has a pin that attaches to the white socket on the Load Bank 8.
- 3.1.4 Green GROUND cable has a pin that attaches to the green socket on the Load Bank 8.
- 3.1.5 In a similar fashion, connect the shorter heavy cables and the thin signal cable between the main Load Bank unit 8a and the auxiliary Load Bank unit 8b.
- 3.1.6 Plug in the UPS and plug both fan power plugs on the main Load Bank unit 8a and the auxiliary Load Bank unit 8b into the UPS.

3.2 Test
- 3.2.1 Using the CBT controls, command the rated load test and enter the breaker rated current from the switch tab on the breaker. Press the START softkey on the touch screen display of the CBT unit 6 to illuminate and initialize the test. (Press again to terminate the test.)
- 3.2.2 The Load Bank 8 is directed by the controllers in the CBT unit 6 and the Load Bank 8 to the draw the selected current. The current sensor in the I-Box 4 converts the current passing through to the Load Bank 8 into a digital number for display on the LOAD CURRENT window in the format of 000.0-150.0 AC amperes. It should be recorded, and should match the command to within 5% of the requested load value.
- 3.2.3 As mentioned in the no-load test, the phase detector module automatically determines which service input the breaker under test is powered by, and connects it to a voltage sensor which supplies a digitized voltage reading to the display LINE VOLTAGE INPUT window (000.0-150.0 VAC).
- 3.2.4 The probe voltage is connected to a second, identical, voltage sensor, and the voltage is digitized and displayed in an identical format as BREAKER VOLTAGE.
- 3.2.5 The two voltage readings are compared and recorded, and the voltage drop through the breaker is noted. At rated load, the drop should be under two volts.

4. Conduct Breaker Trip Test
- 4.1 Using the CBT controls, command the trip load test and enter the breaker rated current from the switch tab on the breaker. Press the START softkey on the display of the CBT unit 6 to illuminate and initialize the test. (Press again to terminate the test.)
- 4.2 The Load Bank 8 is directed by the controllers in the CBT unit 6 and the Load Bank 8 to draw a current that is twice the rated value of the breaker under test. The current sensor in the I-Box 4 converts the current passing through to the Load Bank 8 into a digital number for display on the LOAD CURRENT window in the format of 000.0-150.0 AC amperes. The current should be recorded, and should match the command to within 5% of requested value (210% of rated value).
- 4.3 The probe voltage is still connected to the voltage sensor, and the breaker output voltage is digitized and displayed in an identical format as BREAKER VOLTAGE on the display of the CBT unit 6.
- 4.4 Under overload conditions, significant breaker voltage drop below the input service is expected, and the current indication is more significant. So long as the current is within 210% of rated value, the voltage drop is not an issue.
- 4.5 A timer in the CBT processor times the duration of the twice rated current flow until the breaker trips from the overload and stops the current flow. This should happen between about 15 seconds and about 120 seconds. The time display stops and holds the time-to-trip, which should be recorded. The time is held until the RESET softkey on the touch screen display of the CBT unit 6 is pressed.

5. Conduct Ground Fault Trip time (FOR GFCI BREAKERS ONLY)
   NOTE: GFCI breakers are sensitive to any imbalance between the LINE and NEUTRAL wires, under the concern that the imbalance is due to the missing current going through someone, causing a dangerous electrical shock. A small imbalance will immediately trip the breaker regardless of the actual current delivered to the load.
- 5.1 Using the CBT control softkeys on the CBT unit touch screen display, command the GFCI test and display screen.
- 5.2 Press the START softkey on the touch screen display of the CBT unit 6 to illuminate and initialize the test. (Press again at any time to terminate the test.) A timer in the CBT unit 6 starts running and the time is displayed on the screen from 00.0 to 10.0 seconds.
- 5.3 GFCI circuit breakers run the LINE and NEUTRAL wires through a toroidal core where the equal-and-opposite magnetic fields cancel. The CBT unit 6 automatically generates a small AC current from the LINE to the GROUND that ramps up to 10 milliamperes AC in about 30 seconds. This causes a magnetic imbalance in the sense core, and a secondary winding generates enough power to trip the breaker and open the circuit.
- 5.4 The current and elapsed time are tracked on the display of the CBT unit 6, both graphically and with two digital readouts (GFCI current and TIME, SECONDS). The breaker must trip at a leakage current to ground of between about 3-7 milliamps, which will occur at about 10-20 seconds. When the breaker trips, the output voltage goes to zero, which stops the test.
- 5.5 At that time, the time and current displays on the CBT unit 6 latch at the values when the breaker tripped and the voltage goes to zero to be recorded.
- 5.6 The test values will hold until reset with the appropriate softkey on the touch screen display of the CBT unit 6.

AC Outlet Tests
6. No-Load Test
   6.1 Setup
   - 6.1.1 The outlet tester unit 10 is carried around the house to be plugged into each accessible electrical outlet. The kit consists of the outlet tester "suitcase," a heavy gauge (AWG14) power cord, and a small household 1500 W space heater.
   - 6.1.2 In one form of the outlet tester unit 10 used in describing the tests performed on an AC outlet, the outlet tester suitcase does not have a control panel or displays; an internal dedicated local network (WiFi LAN) works with a tablet computer for all test displays and controls. However, it should be realized that the outlet tester unit 10 may include its own HMI touch screen display to input commands and to display test measurements, and any reference to a display herein would also encompass such an HMI touch screen display.

6.1.3 The heater plugs into a dedicated outlet on the outlet tester unit 10. A second outlet on the unit 10 has a simple plug-in tester with 3 LED indicators to show at a quick glance that the outlet under test is live and correctly wired.

6.1.4 Note that the outlet tester unit 10 preferably has an internal uninterruptible power supply (12 VDC battery and charger, with a DC-DC converter for 24 VDC). The battery is charged whenever the unit 10 is plugged in; the power switch on the unit 10 connects the battery to the load. The display on the tablet computer (or on the outlet tester unit 10, if included) includes a color-coded battery status voltmeter.

6.2 Test 6.2.1 Turn on the power switch on the outlet tester unit 10 and allow time to "boot up" (the internal UPS will keep the displays and electronic circuitry of the outlet tester unit 10 operating while unplugged).

6.2.2 Set up the tablet computer "front panel" by activating the "cordless HMI" app saved to the tablet computer. The "cordless HMI" app is merely a program that allows the tablet computer to communicate wirelessly with the outlet tester unit 10.

6.2.3 Synchronize the tablet computer to the LAN by selecting the "tccs" WiFi and following the directions inside the suitcase-like housing of the outlet tester unit 10. Here, the user is now being told to select set the tablet WiFi network that originates from the router inside the outlet tester unit 10. The tablet computer is programmed thusly, and the program is listed on the WiFi menu as "tccs." The passwords, etc. are printed on a paper label preferably secured to the inside of the housing of the outlet tester unit 10.

6.2.4 Observe that the V1 Input Voltage window on the tablet computer screen is reading approximately 120.0 VAC.

6.2.5 (The actual service input at the breaker panel 12 is brought to the CBT unit 6, where it is digitized and brought to a small radio link. The matching receiver in the outlet tester unit 10 receives and decodes the data and it is brought to the display on the tablet.)

6.2.6 Plug the power line cord into the outlet under test and notice the LINE-NEUTRAL voltage display on the tablet computer. The inlet line and neutral wires from the outlet are connected to a sensor in the outlet tester unit 10 that digitizes the voltage (typically 120.0 VAC) for display on the tablet computer.

6.2.7 The LINE-GROUND display on the tablet computer displays the voltage between the inlet hot lead and the ground sensed and calculated by the controller of the outlet tester unit 10. It should read within one volt of the line-neutral display.

6.2.8 The NEUTRAL-GROUND display on the tablet computer displays the voltage between the return line (neutral) and ground sensed and calculated by the controller of the outlet tester unit 10. This should be less than one volt.

6.2.9 There are a number of common miswirings to watch for with those three voltage readings. A (dangerous) miswired outlet will show the neutral-to-ground voltage at full line voltage and the others near zero. Lack of a ground (typical in pre-1960 constructions) will show both the neutral-to-ground and line-to-ground voltage readings at somewhere around 60 VAC. If this occurs, a decision has to be made if this just reflects the pre-grounding house wiring, or is indicating a problem needing repair.

2 Load Test 2.1 Test 2.1.1 The screen on the tablet computer has a softkey to run the load test. Pressing the test start key on this display connects the 1500 W heater until the softkey is pressed again to stop the load test.

2.1.2 The current display on the tablet computer shows the actual current drawn. A current sensor in the outlet tester unit 10 digitizes the current for display on the tablet computer. It should show about 12 amps.

Note that since the voltage drop is linear with current, additional displays shown on the tablet computer extrapolate the reading to show the expected voltage drop at both 15 and 20 amperes load.

2.1.3 The LINE-to-NEUTRAL voltage will drop slightly under load. It must be compared to the service inlet voltage for voltage drop, and should not be more than about 3 volts lower.

It should be remembered that the voltage drop accounts for all losses, from the inlet to the breaker panel 12 to the AC outlet contacts. It may very well not be due to a problem with the AC outlet, but rather the behind-the-walls wiring. It is suggested to check any accessible points in between (it is extremely rare for the problem to be behind the wall).

2.1.4 The NEUTRAL-to-GROUND voltage will increase under load also. It should not increase by more than 3 volts under load. It is a "mirror image" of the line (hot) and shows the current going back to the breaker panel neutral bar. The first thing to check if there are problems is whether all setscrews at the neutral bar in the panel 12 are snug.

2.1.5 The LINE-to-GROUND voltage brought to an additional sensing module in the outlet tester unit 10 should be similar to the LINE-to-NEUTRAL voltage. Unless an open ground situation is already known to exist, the wiring should be checked for a miswire.

3 Ground Fault Trip Test (FOR GFCI OUTLETS ONLY)

It should be noted that GFCI outlets are sensitive to any imbalance between the LINE and NEUTRAL wires, under the concern that the imbalance is due the missing current going through someone, causing a dangerous electrical shock. A small imbalance will immediately trip the outlet regardless of the actual current delivered to the load.

a. Press the START softkey on the tablet computer to illuminate and initialize the test. (Press again at any time to terminate the test.) A timer in the outlet tester unit 10 starts running and the time is displayed on the screen of the tablet computer from 00.0 to 10.0 seconds.

b. GFCI-protected outlets run the LINE and NEUTRAL wires through a toroidal core where the equal-and-opposite magnetic fields cancel. The outlet tester unit 10 automatically generates a small AC current from the LINE to the GROUND that ramps up to 10 milliamperes AC in about 30 seconds. This causes a magnetic imbalance in the sense core, and a secondary winding generates enough power to trip the outlet and open the circuit.

c. The current and elapsed time are tracked on the display of the tablet computer connected to the outlet tester unit 10, both graphically and with two digital readouts (GFCI current and TIME, SECONDS). The outlet must trip at a leakage current to ground of between about 3-7 milliamps, which will occur at about 10-20 seconds. When the outlet trips, the output voltage goes to zero, which stops the test.

d. At that time, the time and current displays on the tablet computer latch at the values when the breaker tripped and the voltage goes to zero to be recorded.

e. The test values will hold until reset with the appropriate softkey on the touch screen display of the tablet computer.

The system 2 and method of the present invention will now be further described.

In accordance with one form of the present invention, the system 2 is used for testing electrical power circuits in a home or office building. The home or office building has a plurality of power outlets 14 and a circuit breaker panel 12 which receives at least one line electrical conduit carrying a service voltage and a neutral electrical conduit. The circuit breaker panel 12 houses circuit breakers 16 to which the service voltage is provided, each circuit breaker 16 including an output 18 having a breaker current and a breaker voltage associated with the service voltage provided thereto. The circuit breaker panel 12 further has a first connection structure 20 (e.g., a busbar) in electrical communication with the at least one line electrical conduit carrying the service voltage and a second connection structure 22 (e.g., a busbar) in electrical communication with the neutral electrical conduit, certain of the circuit breakers 16 being connected to the power outlets 14 through wiring in the home or office building. In one form of the invention, the system 2 includes a circuit breaker tester unit 6 having a housing 24 and circuitry disposed therein which is electrically connectable to the circuit breaker panel 12 and which monitors the service voltage provided to the circuit breaker panel 12 and the at least one of the breaker current and the breaker voltage measurable on the outputs 18 of one or more circuit breakers 16 under no load and load conditions; a portable outlet tester unit 10 having a container 26 and circuitry housed in the container 26, the portable outlet tester unit 10 being carryable by a person throughout the home or office building to various locations therein where the power outlets 14 are situated, the portable outlet tester unit 10 being used for testing the proper connection of the wiring in the home or office building to which the power outlets 14 are connected; and at least one load bank 8, 8a, 8b, the at least one load bank 8, 8a, 8b having a housing 28a, 28b and test loads HTR1-HTR10 disposed within the housing, the test loads HTR1-HTR 10s being capable of being selectively switched into electrical communication with the output 18 of a respective circuit breaker 16 residing in the circuit breaker panel 12 in order to test the operability of the respective circuit breaker 16 in the panel.

In yet another form of the present invention, a system 2 for testing electrical power circuits further includes an interface unit 4 having a housing 30 that is electrically connectable to the circuit breaker panel 12 in the home or office building, the interface unit 4 further including a current sensing circuit 32 disposed within the housing, the current sensing circuit 32 being electrically connectable to the first connection structure 20 within the circuit breaker panel 12.

In one form of the system 2 for testing electrical power circuits, the circuit breaker tester unit 6 communicates wirelessly with the portable outlet tester unit 10 carried by the person to a location within the home or office building where a power outlet 14 is located.

The circuit breaker panel 12 may include at least one ground fault circuit interrupter (GFCI) circuit breaker 16, which the system 2 of the present invention can test. In this situation, there is a ground connection 34 between the circuit breaker panel 12 and the interface unit 4. Additionally, there is a ground wire 36 that electrically connects the interface unit 4 with the circuit breaker tester unit 6, the ground wire 36 being in electrical communication with the ground connection 34 between the interface unit 4 and the circuit breaker panel 12. The circuit breaker tester unit 6 in one form of the system 2 of the present invention includes a current sensor 38 which senses the current on the ground wire 36 provided to the circuit breaker tester unit 6 and generates a current sense signal in response thereto, a programmable logic controller 40, and a GFCI current leak module 42 for testing the operability of the at least one GFCI circuit breaker 16. The GFCI current leak module 42 is operatively coupled to the programmable logic controller 40. The programmable logic controller 40 receives the current sense signal. The GFCI current leak module 42 has a plurality of resistors and a switching circuit electrically connected to the plurality of resistors and in electrical communication with the programmable logic controller 40. The programmable logic controller 40 generates a control signal to control the state of the switching circuit. The switching circuit receives the control signal from the programmable logic controller 40 and selects one or more resistors of the plurality of resistors to be in electrical communication with the output 18 of the at least one GFCI circuit breaker 16 in response to the control signal generated by the programmable logic controller 40.

In yet another form of the system 2 of the present invention, the circuit breaker tester unit 6 communicates with the at least one load bank 8, 8a, 8b to automatically switch in different test loads HTR1-HTR10s on the output 18 of a respective circuit breaker 16 under test.

In some situations, two or more service voltages having different phases may be supplied to the circuit breaker panel 12, and certain circuit breakers 16 within the panel may be receiving different service voltages. The system 2 of the present invention has the capability to check which service voltage is provided to a circuit breaker 16 under test.

More specifically, the at least one line electrical conduit carrying a service voltage and received by the circuit breaker panel 12, mentioned previously, includes a first line electrical conduit and a second line electrical conduit, the first line electrical conduit carrying a first service voltage having a first phase, and the second line electrical conduit carrying a second service voltage having a second phase, the second phase being different from the first phase. Furthermore, the circuit breaker panel 12 has a third connection structure 44, whereby the first line electrical conduit is in electrical communication with the first connection structure 20, mentioned previously, and the second line electrical conduit is in electrical communication with the third connection structure 44. Thus, the output 18 of one or more of the circuit breakers 16 of the circuit breaker panel 12 is in electrical communication with one of the first connection structure 20 having the first service voltage and associated first phase and the third connection structure 44 having the second service voltage and associated second phase. The circuit breaker tester unit 6 formed in accordance with one form of the system 2 of the present invention includes a phase detector circuit 46, the phase detector circuit 46 being in electrical communication with the output 18 of a respective circuit breaker 16 and determining whether the phase of the breaker voltage on the output 18 of the respective circuit breaker 16 is the first phase or the second phase, the phase detector circuit 46 generating a detected breaker phase signal indicative of the phase of the breaker voltage on the output 18 of the respective circuit breaker 16. The circuit breaker tester unit 6 of this form of the system 2 of the present invention further includes a programmable logic controller 40, the detected breaker phase signal being provided to the programmable logic controller 40.

In yet another form of the system 2 of the present invention, the portable outlet tester unit 10 includes a programmable logic controller 48 and a phase detector circuit 50 electrically coupled to the programmable logic controller 48 of the portable outlet tester unit 10, the portable outlet tester unit 10 being electrically connectable to a respective power outlet 14 of the plurality of power outlets 14 under test, the respective power outlet 14 having an electrical contact with a voltage thereon, the phase detector circuit 50 of the portable outlet tester unit 10 detecting the phase of the voltage on the power outlet 14 and generating a detected outlet phase signal indicative thereof, the detected outlet phase signal from the phase detector circuit 50 of the portable outlet tester unit 10 being provided to the programmable logic controller 48 of the portable outlet tester unit 10. In this form of the system 2 of the present invention, the portable outlet tester unit 10 further includes an RF (radio frequency) transmitter circuit 52, the RF transmitter circuit 52 being electrically coupled to the programmable logic controller 48 of the portable outlet tester unit 10. Additionally, the circuit breaker tester unit 6 of the system 2 of the present invention includes an RF (radio frequency) receiver circuit 54, the RF receiver circuit 54 being electrically coupled to the programmable logic controller 40 of the circuit breaker tester unit 6. The programmable logic controller 48 of the portable outlet tester unit 10 receives the detected outlet phase signal from the phase detector circuit 50 of the portable outlet tester unit 10 and generates a controller phase signal in response to the detected outlet phase signal, the controller phase signal being provided to the RF transmitter circuit 52 of the portable outlet tester unit 10. The RF transmitter circuit 52 generates an RF (radio frequency) signal in response to the controller phase signal, the RF signal being transmitted to the circuit breaker tester unit 6 and being received by the RF receiver circuit 54 thereof. The RF receiver circuit 54 generates a received phase signal in response thereto, the received phase signal being indicative of the phase of the voltage on the contact of the power outlet 14 under test. The received phase signal is provided to the programmable logic controller 40 of the circuit breaker tester unit 6.

In a further form of the system 2 of the present invention, the programmable logic controller 40 of the circuit breaker tester unit 6 generates a reference voltage signal in response to the received phase signal provided to the programmable logic controller 40, the reference signal voltage being indicative of one of 1) the respective power outlet 14 under test is in electrical communication with the first connection structure 20 of the circuit breaker panel 12 which is in electrical communication with the first line electrical conduit carrying the first service voltage and 2) the respective power outlet 14 under test is in electrical communication with the third connection structure 44 of the circuit breaker panel 12 which is in electrical communication with the second line electrical conduit carrying the second service voltage. Additionally, in accordance with the present invention, the portable outlet tester unit 10 of the system 2 further includes an RF (radio frequency) receiver circuit 56, the RF receiver circuit 56 being electrically coupled to the programmable logic controller 48 of the portable outlet tester unit 10, and the circuit breaker tester unit 6 of the system 2 further includes an RF (radio frequency) transmitter circuit 58, the RF transmitter circuit 58 being electrically coupled to the programmable logic controller 40 of the circuit breaker tester unit 6.

The RF transmitter circuit 58 of the circuit breaker tester unit 6 transmits a transmitted reference voltage signal in response to the reference voltage signal generated by the programmable logic controller 40 of the circuit breaker tester unit 6. The RF receiver circuit 56 of the portable outlet tester unit 10 receives the transmitted reference voltage signal from the circuit breaker tester unit 6 and generates a received reference voltage signal in response thereto, the received reference voltage signal being provided to the programmable logic controller 48 of the portable outlet tester unit 10.

Another form of the circuit breaker tester unit 6 of the system 2 of the present invention is described below, again being used to determine which service voltage of a plurality of service voltages provided to the circuit breaker panel 12 should be used as a reference voltage. More specifically, the at least one line electrical conduit carrying a service voltage and received by the circuit breaker panel 12, as mentioned previously, includes a first line electrical conduit and a second line electrical conduit, the first line electrical conduit carrying a first service voltage having a first phase, the second line electrical conduit carrying a second service voltage having a second phase, the second phase being different from the first phase. The circuit breaker panel 12 has a third connection structure 44, the first line electrical conduit being in electrical communication with the first connection structure 20, mentioned previously, and the second line electrical conduit being in electrical communication with the third connection structure 44. The output 18 of one or more of the circuit breakers 16 of the circuit breaker panel 12 is in electrical communication with one of the first connection structure 20 having the first service voltage and associated first phase and the third connection structure 44 having the second service voltage and associated second phase.

In this embodiment of the system 2 of the present invention, the circuit breaker tester unit 6 includes a phase detector circuit 46, the phase detector circuit 46 being in electrical communication with the output 18 of a respective circuit breaker 16 under test and determining whether the phase of the breaker voltage on the output 18 of the respective circuit breaker 16 under test is one of the first phase and the second phase. The phase detector circuit 46 generates a detected breaker phase signal indicative of the phase of the breaker voltage on the output 18 of the respective circuit breaker 16 under test. The circuit breaker tester unit 6 further includes a voltage switching circuit 60, 62, for example, including relays K1 and K2 and their associated transistor drive circuits shown in FIGS. 9A and 9B, the voltage switching circuit 60, 62 being in electrical communication with the first connection structure 20 of the circuit breaker panel 12 and being in electrical communication with the third connection structure 44 of the circuit breaker panel 12, the switching circuit 60, 62 having an output and being responsive to the detected breaker phase signal, the output of the voltage switching circuit 60, 62 being selectively provided thereon one of the first service voltage and the second service voltage in response to the detected breaker phase signal.

The circuit breaker tester unit 6 of this embodiment of the system 2 of the present invention further includes a reference voltage module 64, the reference voltage module 64 being electrically coupled to the output of the voltage switching circuit 60, 62. The reference voltage module 64 selectively receives one of the first service voltage and the second service voltage selectively provided by the voltage switching circuit 60, 62, measures the one of the first service voltage and the second service voltage selectively provided by the voltage switching circuit 60, 62 and generates a measured reference voltage indicative of the one of the first service voltage and the second service voltage selectively provided by the voltage switching circuit 60, 62.

In another form of the system 2 of the present invention, the phase detector circuit 46 of the circuit breaker tester unit 6 includes a first input 66 (see FIG. 9A) which is in electrical communication with the first connection structure 20 having the first service voltage and associated first phase thereon, the first service voltage being provided to the first input 66; a second input 68 (see FIG. 9A) which is in communication with the third connection structure 44 having the second service voltage and associated second phase thereon, the second service voltage being provided to the second input 68; and a third input 70 (see FIG. 9A) connectable to the output 18 of the respective circuit breaker 16 under test, the breaker voltage on the output 18 of the circuit breaker 16 under test being providable to the third input 70. The phase detector may also have a fourth input 71 to receive thereon a third service voltage have a third phase which is different from the first phase of the first service voltage and the second phase of the second service voltage if three-phase voltages are provide to the circuit breaker panel 12.

The phase detector circuit 46 of the circuit breaker tester unit 6 further includes a first clipping circuit 72, the first clipping circuit 72 being in electrical communication with the second input 68, the first clipping circuit 72 generating a first digital clipped signal having a phase corresponding to the second phase of the second service voltage provided to the second input 68.

The phase detector circuit 46 of the circuit breaker tester unit 6 further includes a second clipping circuit 74, the second clipping circuit 74 being in electrical communication with the third input 70, the second clipping circuit 74 generating a second digital clipped signal having a phase corresponding to the phase of the breaker voltage on the output 18 of the respective circuit breaker 16 under test and provided to the third input 70.

The phase detector circuit 46 of the circuit breaker tester unit 6 further includes an exclusive logic OR gate circuit 76, the exclusive logic OR gate circuit 76 having a first input, a second input and an output. The first input of the exclusive logic OR gate circuit 76 receives the first digital clipped signal from the first clipping circuit 72, the second input of the exclusive logic OR gate circuit 76 receives the second digital clipped signal from the second clipping circuit 74, and the exclusive logic OR gate circuit 76 generates the detected breaker phase signal. The detected breaker phase signal is further indicative of whether the phase of the breaker voltage on the output 18 of the respective circuit breaker 16 under test is substantially the same as the phase of the first digital clipped signal which corresponds to the second phase of the second service voltage provided to the second input 68 of the phase detector circuit 46 of the circuit breaker tester unit 6, the output phase signal of the exclusive logic OR gate circuit 76 being provided on the output of the exclusive logic OR gate circuit 76. The voltage switching circuit 60, 62 selectively provides on the output of the voltage switching circuit 60, 62 and to the reference voltage module 64 one of the first service voltage and the second service voltage in response to the detected breaker phase signal of the exclusive logic OR gate circuit 76 of the phase detector circuit 46 of the circuit breaker tester unit 6.

In yet a further form of the system 2 of the present invention for testing electrical power circuits, the circuit breaker tester unit 6 includes a programmable logic controller 40, the programmable logic controller 40 generating a load test signal, and the at least one load bank 8, 8a, 8b includes a load switching circuit 78, the test loads HTR1-HTR10s of the at least one load bank 8, 8a, 8b being in operative communication with the load switching circuit 78 and being in selective electrical communication with a respective circuit breaker 16 of the circuit breaker panel 12 under test. The at least one load bank 8, 8a, 8b further includes a programmable logic controller 80, the programmable logic controller 80 of the at least one load bank 8, 8a, 8b receiving the load test signal generated by the programmable logic controller 40 of the circuit breaker tester unit 6 and generating a load switching signal in response thereto, the load switching circuit 78 being responsive to the load switching signal generated by the programmable logic controller 80 of the at least one load bank 8, 8a, 8b and selectively causing one or more test loads HTR1-HTR10s to be in electrical communication with the output 18 of a circuit breaker 16 of the circuit breaker panel 12 under test.

In yet another form of the system 2 of the present invention, at least one of the test loads HTR1-HTR10s includes a heater wire.

It may be that at least one (or more) of the plurality of power outlets 14 in the home or office building is ground fault circuit interrupter (GFCI) circuit protected power outlet 14. In yet another form of the system 2 of the present invention for testing electrical power circuits, the system 2 can test the wiring on and operability of the at least one ground fault circuit interrupter (GFCI) circuit protected power outlet 14. More specifically, the portable outlet tester unit 10 of this embodiment of the system 2 of the present invention further includes a current sensor 82 which senses the current on a ground contact of the at least one GFCI circuit protected power outlet 14 and generates a current sense signal in response thereto, a programmable logic controller 48, and a GFCI current leak module 84 for testing the operability of the at least one GFCI circuit protected power outlet 14, the GFCI current leak module 84 being operatively coupled to the programmable logic controller 48, the programmable logic controller 48 receiving the current sense signal. The GFCI current leak module 84 has a plurality of resistors and a switching circuit electrically connected to the plurality of resistors and in electrical communication with the programmable logic controller 48, the programmable logic controller 48 generating a control signal to control the state of the switching circuit. The switching circuit receives the control signal from the programmable logic controller 48 and selects one or more resistors of the plurality of resistors to be in electrical communication with the at least one GFCI circuit protected power outlet 14 in response to the control signal generated by the programmable logic controller 48.

In accordance with the present invention, a method for testing electrical power circuits in a home or office building using the system 2 defined of the present invention disclosed earlier is also disclosed herein. The method of the present invention includes the steps of measuring by the circuit breaker tester unit 6 at least one of the current and the voltage on the output 18 of a respective circuit breaker 16 of the circuit breaker panel 12 under test with no test load HTR1-HTR10 in electrical communication with the output 18 of the circuit breaker 16 under test and generating thereby at least one of a measured no-load current and a measured no-load voltage; selectively switching by the at least one load bank 8, 8a, 8b a test load HTR1-HTR10 into electrical communication with the output 18 of the circuit breaker 16 under test; measuring by the circuit breaker tester unit 6 the at least one of the current and the voltage on the output 18 of the respective circuit breaker 16 under test while the test load HTR1-HTR10 is in electrical communication with the output 18 of the respective circuit breaker 16 under test and generating thereby at least one of a measured load-applied current and a measured load-applied voltage; and displaying on a display 86 the at least one of the measured no-load current and the measured no-load voltage and the at least one of the measured load-applied current and the measured load-applied voltage.

Although the controllers of the various units 6, 8, 10 of the system 2 of the present invention are described above as being preferably programmable logic controllers, it is envisioned to be within the scope of the present invention that the controllers could be a microprocessor circuit, a microcontroller circuit, a central processing unit (CPU) or another form of controller.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A system for testing electrical power circuits in a home or office building, the home or office building having a plurality of power outlets and a circuit breaker panel which receives at least one line electrical conduit carrying a service voltage and a neutral electrical conduit, the circuit breaker panel housing circuit breakers to which the service voltage is provided, each circuit breaker including an output having a breaker current and a breaker voltage associated with the service voltage provided thereto, the circuit breaker panel further having a first connection structure in electrical communication with the at least one line electrical conduit carrying the service voltage and a second connection structure in electrical communication with the neutral electrical conduit, certain of the circuit breakers being connected to the power outlets through wiring in the home or office building, the system comprising:

a circuit breaker tester unit having a housing and circuitry disposed therein which is electrically connectable to the circuit breaker panel and which monitors the service voltage provided to the circuit breaker panel and at least one of the breaker current and the breaker voltage measurable on the outputs of one or more circuit breakers under no load and load conditions;

a portable outlet tester unit having a container and circuitry housed in the container, the portable outlet tester unit being carryable by a person throughout the home or office building to various locations therein where the power outlets are situated, the portable outlet tester unit being used for testing the proper connection of the wiring in the home or office building to which the power outlets are connected; and at least one load bank, the at least one load bank having a housing and test loads disposed within the housing, the test loads being capable of being selectively switched into electrical communication with the output of a respective circuit breaker residing in the circuit breaker panel in order to test the operability of the respective circuit breaker in the panel;

wherein the at least one line electrical conduit carrying a service voltage and received by the circuit breaker panel includes a first line electrical conduit and a second line electrical conduit, the first line electrical conduit carrying a first service voltage having a first phase, the second line electrical conduit carrying a second service voltage having a second phase, the second phase being different from the first phase, the circuit breaker panel having a third connection structure, the first line electrical conduit being in electrical communication with the first connection structure, the second line electrical conduit being in electrical communication with the third connection structure, the output of one or more of the circuit breakers of the circuit breaker panel being in electrical communication with one of the first connection structure having the first service voltage and associated first phase and the third connection structure having the second service voltage and associated second phase;

wherein the circuit breaker tester unit includes a phase detector circuit, the phase detector circuit being in electrical communication with the output of a respective circuit breaker and determining whether the phase of the breaker voltage on the output of the respective circuit breaker is the first phase or the second phase, the phase detector circuit generating a detected breaker phase signal indicative of the phase of the breaker voltage on the output of the respective circuit breaker; and wherein the circuit breaker tester unit further includes a controller, the detected breaker phase signal being provided to the controller.

2. A system for testing electrical power circuits as defined by claim 1, wherein the portable outlet tester unit includes a controller and a phase detector circuit electrically coupled to the controller of the portable outlet tester unit, the portable outlet tester unit being electrically connectable to a respective power outlet of the plurality of power outlets under test, the respective power outlet having an electrical contact with a voltage thereon, the phase detector circuit of the portable outlet tester unit detecting the phase of the voltage on the power outlet and generating a detected outlet phase signal indicative thereof, the detected outlet phase signal from the phase detector circuit of the portable outlet tester unit being provided to the controller of the portable outlet tester unit;

wherein the portable outlet tester unit further includes an RF (radio frequency) transmitter circuit, the RF transmitter circuit being electrically coupled to the controller of the portable outlet tester unit; and wherein the circuit breaker tester unit includes an RF (radio frequency) receiver circuit, the RF receiver circuit being electrically coupled to the controller of the circuit breaker tester unit, the controller of the portable outlet tester unit receiving the detected outlet phase signal from the phase detector circuit of the portable outlet tester unit and generating a controller phase signal in response to the detected outlet phase signal, the controller phase signal being provided to the RF transmitter circuit of the portable outlet tester unit, the RF transmitter circuit generating an RF (radio frequency) signal in response to the controller phase signal, the RF signal being transmitted to the circuit breaker tester unit and being received by the RF receiver circuit thereof, the RF receiver circuit generating a received phase signal in response thereto, the received phase signal being indicative of the phase of the voltage on the contact of the power outlet under test, the received phase signal being provided to the controller of the circuit breaker tester unit.

3. A system for testing electrical power circuits as defined by claim 2, wherein the controller of the circuit breaker tester unit generates a reference voltage signal in response to the received phase signal provided to the controller, the reference signal voltage being indicative of one of 1) the respective power outlet under test is in electrical communication with the first connection structure of the circuit breaker panel which is in electrical communication with the first line electrical conduit carrying the first service voltage and 2) the respective power outlet under test is in electrical communication with the third connection structure of the circuit breaker panel which is in electrical communication with the second line electrical conduit carrying the second service voltage;
  wherein the portable outlet tester unit further includes an RF (radio frequency) receiver circuit, the RF receiver circuit being electrically coupled to the controller of the portable outlet tester unit;
  wherein the circuit breaker tester unit further includes an RF (radio frequency) transmitter circuit, the RF transmitter circuit being electrically coupled to the controller of the circuit breaker tester unit;
  wherein the RF transmitter circuit of the circuit breaker tester unit transmits a transmitted reference voltage signal in response to the reference voltage signal generated by the controller of the circuit breaker tester unit;
  wherein the RF receiver circuit of the portable outlet tester unit receives the transmitted reference voltage signal from the circuit breaker tester unit and generates a received reference voltage signal in response thereto, the received reference voltage signal being provided to the controller of the portable outlet tester unit.

4. A system for testing electrical power circuits in a home or office building, the home or office building having a plurality of power outlets and a circuit breaker panel which receives at least one line electrical conduit carrying a service voltage and a neutral electrical conduit, the circuit breaker panel housing circuit breakers to which the service voltage is provided, each circuit breaker including an output having a breaker current and a breaker voltage associated with the service voltage provided thereto, the circuit breaker panel further having a first connection structure in electrical communication with the at least one line electrical conduit carrying the service voltage and a second connection structure in electrical communication with the neutral electrical conduit, certain of the circuit breakers being connected to the power outlets through wiring in the home or office building, the system comprising:
  a circuit breaker tester unit having a housing and circuitry disposed therein which is electrically connectable to the circuit breaker panel and which monitors the service voltage provided to the circuit breaker panel and at least one of the breaker current and the breaker voltage measurable on the outputs of one or more circuit breakers under no load and load conditions;
  a portable outlet tester unit having a container and circuitry housed in the container, the portable outlet tester unit being carryable by a person throughout the home or office building to various locations therein where the power outlets are situated, the portable outlet tester unit being used for testing the proper connection of the wiring in the home or office building to which the power outlets are connected; and
  at least one load bank, the at least one load bank having a housing and test loads disposed within the housing, the test loads being capable of being selectively switched into electrical communication with the output of a respective circuit breaker residing in the circuit breaker panel in order to test the operability of the respective circuit breaker in the panel;
  wherein the at least one line electrical conduit carrying a service voltage and received by the circuit breaker panel includes a first line electrical conduit and a second line electrical conduit, the first line electrical conduit carrying a first service voltage having a first phase, the second line electrical conduit carrying a second service voltage having a second phase, the second phase being different from the first phase, the circuit breaker panel having a third connection structure, the first line electrical conduit being in electrical communication with the first connection structure, the second line electrical conduit being in electrical communication with the third connection structure, the output of one or more of the circuit breakers of the circuit breaker panel being in electrical communication with one of the first connection structure having the first service voltage and associated first phase and the third connection structure having the second service voltage and associated second phase;
  wherein the circuit breaker tester unit includes a phase detector circuit, the phase detector circuit being in electrical communication with the output of a respective circuit breaker under test and determining whether the phase of the breaker voltage on the output of the respective circuit breaker under test is one of the first phase and the second phase, the phase detector circuit generating a detected breaker phase signal indicative of the phase of the breaker voltage on the output of the respective circuit breaker under test;
  wherein the circuit breaker tester unit further includes a voltage switching circuit, the voltage switching circuit being in electrical communication with the first connection structure of the circuit breaker panel and being in electrical communication with the third connection structure of the circuit breaker panel, the switching circuit having an output and being responsive to the detected breaker phase signal, the output of the voltage switching circuit being selectively provided thereon one of the first service voltage and the second service voltage in response to the detected breaker phase signal; and
  wherein the circuit breaker tester unit further includes a reference voltage module, the reference voltage module being electrically coupled to the output of the voltage switching circuit, the reference voltage module selectively receiving one of the first service voltage and the second service voltage selectively provided by the voltage switching circuit, measuring the one of the first service voltage and the second service voltage selectively provided by the voltage switching circuit and generating a measured reference voltage indicative of the one of the first service voltage and the second service voltage selectively provided by the voltage switching circuit.

5. A system for testing electrical power circuits as defined by claim 4, wherein the phase detector circuit of the circuit breaker tester unit includes a first input which is in electrical communication with the first connection structure having the first service voltage and associated first phase thereon, the first service voltage being provided to the first input; a second input which is in communication with the third connection structure having the second service voltage and associated second phase thereon, the second service voltage being provided to the second input; and a third input connectable to the output of the respective circuit breaker under test, the breaker voltage on the output of the circuit breaker under test being providable to the third input;

wherein the phase detector circuit of the circuit breaker tester unit further includes a first clipping circuit, the first clipping circuit being in electrical communication with the second input, the first clipping circuit generating a first digital clipped signal having a phase corresponding to the second phase of the second service voltage provided to the second input;

wherein the phase detector circuit of the circuit breaker tester unit further includes a second clipping circuit, the second clipping circuit being in electrical communication with the third input, the second clipping circuit generating a second digital clipped signal having a phase corresponding to the phase of the breaker voltage on the output of the respective circuit breaker under test and provided to the third input;

wherein the phase detector circuit of the circuit breaker tester unit further includes an exclusive logic OR gate circuit, the exclusive logic OR gate circuit having a first input, a second input and an output, the first input of the exclusive logic OR gate circuit receiving the first digital clipped signal from the first clipping circuit, the second input of the exclusive logic OR gate circuit receiving the second digital clipped signal from the second clipping circuit, the exclusive logic OR gate circuit generating the detected breaker phase signal, the detected breaker phase signal being further indicative of whether the phase of the breaker voltage on the output of the respective circuit breaker under test is substantially the same as the phase of the first digital clipped signal which corresponds to the second phase of the second service voltage provided to the second input of the phase detector circuit of the circuit breaker tester unit, the output phase signal of the exclusive logic OR gate circuit being provided on the output of the exclusive logic OR gate circuit; and wherein the voltage switching circuit selectively provides on the output of the voltage switching circuit and to the reference voltage module one of the first service voltage and the second service voltage in response to the detected breaker phase signal of the exclusive logic OR gate circuit of the phase detector circuit of the circuit breaker tester unit.

\* \* \* \* \*